(12) United States Patent
Saito et al.

(10) Patent No.: US 9,287,464 B2
(45) Date of Patent: Mar. 15, 2016

(54) LIGHT-EMITTING ELEMENT HAVING AN OPTICAL FUNCTION FILM INCLUDING A REFLECTION LAYER

(71) Applicant: Sony Corporation, Tokyo (JP)

(72) Inventors: Daisuke Saito, Tokyo (JP); Hiroki Naito, Kanagawa (JP); Sayaka Aoki, Kanagawa (JP); Arata Kobayashi, Kanagawa (JP); Gen Sakoda, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/447,728

(22) Filed: Jul. 31, 2014

(65) Prior Publication Data

US 2015/0041836 A1    Feb. 12, 2015

(30) Foreign Application Priority Data

Aug. 7, 2013 (JP) .................................. 2013-163933

(51) Int. Cl.
| | |
|---|---|
| *H01L 33/60* | (2010.01) |
| *H01L 27/15* | (2006.01) |
| *H01L 33/46* | (2010.01) |
| *H01L 33/22* | (2010.01) |

(52) U.S. Cl.
CPC ............. *H01L 33/46* (2013.01); *H01L 27/156* (2013.01); *H01L 33/22* (2013.01); *H01L 33/60* (2013.01)

(58) Field of Classification Search
CPC .............................. H01L 33/60; H01L 27/156
See application file for complete search history.

(56) References Cited

U.S. PATENT DOCUMENTS

| | | | | |
|---|---|---|---|---|
| 4,760,578 | A * | 7/1988 | Oshima et al. ............ | 372/45.01 |
| 7,141,825 | B2 * | 11/2006 | Horio ....................... | H01L 33/40 257/79 |
| 7,633,133 | B2 * | 12/2009 | Noma ...................... | H01L 27/14618 257/433 |
| 7,667,224 | B2 * | 2/2010 | Ohashi et al. ............. | 257/13 |
| 7,939,841 | B2 * | 5/2011 | Lee et al. ................. | 257/98 |
| 8,492,785 | B2 * | 7/2013 | Hodota .................... | H01L 33/405 257/103 |
| 2002/0175336 | A1 * | 11/2002 | Choi ........................ | H01S 5/028 257/88 |
| 2005/0199885 | A1 * | 9/2005 | Hata et al. ................ | 257/79 |
| 2007/0145420 | A1 * | 6/2007 | Okada ...................... | H01L 27/14618 257/228 |
| 2008/0165539 | A1 * | 7/2008 | Hsu .......................... | H01L 33/60 362/309 |
| 2008/0251808 | A1 * | 10/2008 | Kususe .................... | H01L 24/06 257/98 |
| 2008/0285183 | A1 * | 11/2008 | Sugiyama ............... | G11C 11/161 360/324.11 |
| 2009/0029494 | A1 * | 1/2009 | Tseng ....................... | H01L 33/641 438/27 |
| 2010/0062554 | A1 * | 3/2010 | Kim .......................... | 438/29 |

(Continued)

FOREIGN PATENT DOCUMENTS

| | | | |
|---|---|---|---|
| JP | 2009164506 A | * | 7/2009 |
| JP | 2011-060656 A | | 3/2011 |

*Primary Examiner* — Ida M Soward
(74) *Attorney, Agent, or Firm* — Wolf, Greenfield & Sacks, P.C.

(57) ABSTRACT

A light-emitting element includes a light-emitting layer, and an optical function film. The light-emitting layer is configured to include a first plane with a first electrode, a second plane with a second electrode, and a circumferential plane connecting the first and second planes, the second plane being opposing to the first plane, and the light-emitting layer being made of a semiconductor. The optical function film is configured to include a reflection layer being able to reflect light coming from the light-emitting layer, the reflection layer being provided with first and second regions, the first region covering the second plane and the circumferential plane, the second region protruding from the first region to an outside of the light-emitting layer to expose an end plane thereof.

10 Claims, 37 Drawing Sheets

(56) References Cited

U.S. PATENT DOCUMENTS

| | | | |
|---|---|---|---|
| 2010/0308365 A1* | 12/2010 | Masuya et al. | 257/98 |
| 2011/0204325 A1* | 8/2011 | Kim | 257/13 |
| 2011/0297914 A1* | 12/2011 | Zheng et al. | 257/13 |
| 2012/0012816 A1* | 1/2012 | Choi | 257/14 |
| 2012/0107988 A1* | 5/2012 | Kim et al. | 438/46 |
| 2013/0001634 A1* | 1/2013 | Fudeta | H01L 33/0079 257/99 |
| 2013/0105978 A1* | 5/2013 | Hung | H01L 33/60 257/751 |
| 2013/0126928 A1* | 5/2013 | Kao | 257/98 |
| 2014/0159095 A1* | 6/2014 | Jeong et al. | 257/98 |
| 2015/0034900 A1* | 2/2015 | Aihara | 257/13 |

* cited by examiner

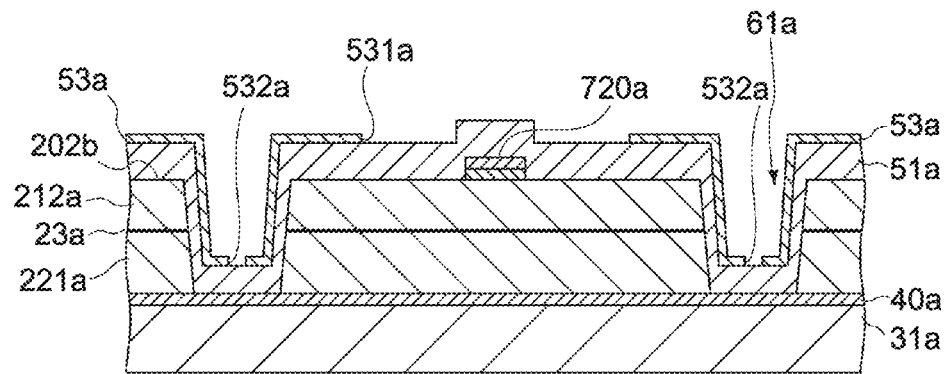
FIG.17A
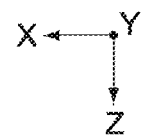
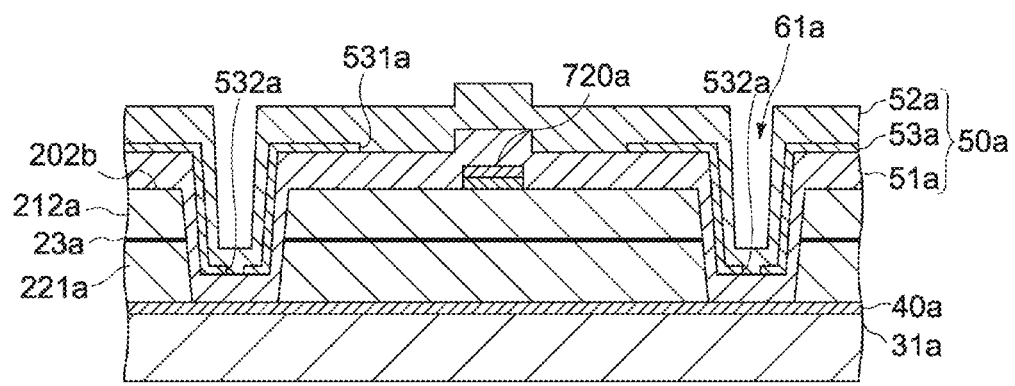
FIG.17B
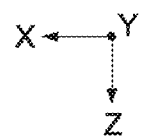

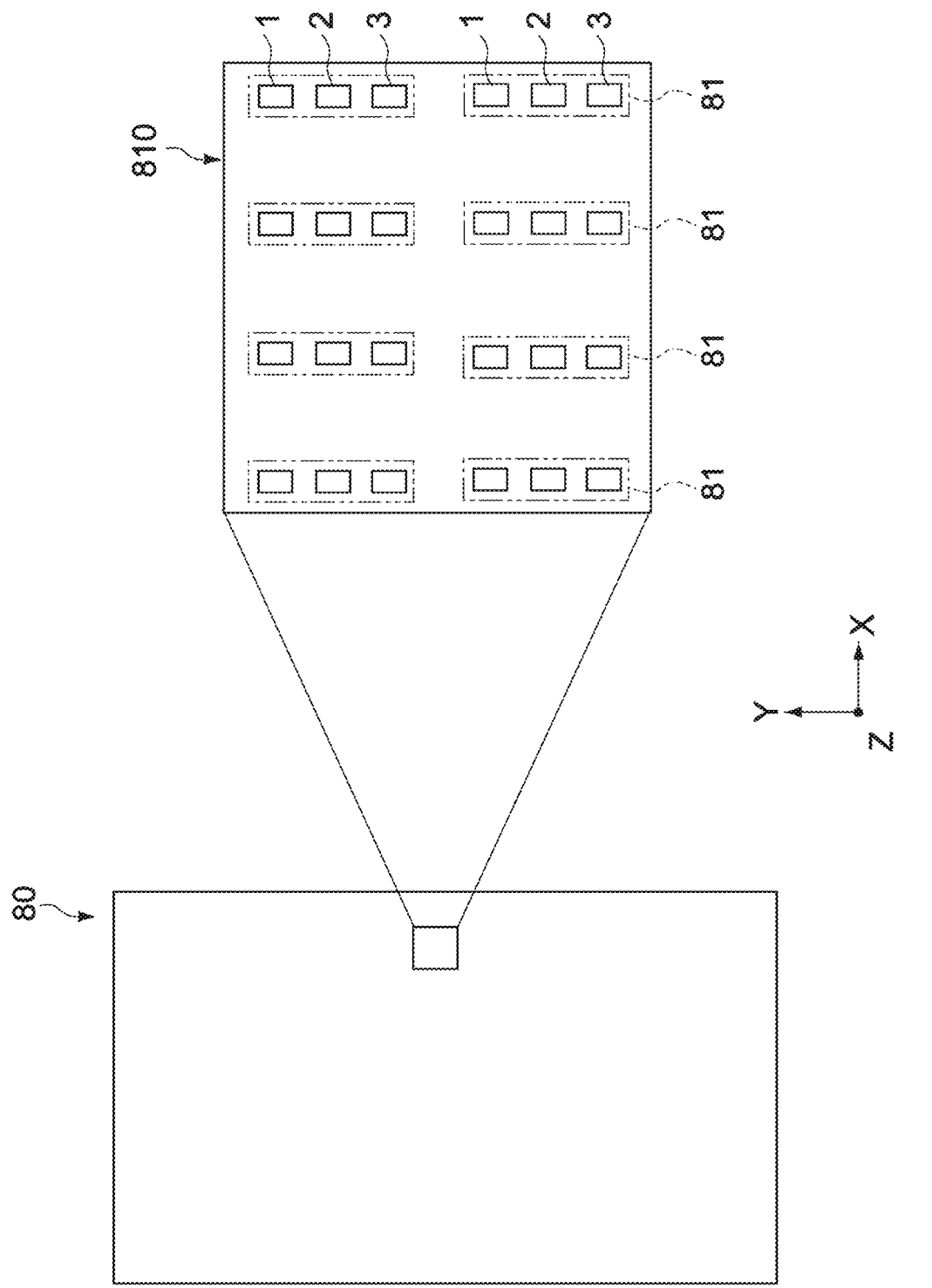

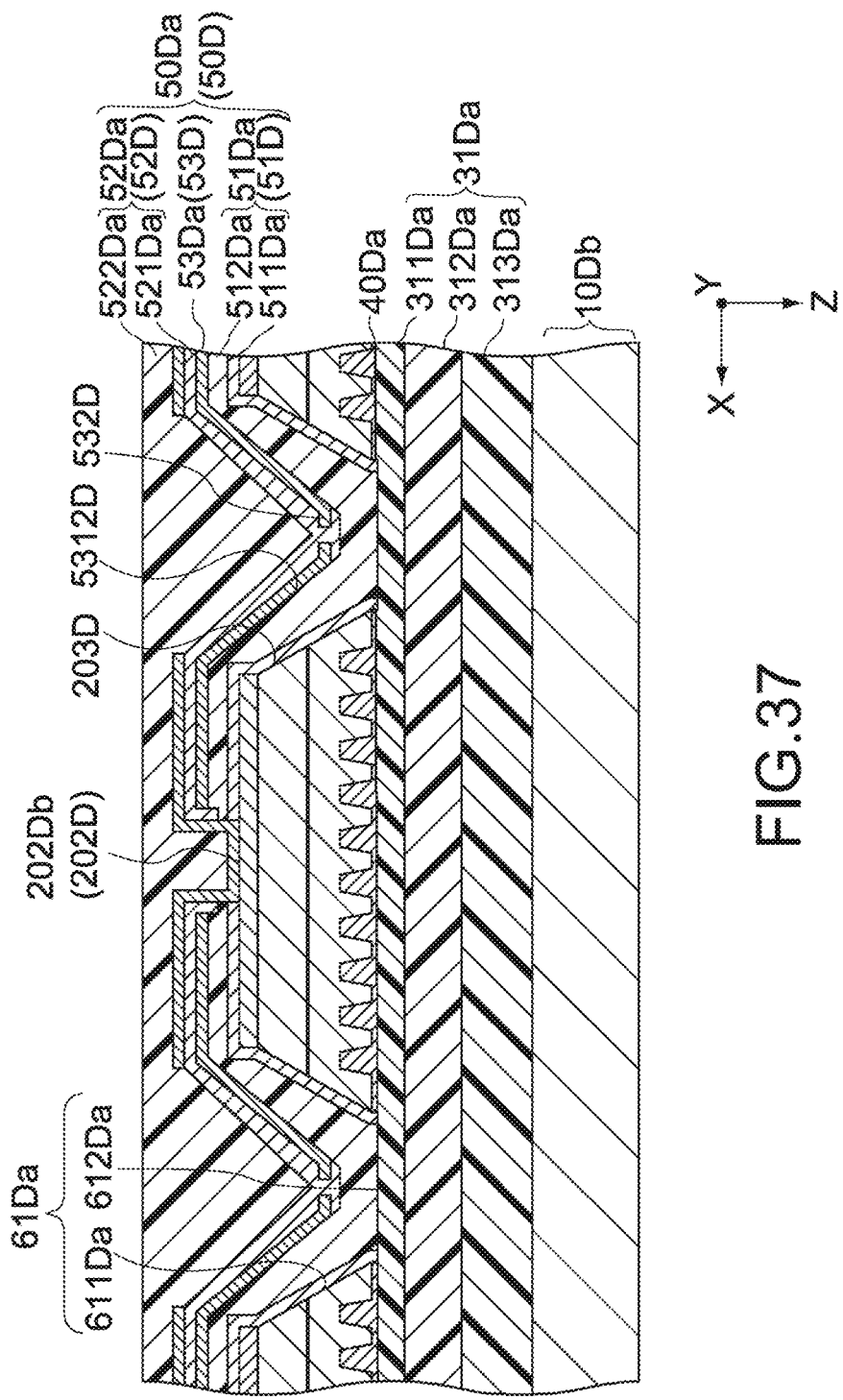

LIGHT-EMITTING ELEMENT HAVING AN OPTICAL FUNCTION FILM INCLUDING A REFLECTION LAYER

CROSS REFERENCE TO RELATED APPLICATIONS

This application claims the benefit of Japanese Priority Patent Application JP 2013-163933 filed Aug. 7, 2013, the entire contents of which are incorporated herein by reference.

BACKGROUND

The present disclosure relates to a light-emitting element including a semiconductor material, a light-emitting-element wafer, and an electronic apparatus.

There is a semiconductor light-emitting element known to include a light-emitting layer made of a semiconductor material such as AsP (arsenic phosphide) or AlGaInP (aluminum gallium indium phosphide) compound. As an example, refer to Patent Application Laid-open No. 2011-66056. Such a light-emitting element is typically in the layer structure including an n-type semiconductor layer, an active layer, and a p-type semiconductor layer. In the structure, the active layer produces light, and the light produced by the active layer is emitted from a light-emission plane being a part of the surface of the light-emitting element.

SUMMARY

With the above structure, however, there is a problem of reduced efficiency of light emission from the light-emission plane due to a light leakage from the remaining area to the outside. A difficulty in adjusting the directivity of emitted light is also a problem.

It is thus desirable to provide a light-emitting element, a light-emitting-element wafer, and an electronic apparatus with which emitted light is provided with enhanced emission intensity and improved directivity.

According to an embodiment of the present disclosure, there is provided a light-emitting element that includes a light-emitting layer, and an optical function film.

The light-emitting layer is configured to include a first plane with a first electrode, a second plane with a second electrode, and a circumferential plane connecting the first and second planes, the second plane being opposing to the first plane, and the light-emitting layer being made of a semiconductor.

The optical function film is configured to include a reflection layer being able to reflect light coming from the light-emitting layer, the reflection layer being provided with first and second regions, the first region covering the second plane and the circumferential plane, the second region protruding from the first region to an outside of the light-emitting layer to expose an end plane thereof.

Such a structure allows the first region of the reflection layer to reflect light directed to the side of the circumferential plane or the second plane of the light-emitting layer, and the second region of the reflection layer to reflect also light directed toward the outside of the light-emitting layer. As a result, emitted light is enhanced in emission intensity, and improved in directivity.

Moreover, with the exposed end plane of the reflection layer, the heat dissipation is improved.

The optical function film may further include a first insulation layer formed between the light-emitting layer and the reflection layer, and a second insulation layer formed on the reflection layer.

With the optical function film in such a structure, the first insulation layer provides insulation between the light-emitting layer and the reflection layer, and the second insulation layer improves insulation between the light-emitting layer and the outside.

The second region may protrude in a direction parallel to the first plane.

Alternatively, the second region may protrude in a direction parallel to the circumferential plane.

With the second region as above, light directed to the circumferential portion of the first plane is reflected by the second region so that the emission intensity is enhanced.

The light-emitting element may further include an inorganic insulation film configured to cover the first plane.

This allows the light-emitting layer to be covered in its entirety by the inorganic film and the optical function film, to be stably protected, and to be provided with electrical insulation. Moreover, by adjusting the inorganic film to have a predetermined thickness in accordance with a refractive index with the light-emitting layer, the emission intensity is enhanced due to interference of light.

The first plane may be in a concave-convex structure.

Such a structure allows adjustment of optical characteristics of the first plane, and enhancement of the emission intensity for light coming from the first plane being a light-emission plane.

The first plane may be formed to be larger than the second plane.

Such a structure allows size increases of the first plane being a light-emission plane, and the reflection layer to include tapered planes. Therefore, the emission intensity from the first plane is enhanced.

The first region may include first and second reflection planes, the first reflection plane being opposing to the second plane, the second reflection plane being opposing to the circumferential plane.

The second reflection plane may form a first tilt angle with the first plane, and the circumferential plane may form a second tilt angle with the first plane, the first tilt angle being smaller than the second tilt angle.

This allows control over emitted light in terms of emission direction, and improvement of directivity of the emitted light.

The light-emitting layer may emit red light.

In this case, the semiconductor may include at least any one of an AsP compound semiconductor, an AlGaInP compound semiconductor, and a GaAs compound semiconductor.

According to an embodiment of the present disclosure, there is provided a light-emitting-element wafer that includes a support substrate, and a plurality of light-emitting elements.

The light-emitting elements each include a light-emitting layer, and an optical function film.

The light-emitting layer is configured to include a first plane with a first electrode, a second plane with a second electrode, and a circumferential plane connecting the first and second planes, the second plane being opposing to the first plane, and the light-emitting layer being made of a semiconductor.

The optical function film is configured to include a first region covering the second plane and the circumferential plane, a second region protruding from the first region to an outside of the light-emitting layer to expose an end plane thereof, and a reflection layer being able to reflect light coming from the light-emitting layer.

The light-emitting elements are arranged on the support substrate, the support substrate being opposing to the second plane of the light-emitting layer with the optical function film being sandwiched therebetween.

With the light-emitting-element wafer, because the light-emitting elements are arranged on the support substrate, these light-emitting elements may be supplied with ease to an electronic apparatus such as display apparatus.

The light-emitting-element wafer may further include an attachment layer configured to attach the support substrate and the plurality of light-emitting elements.

This structure may allow easy attachment between the support substrate and the light-emitting elements.

According to an embodiment of the present disclosure, there is provided an electronic apparatus that includes a substrate formed with a driving circuit, and at least one first semiconductor light-emitting element.

The first semiconductor light-emitting element includes a light-emitting layer, and an optical function film.

The light-emitting layer is configured to include a first plane with a first electrode connected to the driving circuit, a second plane with a second electrode connected to the driving circuit, and a circumferential plane connecting the first and second planes, the second plane being opposing to the first plane, and the light-emitting layer being made of a semiconductor.

The optical function film is configured to include a first region covering the second plane and the circumferential plane, a second region protruding from the first region to an outside of the light-emitting layer to expose an end plane thereof, and a reflection layer being able to reflect light coming from the light-emitting layer.

The first semiconductor light-emitting element is arranged on the substrate, the substrate being opposing to the second plane with the optical function film being sandwiched therebetween.

The first semiconductor light-emitting element and other first semiconductor light-emitting elements may emit red light with.

The electronic apparatus may further include a plurality of second semiconductor light-emitting elements that emit blue right, and a plurality of third semiconductor light-emitting elements that emit green light.

The first, second, and third semiconductor light-emitting elements may be arranged on the substrate.

This allows provision of an electronic apparatus such as display apparatus having desired display characteristics using a plurality of first semiconductor elements.

As described above, according to the embodiments of the present disclosure, provided are a light-emitting element, a light-emitting-element wafer, and an electronic apparatus with which emitted light is with enhanced emission intensity and improved directivity.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 7A is a schematic cross-sectional view of a main part of the light-emitting element of FIG. 1, and FIG. 7B is a diagram showing a correlation between the first inorganic film in the light-emitting element (a refractive index N, and a thickness t (nm) thereof) and a distribution of light directivity;

FIGS. 17A and 17B are each a schematic cross-sectional view of the light-emitting-element wafer, illustrating the process of forming the optical function film in the manufacturing method therefor;

FIG. 18A is a graph showing the relationship between the width of a first separation groove and that of a second aperture portion in the reflection layer between the elements adjacent to each other, and FIG. 18B is a graph showing a degree of misalignment of an element separation mask with respect to the reflection layer in the plane of the light-emitting-element wafer;

FIG. 19 is a schematic plan view of a display apparatus (electronic apparatus) using the light-emitting element of FIG. 1;

FIG. 37 is a schematic cross-sectional view of the light-emitting-element wafer of FIG. 36, showing a manufacturing method therefor.

DETAILED DESCRIPTION OF EMBODIMENTS

Hereinafter, embodiments of the present disclosure will be described with reference to the drawings.

First Embodiment

Figure 1:
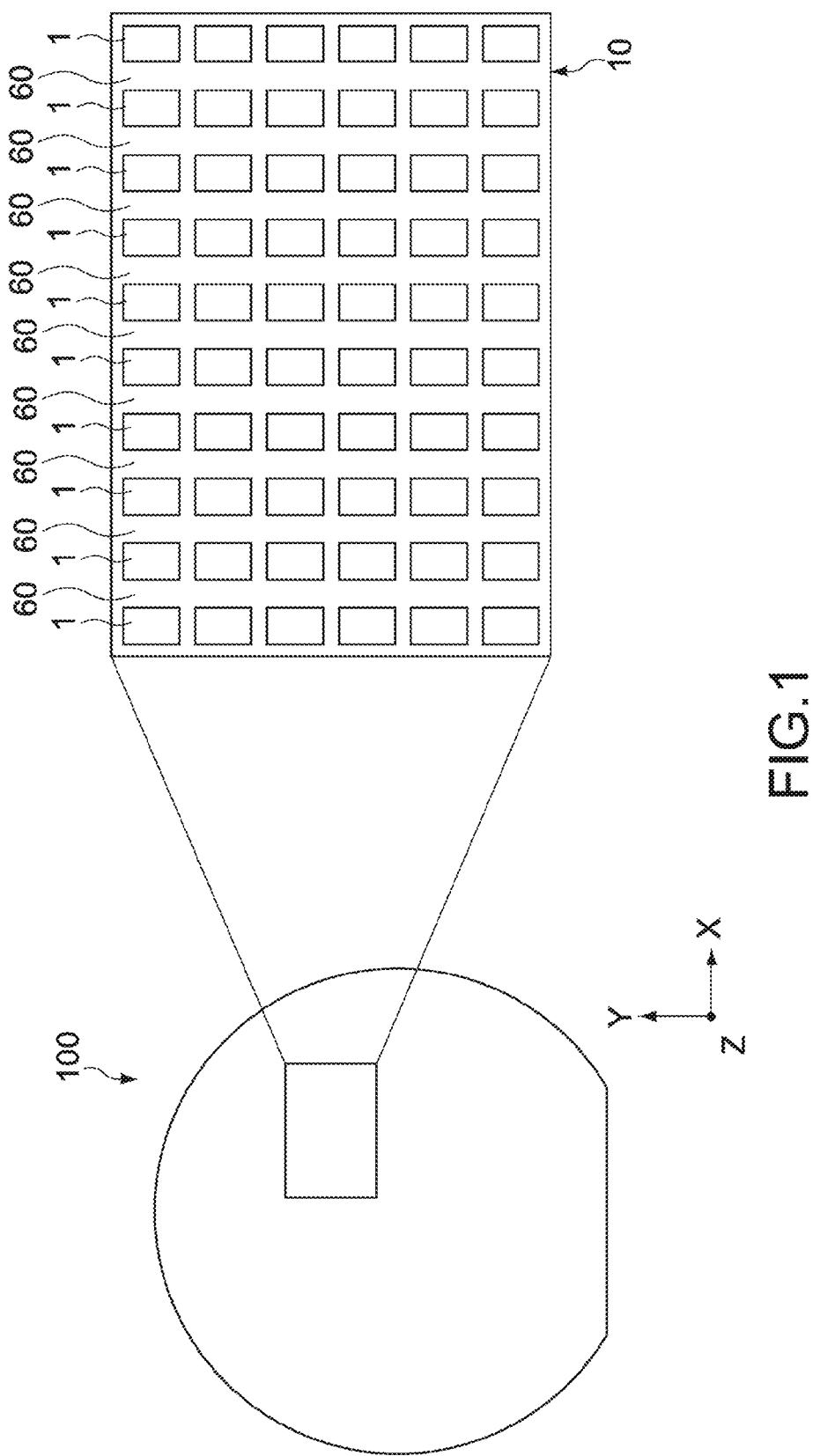
FIG. 1 is a schematic plan view of a light-emitting-element wafer according to a first embodiment of the present disclosure.
Figure 2:
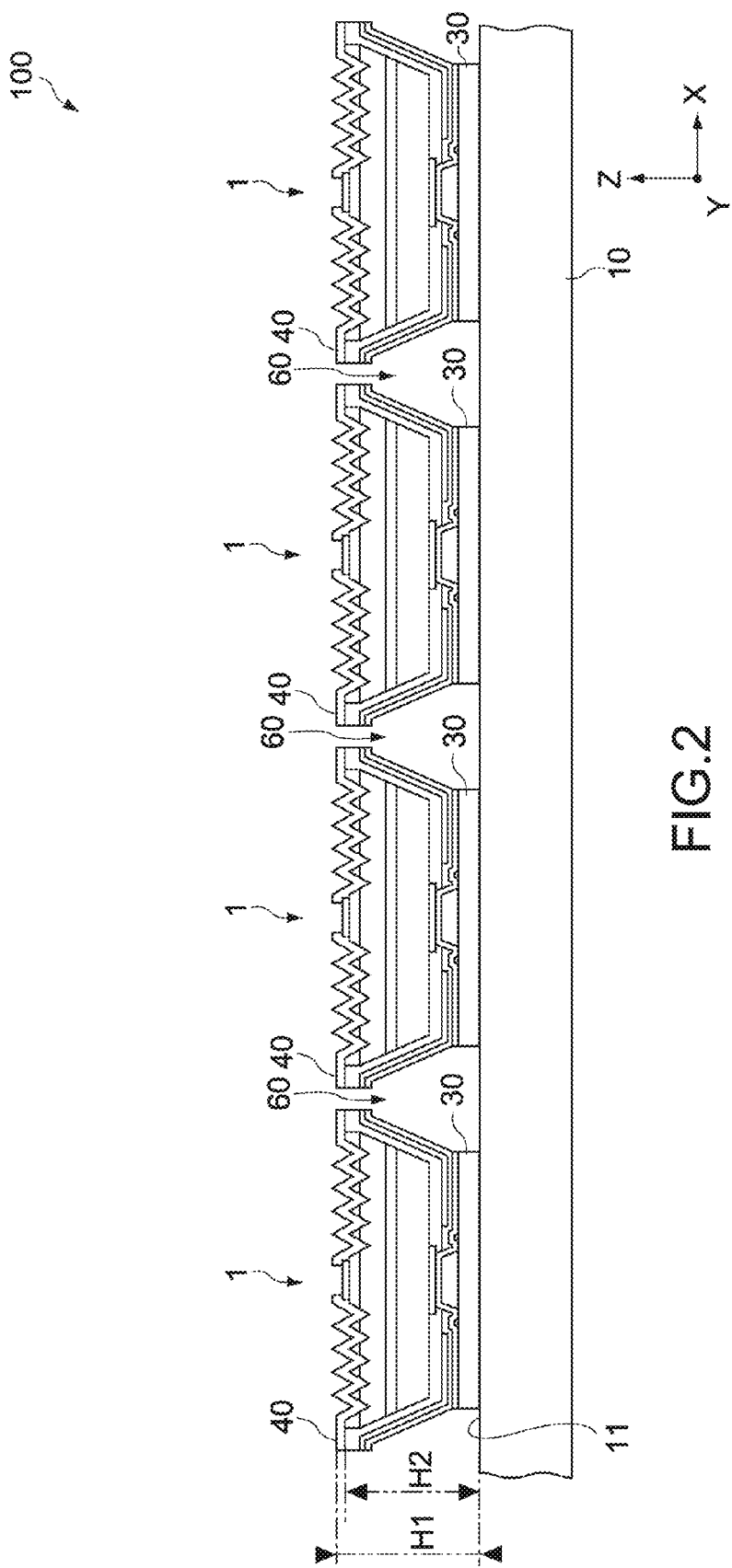
FIG. 2 is a schematic cross-sectional view of the light-emitting-element wafer of FIG. 1.

FIG. 1 is a schematic plan view of a light-emitting-element wafer 100 according to a first embodiment of the present disclosure, and FIG. 2 is a schematic cross-sectional view of the light-emitting-element wafer 100. Described below is the structure of the light-emitting-element wafer 100 according to this embodiment. In the drawings, X- and Y-axes are orthogonal to each other, i.e., in-plane direction of the light-emitting-element wafer 100, and a Z-axis is orthogonal to the X- and Y-axes, i.e., the thickness and vertical direction of the light-emitting-element wafer 100.

[Semiconductor Light-Emitting-Element Wafer]

The light-emitting-element wafer 100 includes a support substrate 10, a plurality of light-emitting elements 1, an attachment layer 30, and a separation groove section 60. In the light-emitting-element wafer 100, the light-emitting elements 1 are arranged on the support substrate 10. As will be described later, the light-emitting-element wafer 100 in this embodiment is for providing the light-emitting elements 1, which are to be mounted on electronic apparatuses including display apparatuses, lighting fixtures, or others.

The support substrate 10 includes a surface 11 on which the light-emitting elements 1 are disposed, and is a 2- to 12-inch wafer, for example. The support substrate 10 is made of a material that shows high transmittance for a laser wavelength used in a manufacturing process that will be described later, for example. Such a material is exemplified by sapphire ($Al_2O_3$), quartz ($SiO_2$), or glass.

The light-emitting elements 1 are arranged on the support substrate 10 along the X- and Y-axis directions.

The attachment layer 30 attaches together the support substrate 10 and the light-emitting elements 1. The attachment layer 30 is disposed between the support substrate 10 and an external connection terminal 730 in each of the light-emitting elements 1 that will be described later. The attachment layer 30 has the thickness of 0.2 μm to 2 μm inclusive, and is made of a thermoplastic resin material or others that are adhesive such as polyimide. The attachment layer 30 as above may be easily separated from the support substrate 10 by the action of ablation, which occurs when the thermoplastic resin material or others are heated and evaporated by irradiation of laser light with a predetermined wavelength, for example.

The material of the attachment layer 30 is not restricted to the above, and may include an ultraviolet curing resin, an adhesive sheet, an adhesive material, or others.

The light-emitting elements 1 adjacent to each other are separated by the separation groove section 60. That is, the separation groove section 60 is formed with a depth reaching the surface 11 of the support substrate 10 from an inorganic film 40 of each of the light-emitting elements 1 that will be described later, thereby separating the light-emitting elements 1. In the below, the light-emitting elements 1 are sometimes simply referred to as "elements 1".

[Light-Emitting Element]

The light-emitting elements 1 are each a light-emitting diode (LED) in the structure with layers of semiconductor compounds. In this embodiment, the light-emitting elements 1 are arranged on the support substrate 10. The size of each of the light-emitting elements 1 is arbitrarily determined considering the size of the support substrate 10 or the configuration of an electronic apparatus on which the light-emitting elements 1 are mounted, e.g., the length along the X-axis direction is 1 μm to 300 μm inclusive, the length along the Y-axis direction is 1 μm to 300 μm inclusive, and the height along the Z-axis direction is 1 μm to 20 μm inclusive.

Figure 3:
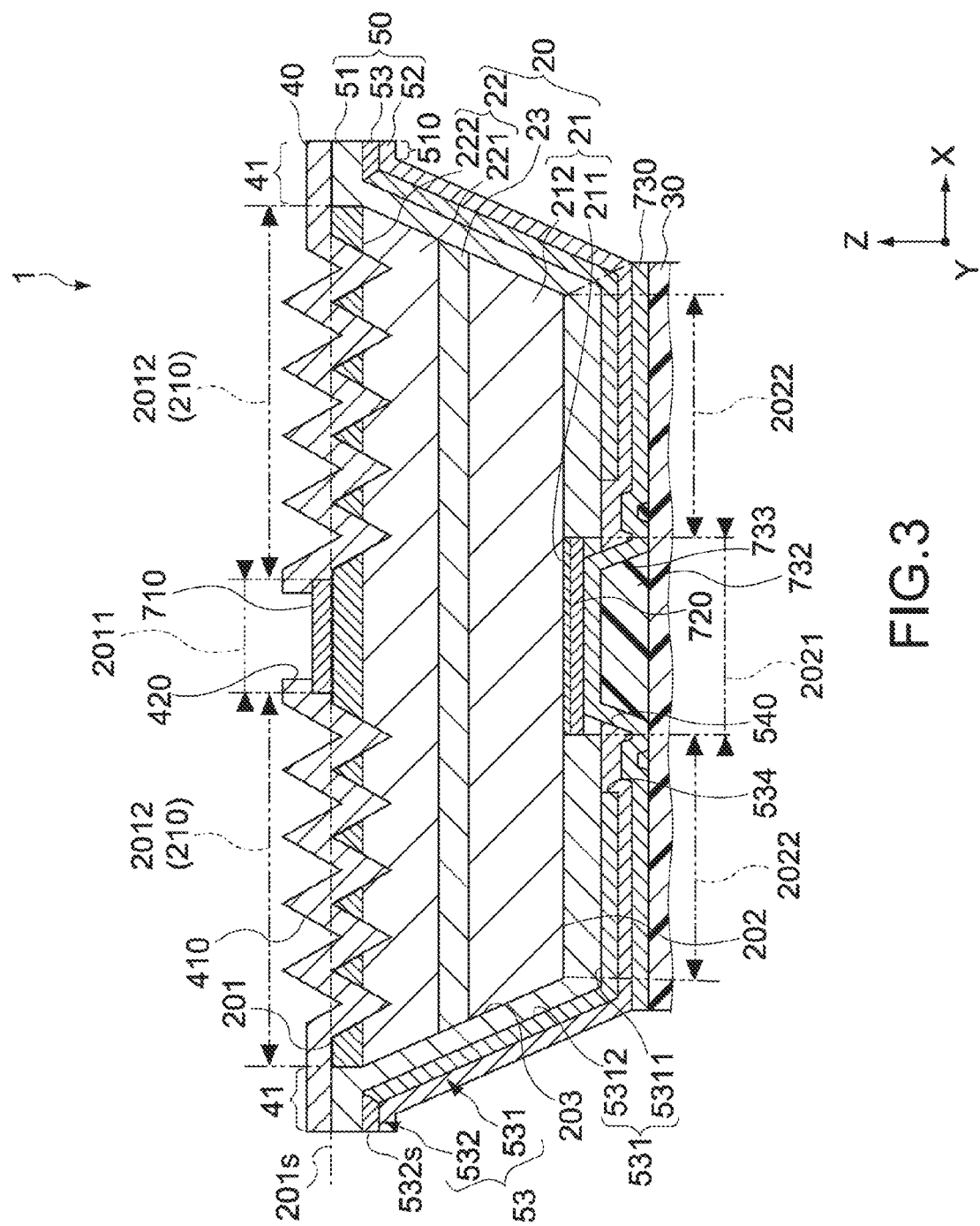
FIG. 3 is a schematic cross-sectional view of a light-emitting element of FIG. 1, showing the structure thereof.

FIG. 3 is a schematic cross-sectional view of the light-emitting element 1, showing the structure thereof. The light-emitting element 1 includes a light-emitting layer 20, the inorganic film 40, and an optical function film 50.

The light-emitting layer 20 is a semiconductor, including first and second planes 201 and 202, and a circumferential plane 203. The first plane 201 includes a first electrode 710, and the second plane 202 includes a second electrode 720. The circumferential plane 203 connects together the first and second planes 701 and 702.

The inorganic film 40 functions as an inorganic insulation film that covers the first plane 201.

The optical function film 50 functions with a reflection layer 53 that reflects light coming from the light-emitting layer 20.

In the below, the structure elements in the light-emitting element 1 are each described.

[Light-Emitting Layer]

In this embodiment, the light-emitting layer 20 is in the structure with semiconductor layers that emit red light, and includes GaAs and AlGaInP semiconductor compounds, for example. The light-emitting layer 20 includes a first semiconductor layer 21 of a first conductivity type, an active layer 23 formed on the first semiconductor layer 21, and a second semiconductor layer 22 of a second conductivity type formed on the active layer 23. In this embodiment, the first conductivity type is assumed to be n, and the second conductivity type is assumed to be p, but this is not restrictive.

The light-emitting layer 20 includes the first plane 201, the second plane 202 provided on the side opposite to the first plane 201, and the circumferential plane 203 connecting together the first and second planes 201 and 202.

The first and second planes 201 and 201 are disposed to face to each other in the Z-axis direction, and the light-emitting layer 20 has the entire thickness of about 1 μm to 20 μm inclusive, for example.

The light-emitting layer 20 is not particularly restricted in shape. As an example, the first plane 201 is formed to be larger than the second plane 202 in the planar view from the Z-axis direction like a square frustum. In this case, the cross-sectional area of the light-emitting layer 20 orthogonal to the Z-axis direction is gradually increased from the second plane 202 toward the first plane 201. The circumferential plane 203 is so configured as to include four tapered planes.

The first plane 201 includes a connection region 2011 formed with the first electrode 710, and a light extraction region 2012 formed in a first concave-convex structure (concave-convex structure) 210. The connection region 2011 occupies the center portion of the first plane 201, and the light extraction region 2012 is so disposed as to enclose the connection region 2011. The connection region 2011 is not restricted in position and shape, but may be in the oval shape, or may be provided like an island at several positions, for example.

The first concave-convex structure 210 may be changed as appropriate so as to provide the emitted light with desired optical characteristics. As exemplarily shown in FIG. 3, the first concave-convex structure 210 may be in the shape of a prism with ridge lines, or may include groove-like concave portions formed on a flat plane (the remaining portions are convex) (refer to FIGS. 10A to 15B).

The expression "the first plane 201 is substantially orthogonal to the Z-axis direction" indicates that a reference plane 201s of the first plane 201 is substantially orthogonal to the Z-axis direction. The reference plane 201s of the first plane 201 is assumed to be a virtual plane including vertex portions (vertex planes) of a plurality of convex portions in the first concave-convex structure 210 by referring to FIG. 3.

The second plane 202 includes a connection region 2021, and a reflection region 2022 to enclose the connection region 2021. The connection region 2021 is formed with the second electrode 720, and occupies the center portion of the second plane 202. The reflection region 2022 is covered by the optical function film 50.

From the light-emitting layer 20, light produced by the active layer 23 is emitted via the light extraction region 2012 of the first plane 201. In this embodiment, in the above-mentioned two respects, i.e., in the respect that the circumferential plane 203 is configured to include four tapered planes, and is covered by the reflection layer 53 of the optical function film 50 that will be described later, and in the other respect that the light extraction region 2012 of the first plane 201 is in the first concave-convex structure 210, the light is reflected upward in the Z-axis direction so that the efficiency of light emission is improved, and the directivity of light is controlled. In the below, the expression of "upward in the Z-axis direction" is sometimes referred to as "toward the front of the light-emitting element 1".

The first semiconductor layer 21 is in the layer structure including a first contact layer 211, and a first cladding layer 212. The first contact layer 211 is connected with the second electrode 720, and the area thereof is substantially the same as that of the second electrode 720 when it is viewed from the Z-axis direction. The first contact layer 211 is made of a material allowing Ohmic contact with the second electrode 720, e.g., n-type GaAs (gallium arsenide). The first cladding layer 212 is formed on the first contact layer 211, and occupies entirely the second plane 202 when it is viewed from the Z-axis direction. That is, the exposed surface of the first cladding layer 212 serves as a reflection region 2022 of the second plane 202. The first cladding layer 212 includes n-type AlGaInP, for example.

The active layer 23 is in the multiquantum well structure including a plurality of well layers and a plurality of barrier layers, and is able to emit light with a predetermined wavelength. The well layers and the barrier layers are made of semiconductor materials of different compositions. The active layer 23 in this embodiment is able to emit red light with an emission wavelength of about 500 to 700 nm. The active layer 23 includes about 10 to 20 well layers including GaInP (gallium indium phosphide), and 10 to 20 barrier layers including AlGaInP, for example. These well and barrier layers are alternately disposed.

The second semiconductor layer 22 is in the layer structure including a second cladding layer 221, and a second contact layer 222. The second cladding layer 221 is formed on the active layer 23, and includes p-type AlGaInP, for example. The second contact layer 222 is formed on the second cladding layer 221, and is connected with the first electrode 710. The second contact layer 222 occupies entirely the first plane 201 when it is viewed from the Z-axis direction. The surface of the second contact layer 222 not connected with the first electrode 710 is exposed, and serves as the light extraction region 2012 of the first plane 201. The second contact layer 222 is made of a material allowing Ohmic contact with the first electrode 710, e.g., P-type GaP (gallium phosphide).

Alternatively, in the respective first and second semiconductor layers 21 and 22, the above-mentioned layers may include therebetween another layer as appropriate. As an example, in the second semiconductor layer 22, the active layer 23 and the second cladding layer 221 may include therebetween a protection layer including undoped AlGaInP. This protection layer may prevent diffusion of a doping agent in the second cladding layer 221 or others to the side of the active layer 23. Herein, the material described for each of the layers in the light-emitting layer 20 is an example, and may be selected as appropriate considering the structure of the light-emitting element 1 or desired light emission characteristics.

The first electrode 710 is formed to the connection region 2011 of the first plane 201, and is connected to the second contact layer 222. That is, the surface of the first electrode 710 serves as the connection region 2011 of the first plane 201. The first electrode 710 is not particularly restricted in shape, and may be in the oval, circular, or rectangular shape with the length of the minor axis being about 1 to 10 μm along the X-axis direction, and the length of the major axis being about 1 to 10 μm along the Y-axis direction, for example. The thickness of the first electrode 710 may be 200 to 600 μm, for example. The first electrode 710 may be made of a metallic material including Ti (titanium), Pt (platinum), Au (gold), Ge (germanium), Ni (nickel), and Pd (palladium), or an alloy or a laminate thereof, or a transparent conductive material including ITO (indium-tin oxide), for example.

The second electrode 710 is formed to the connection region 2021 of the second plane 202, and is connected to the first contact layer 211. That is, the surface of the second electrode 720 serves as the connection region 2021 of the second plane 202. The second electrode 720 is not particularly restricted in shape, and may be in the oval, circular, or rectangular shape, for example. The thickness of the second electrode 720 may be 200 to 600 μm, for example. The second electrode 720 may be made of a metallic material including Ti, Pt, Au, Ge, Ni, and Pd, or an alloy or a laminate thereof, or a transparent conductive material including ITO, for example.

[Inorganic Film]

The inorganic film 40 is so formed as to cover the light extraction region 2012 of the first plane 201. More specifically, the inorganic film 40 is formed on the first electrode 710 (the connection region 2011), and includes a connection hole 420 facing the first electrode 710. The inorganic film 40 has the thickness of 200 μm to 600 μm inclusive, and more desirably, the thickness of 300 μm to 500 μm inclusive, for example.

The inorganic film 40 is in a second concave-convex structure 410, and includes a first end portion 41. The second concave-convex structure 410 is formed to conform to the first concave-convex structure 210 of the first plane 201, and the first end portion 41 is formed at the circumferential edge of the second concave-convex structure 410. The first end portion 41 has a flat plane formed to be parallel to the first plane 201, and protrudes toward the outside of the first plane 201. The expression of "(a flat plane) formed to be parallel to the first plane 201" means that the first end portion 41 is formed to be parallel to the reference plane 201s of the first plane 201.

The inorganic film 40 is light-transmissive, and is made of silicon nitride (hereinafter, SiN) with the refractive index of 1.9 to 2.3 inclusive, silicon oxide such as $SiO_2$, or a laminate of SiN and $SiO_2$, for example. Alternatively, the inorganic film 40 may be made of an insulation material such as TiN (titanium nitride), $TiO_2$ (titanium dioxide), or others. This provides insulation to the first plane 201 of the light-emitting layer 20, and allows the inorganic film 40 to serve as a protection film for the first plane 201. As will be described later, with the inorganic film 40 having the predetermined thickness and refractive index, the light-emitting element 1 may emit light with enhanced intensity toward the front thereof.

[Optical Function Film]

The optical function film 50 is so formed as to cover as a whole the second plane 202 and the circumferential plane 203 of the light-emitting layer 20. The optical function film 50 reflects light coming from the light-emitting layer 20 toward the side of the first plane 201, thereby contributing to improve the efficiency of light emission.

To be more specific, the optical function film 50 is formed to cover the reflection region 2022 on the second plane 202, and on the circumferential plane 203, is formed to entirely cover the circumferential plane 203. The thickness of the optical function film 50 on the second plane 202 is 0.1 μm or more, and the thickness of the portion thereof along the circumferential plane 203 is 0.1 μm or more, for example.

The optical function film 50 includes a second end portion 510 that protrudes toward the outside of the light-emitting layer 20. In this embodiment, the second end portion 510 protrudes in a direction parallel to the first plane 201 of the light-emitting layer 20. That is, the second end portion 510 serves as a flange portion of the optical function film 50, i.e., is bent to be parallel to the first plane 201, and is formed to conform to the first end portion 41 of the inorganic film 40. The thickness of the second end portion 510 is 0.2 μm to 5 μm inclusive, for example.

As to the height of the above structure along the Z-axis direction from the surface 11 of the support substrate 10, the height to the second end portion 510 of the optical function film 50, i.e., height H2, is lower than the height to the surface of the inorganic film 40 at the first end portion 41, i.e., height H1 (refer to FIG. 2).

The optical function film 50 includes the reflection layer 53, a first insulation layer 51, and a second insulation layer 52. The reflection layer 53 is able to reflect light coming from the light-emitting layer 20. The first insulation layer 51 is formed between the light-emitting layer 20 and the reflection layer 53, and the second insulation layer 52 is formed on the reflection layer 53. That is, the optical function film 50 is in the layer structure including the layers in order on the light-emitting layer 20, i.e., the first insulation layer 51, the reflection layer 53, and the second insulation layer 52.

The first insulation layer 51 covers the second plane 202, starting from the reflection region 2022 and the circumferential plane 203 up to the second end portion 510 directly below the first end portion 41. On the other hand, the second insulation layer 52 is formed to the region where the first insulation layer 51 is already formed when it is viewed from the Z-axis direction. The first and second insulation layers 51 and 52 may be made of silicon oxide such as $SiO_2$, or SiN (silicon nitride), TiN, or $TiO_2$, or any other inorganic insulation materials, or a laminate thereof.

The reflection layer 53 includes an aperture portion 534 larger than a connection hole 540 that will be described later, and is formed between the first and second insulation layers 51 and 52. The reflection layer 53 serves to reflect light coming from the light-emitting layer 20 toward the first plane 201. This means that the reflection layer 53 may be made of a material with high efficiency for reflection of light coming from the light-emitting layer 20.

In this embodiment, the reflection layer 53 is made of a metallic material including Al (aluminum), Au, Ti, Cu (copper), Ni, Ag (silver), and others, or an alloy or a laminate thereof, for example.

The reflection layer 53 is formed between the first and second insulation layers 51 and 52. This provides insulation to the reflection layer 53 from the light-emitting layer 20 and the outside of the light-emitting element 1. That is, this allows the reflection layer to electrically float.

The reflection layer 53 includes first and second regions 531 and 532. The first region 531 covers the second plane 202 and the circumferential plane 203, and the second region 532 protrudes from the first region 531 toward the outside of the light-emitting layer 20. The second region 532 is formed inside of the second end portion 510, and in this embodiment, protrudes in a direction parallel to the first plane 201 (the reference plane 201s of the first plane 201).

By the reflection layer 53 including the second region 532, the light found its way into the first end portion 41 may be reflected upward in the Z-axis direction before emission. As a result, the light-emitting element 1 may emit light with enhanced intensity toward the front thereof.

The first region 531 of the reflection layer 53 includes a first reflection plane 5311 opposing to the second plane 202, and a second reflection plane 5312 opposing to the circumferential plane 203. In this embodiment, the first region 531 is formed in such a manner that a first tilt angle between the second reflection plane 5312 and the reference plane 201s of the first plane 201 is nearly the same as a second tilt angle between the circumferential plane 203 and the reference plane 201s of the first plane 201.

The connection hole 540 is formed by the first and second insulation layers 51 and 52. That is, from the inner circumferential plane of the connection hole 540, the first and second insulation layers 51 and 52 are exposed but not the reflection layer 53. This provides insulation between the reflection layer 53 and the second electrode 720.

The reflection layer 53 includes an end plane 532s, which is exposed from the end plane of the second end portion 510 in the second region 532. This accordingly improves heat dissipation of the light-emitting element 1. In this embodiment, the first and second end portions 41 and 510 each have an end plane parallel to the Z-axis direction, and these end planes are formed in the same plane.

The light-emitting element 1 in this embodiment includes the external connection terminal 730 for connection with the second electrode 720 exposed from the connection hole 540.

[External Connection Terminal]

The external connection terminal 730 is disposed between the attachment layer 30 and the optical function film 50. The external connection terminal 730 covers the optical function film 50 and the second electrode 720 for connection with the second electrode 720, and is in the rectangular shape substantially the same size as the first reflection plane 5311 of the optical function film 50 when it is viewed from the Z-axis direction. The thickness of the external connection terminal 730 is not particularly restrictive, but may be 0.1 μm to 0.5 μm inclusive, for example. The external connection terminal 730 is made of a metallic material including Al, Au, Ti, or others, or an alloy or a laminate thereof.

Alternatively, as shown in FIG. 3, a resin film 732 may be formed so as to fill a concave portion 733 of the external connection terminal 730 formed by the connection hole 540. This resin film 732 is made of an adhesive resin material, for example. The resin film 732 may be formed not only in the concave portion 733 but also over the region where the external connection terminal 730 is formed (refer to a resin R3 in FIGS. 15A and 15B).

The light-emitting elements 1 are each so disposed that the second plane 202 of the light-emitting layer 20 faces the support substrate 10 via the optical function film 50, and are all attached onto the support substrate 10 via the attachment layer 30.

Such light-emitting elements 1 are each provided with the optical function film 50 including the reflection layer 53, which covers the second plane 202 and the circumferential plane 203. The light emitted from the active layer 23 toward the second plane 202 and the circumferential plane 203 is thus reflected by the first region 531 of the reflection layer 53, and even if the light finds its way into the first end portion 41 of the inorganic film 40, the light is reflected by the second region 532 of the reflection layer 53. This accordingly improves the efficiency of light emission toward the front of the light-emitting element 1. Moreover, as will be described below, the reflection layer 53 may improve the directivity of emitted light.

[Effect of Reflection Layer on Directivity of Light]

Figure 4:
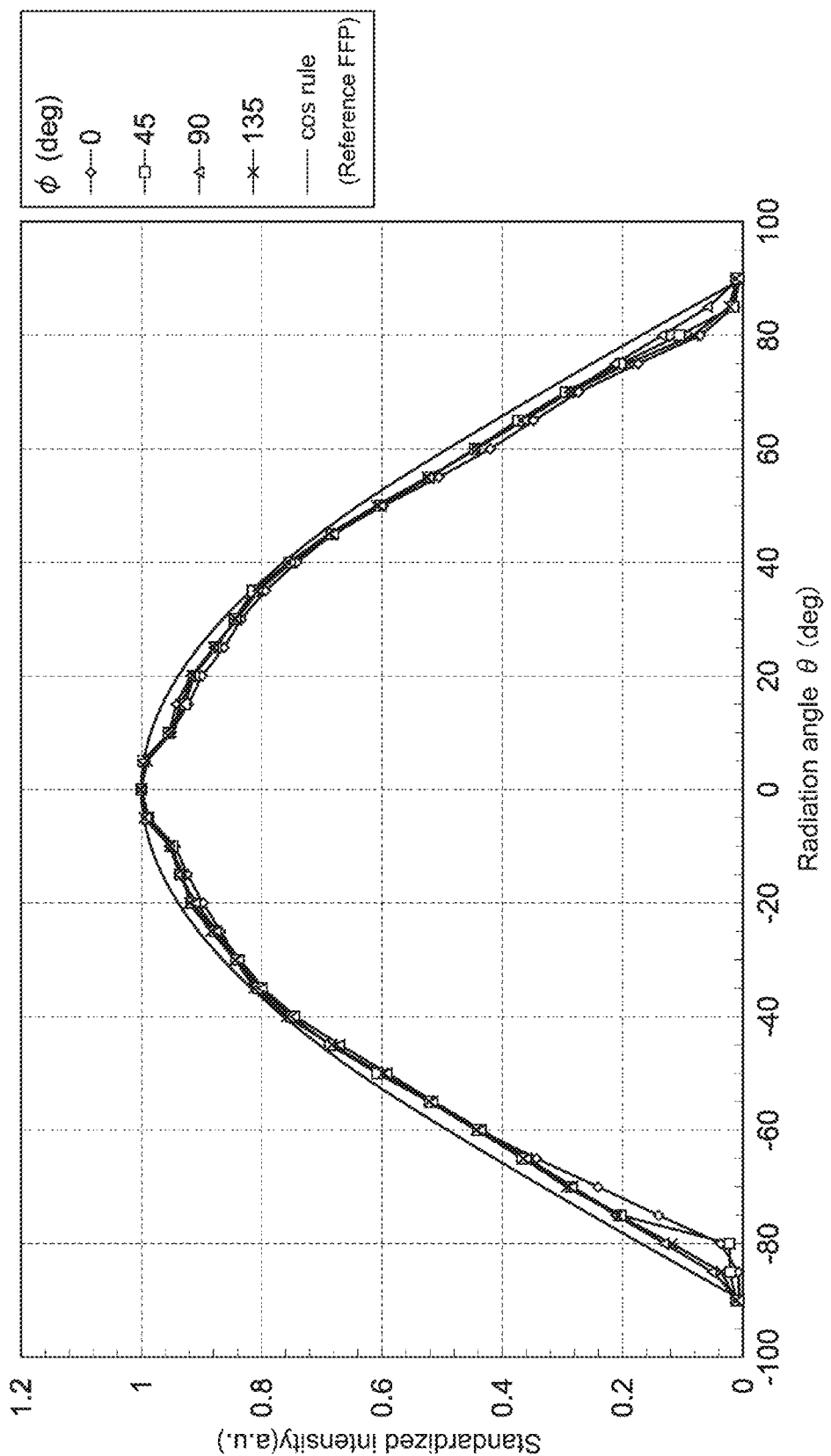
FIG. 4 is a graph showing FFPs (Far Field Patterns) when emitted light is viewed from a plurality of directions orthogonal to the normal of a first plane, and showing the results in examples according to the first embodiment.
Figure 5:
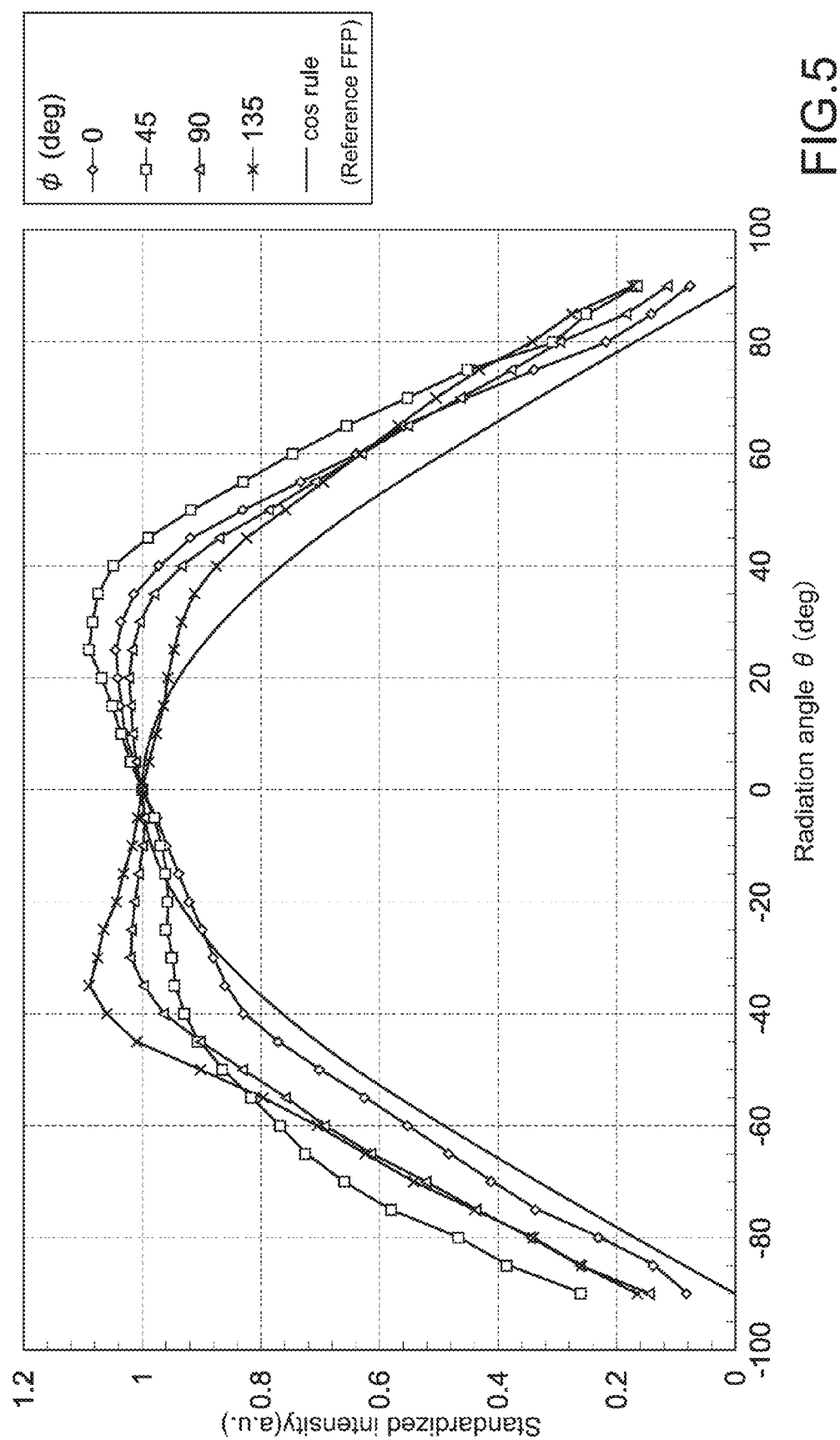
FIG. 5 is a graph showing FFPs when emitted light is viewed from a plurality of directions orthogonal to the normal of the first plane, and showing the results in comparison examples.

FIGS. 4 and 5 are each a graph showing FFPs (Far Field Patterns) when emitted light is viewed from a plurality of directions orthogonal to the normal of the first plane 201, i.e., the direction parallel to the Z-axis direction. In the graph, the horizontal axis indicates a radiation angle θ, and the vertical axis indicates the intensity of emitted light (standardized intensity when the intensity of θ=0° is 1). FIG. 4 shows the results of examples in this embodiment in which the reflection film 53 is in use, and FIG. 5 shows the results of comparison examples in which no reflection film is in use.

Figure 6:
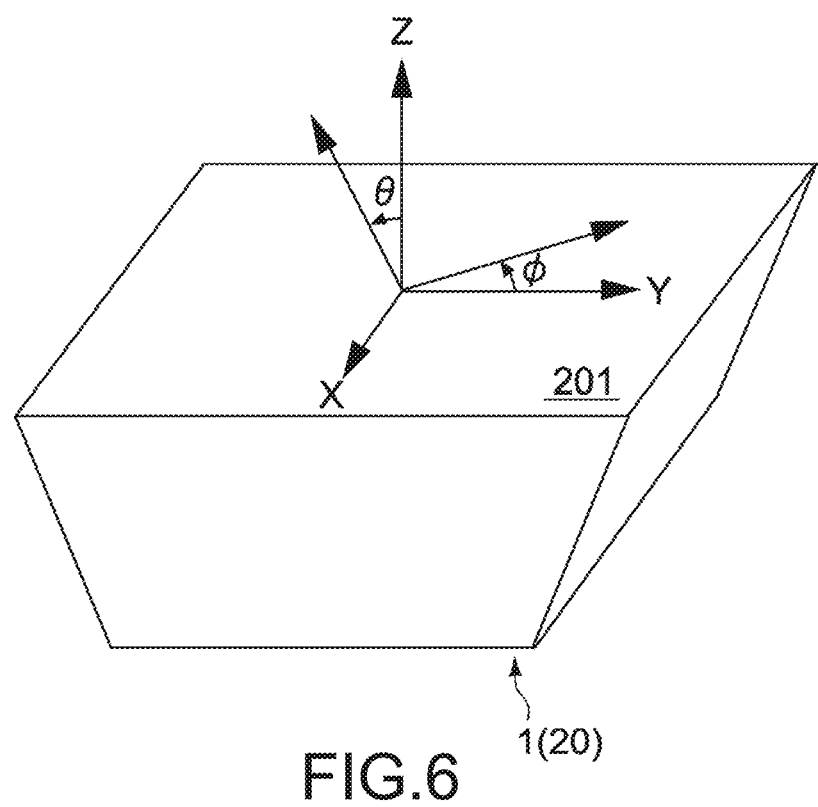
FIG. 6 is a schematic diagram for illustrating a radiation angle θ in the graphs of FIGS. 4 and 5, and an angle φ relative to the direction of viewing the emitted light.

FIG. 6 is a schematic diagram for illustrating the radiation angle θ in the graphs of FIGS. 4 and 5, and an angle φ relative to the direction of viewing the emitted light. As shown in FIG. 6, the radiation angle θ is relative to the normal of the light-emission plane, and in this embodiment, is relative to the Z-axis direction orthogonal to the first plane 201. The direction of viewing the emitted light is defined by the angle φ relative to the reference direction in the XY plane, which is parallel to the first plane 201. Herein, the reference direction is a specific direction, e.g., Y-axis direction, parallel to the first plane 201 being a light-emission plane, i.e., 0°. That is, the graphs of FIGS. 4 and 5 show the results when the emitted light is viewed from the angles φ=0°, 45°, 90°, and 135°.

In FIG. 4, the FFPs are almost in the same shape irrespective of the angle φ. In FIG. 5, unlike the results in FIG. 4, the FFPs vary in shape depending on the angle φ.

Generally, for the FFP of the emitted light, Lambertian is considered desirable. Lambertian is a description of an FFP of emitted light, and means a light distribution in which, when the radiation intensity is divided by the cosine of the radiation angle θ (cos θ), an FFP of emitted light on a certain light-emission plane takes given values irrespective of the angle φ of viewing the emitted light. When an FFP of emitted light is Lambertian, for example, the radiation intensity takes a maximum value toward the front of the light-emitting element 1 (θ=0°), and tends to be reduced with an increase of the absolute value of the radiation angle θ. With the FFP of the emitted light being Lambertian as above, the emitted light is uniform in all directions with the reduced viewing angle dependency thereof. For reference, FIGS. 4 and 5 respectively show the FFPs that take given values when the radiation intensity is divided by cos θ.

Hereinafter, such FFPs are referred to as reference FFPs.

That is, the FFPs of FIG. 5 vary depending on the angle φ of viewing the emitted light, and thus is not Lambertian. On the other hand, the FFPs of FIG. 4 are all in the shape similar to the reference FFP, and thus is Lambertian. This accordingly confirms that, with the reflection layer 53, the emitted light has reduced viewing angle dependency in terms of light-emission intensity, the FFPs are ideal Lambertian, and the emitted light is improved in directivity.

Also in this embodiment, the light-emitting layer 20 except for the connection regions 2011 and 2021 is covered on the surface not only by the optical function film 50 but also by the inorganic film 40. This provides insulation to the light-emitting layer 20, and ensures the light-emitting layer 20 to be physically and chemically stable.

As to the inorganic film 40, by adjusting the thickness and refractive index thereof, the emitted light from the light-emitting element 1 may be adjusted in directivity by utilizing interference of light with a predetermined wavelength. Described in the below is how the inorganic film 40 affects the directivity of the emitted light.

[Effect of Inorganic Film on Directivity of Light]

Figure 7A:
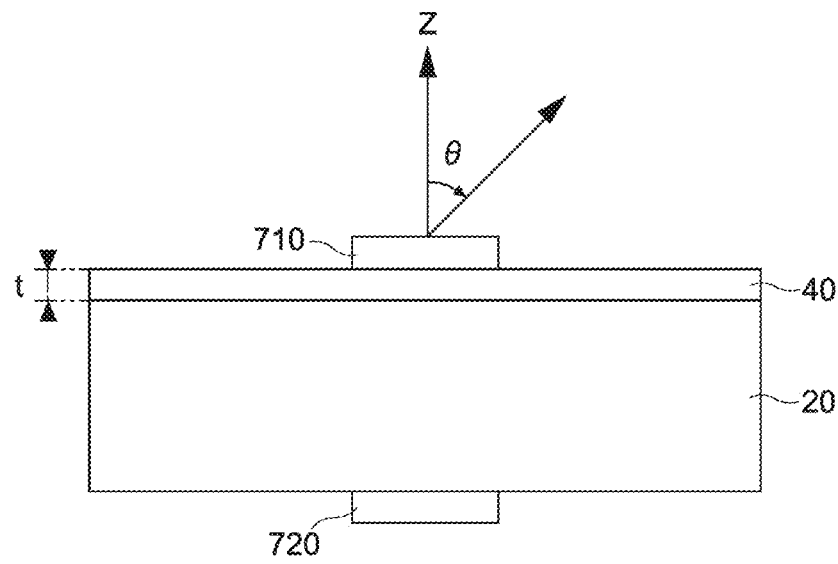
FIGS. 7A and 7B are each a diagram illustrating the effect affecting the directivity of light with a first inorganic film of FIG. 1, and more specifically.
Figure 7B:
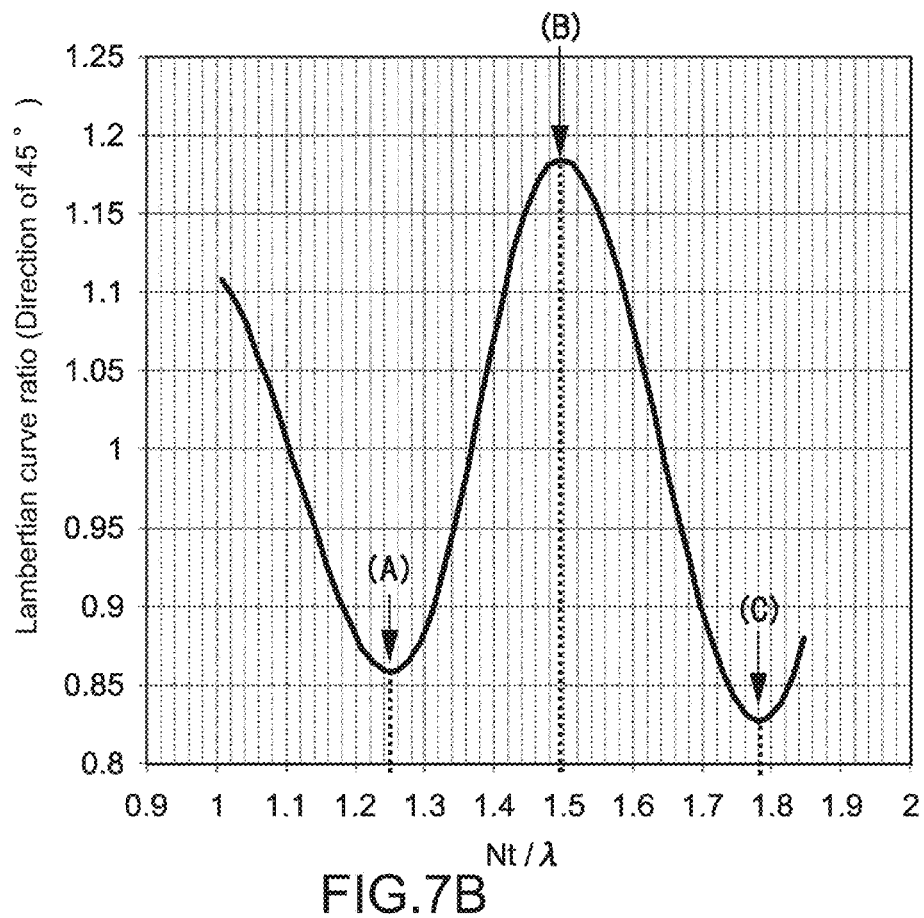

FIG. 7A is a schematic cross-sectional view of the light-emitting layer 20 of the light-emitting element 1, and FIG. 7B is a diagram showing a correlation between the inorganic film

40 (a refractive index N and a thickness t (nm) thereof) and the distribution of light directivity. To be more specific, the horizontal axis indicates a value of Nt/λ when the emitted light has a wavelength of λ (nm), and the vertical axis indicates the ratio of an actual radiation intensity to a radiation intensity when the FFP of the emitted light is Lambertian with the radiation angle θ of 45°. Hereinafter, such a ratio is referred to as Lambertian curve ratio.

In FIG. 7B, the distribution of the Lambertian curve ratio shows a value change in the cycle of about Nt/λ=½ due to the influence of light interference. More specifically, when Nt/λ is about 1.5, i.e., 6/4 (indicated by B), the curve is in the upward convex shape with the maximum value at the top, when Nt/λ is about 1.25, i.e., 5/4 (indicated by A), the curve is in the downward convex shape, and when Nt/λ is about 1.79, i.e., 7/4+0.05 (indicated by C), the curve is in the downward convex shape with the minimum value at the bottom.

Figure 8B:
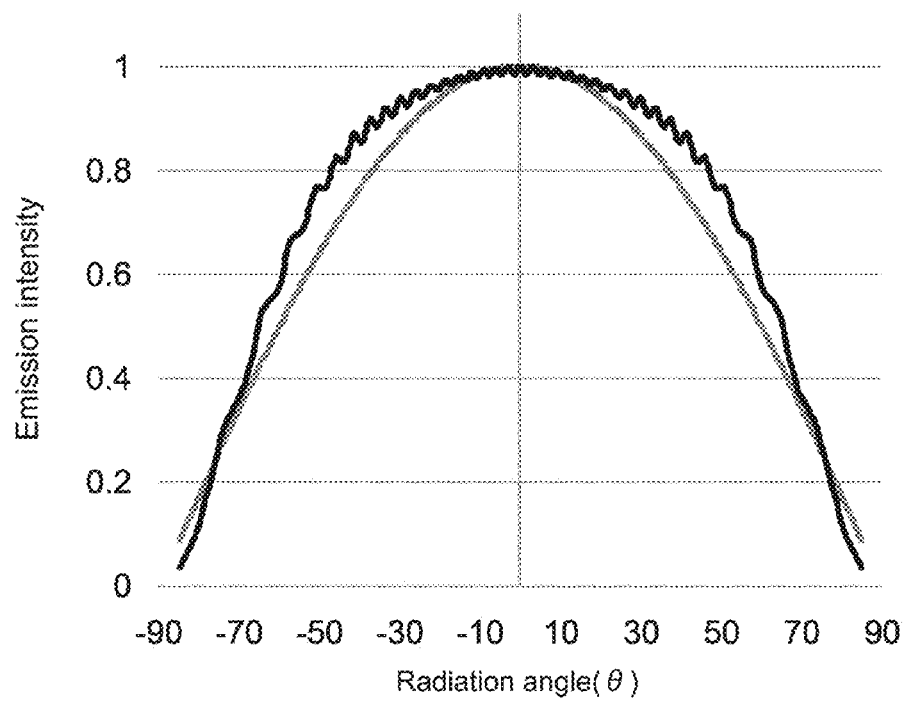
FIGS. 8A and 8B are each a graph exemplarily showing an FFP with respect to the radiation angle θ.
Figure 8A:
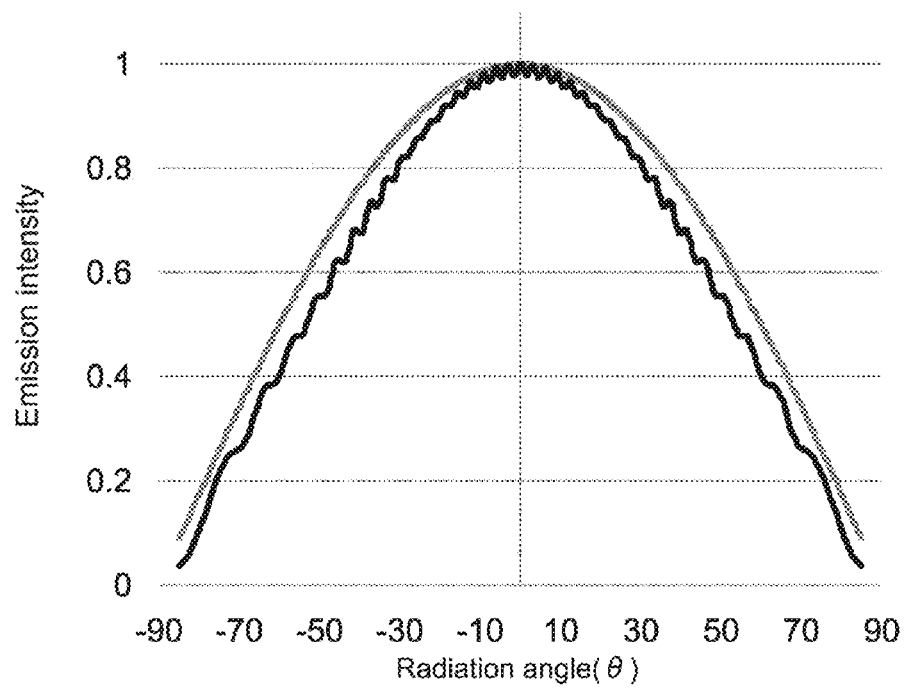

FIGS. 8A and 8B are each a graph showing an FFP with respect to the radiation angle θ. More specifically, FIG. 8A exemplarily shows the case of B with the maximum value in the graph of FIG. 7B, and FIG. 8B exemplarily shows the case of C with the minimum value in the graph of FIG. 7B together with the case of A. For reference, FIGS. 8A and 8B each show an FFP being Lambertian by a grayish line.

As shown in FIG. 8A, in the case of B, the radiation intensity is higher than that in the Lambertian FFP in a range from −70<θ<70, and the light-emission intensity toward the front of the light-emitting element 1 is relatively reduced. As shown in FIG. 8B, on the other hand, in the cases of A and B, the radiation intensity is generally lower than that in the Lambertian FFP, and the light-emission intensity toward the front of the light-emitting element 1 is relatively enhanced.

Therefore, for increasing the light-emission intensity toward the front of the light-emitting element 1, the value of Nt/λ in the inorganic film 40 may be adjusted to be A or C in the downward-convex curve as in the graph of FIG. 7B, for example. That is, considering the value of Nt/λ and the cycle of change thereof at A and C, the factors may be adjusted to satisfy Equation 1 below, i.e., the factors of N (refractive index of the inorganic film 40), t (thickness of the inorganic film 40), and λ (wavelength of emitted light from the light-emitting layer 20).

$$Nt/\lambda = (x+1)/4 \pm 0.15 \ (x=2, 4, 6, \text{ and } 8) \quad 1$$

In this embodiment, λ may be adjusted to be about 630 (nm), for example. When the inorganic film 40 is made of SiN, the refractive index thereof takes a value of 2.0≤N≤2.1, for example. Accordingly, when N=2.0, the thickness t of the inorganic film 40 may be adjusted to be 141.75 (nm) when x=2, to be 393.75 (nm) when x=4, to be 552.25 (nm) when x=6, and to be 708.75 (nm) when x=8. Such a thickness adjustment may improve the light-emission intensity toward the front of the light-emitting element 1.

With Equation 1 as above, by selecting the material for the inorganic film 40 and by adjusting the thickness thereof based on the wavelength of light from the light-emitting layer 20, the emitted light from the light-emitting layer 20 may be improved in light-emission intensity toward the front of the light-emitting element 1 due to constructive interference of light with a predetermined wavelength. As an example, Equation 1 may be satisfied with the inorganic film 40 in the layer structure of SiN or SiN and $SiO_2$ with 1.9≤N≤2.3, more desirably 2.0≤N≤2.1, and with the inorganic film 40 having the thickness of 200≤t≤600, more desirably 300≤t≤500. With such adjustments, the productivity of the inorganic film 40 is maintained, and the light-emitting element 1 is improved in directivity.

Described next is a manufacturing method for the light-emitting-element wafer 100 in this embodiment.
[Manufacturing Method for Light-Emitting-Element Wafer]

Figure 9:
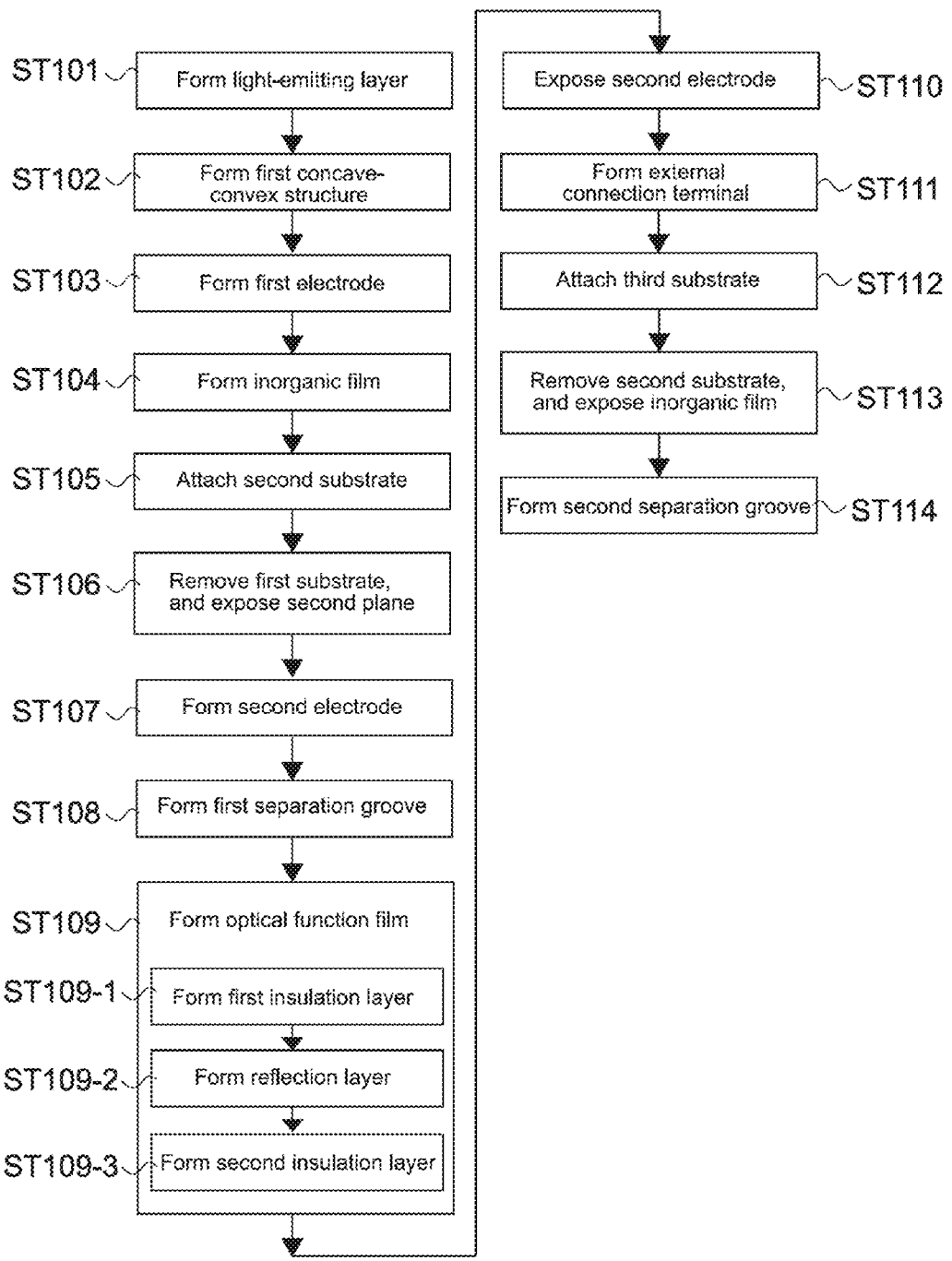
FIG. 9 is a flowchart of a manufacturing method for the light-emitting-element wafer of FIG. 1.

FIG. 9 is a flowchart of a manufacturing method for the light-emitting-element wafer 100 in this embodiment, and FIGS. 10A to 15B are each a schematic cross-sectional view of the light-emitting-element wafer for illustrating the manufacturing method therefor. In the below, a description is given by referring to these drawings.

First of all, a light-emitting layer 20a is formed on a first substrate 10a (ST101). In this example, on the first substrate 10a, layers in the light-emitting layer 20a are each formed by crystal growth using Metal Organic Chemical Vapor Deposition (MOCVD). The first substrate 10a is a wafer made of gallium arsenide (GaAs), and the crystal surface thereof formed with the light-emitting layer 20a is C-plane (0001), for example.

As described above, on the first substrate 10a, a plurality of element regions 1a are defined along the X- and Y-axis directions to correspond to the elements 1. The element regions 1a are typically defined by virtual boundaries L.

The layers formed in order on the first substrate 10a by crystal growth include a stop layer 214a of a first conductive type, a first contact layer 211a, and a first cladding layer 212a. The stop layer 214a functions as an etching stop layer when the first substrate 10a is removed, and may be made of a material that ensures a predetermined etching selection ratio or more with the first substrate 10a. Among the above layers, because the stop layer 214a is removed in the later process together with the first substrate 10a, the first contact layer 211a and the first cladding layer 212a are included in the first semiconductor layer 21 of the light-emitting element 1.

Thereafter, a multiquantum well layer 23a is formed. This multiquantum well layer 23a includes 10 to 20 well layers and 9 to 20 barrier layers that are alternately disposed, for example. The resulting multiquantum well layer 23a configures the active layer 23 of the light-emitting element 1.

On the multiquantum well layer 23a, layers are formed in order by crystal growth, i.e., a second cladding layer 221a of a second conductive type, and a second contact layer. The second contact layer is not shown in FIGS. 10A to 15B. The second cladding layer 221a and the second contact layer are included in the second semiconductor layer 22 of the light-emitting element 1.

Note that the light-emitting layer 20a is not restricted to the above structure, and may be changed as appropriate.

Figure 10A:
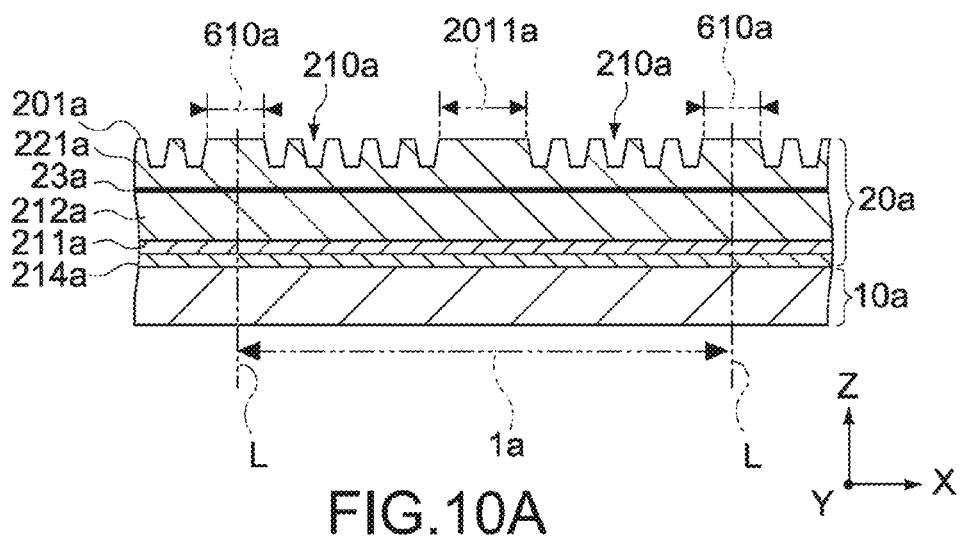
FIGS. 10A to 10C are each a schematic cross-sectional view of the light-emitting-element wafer of FIG. 1, showing the manufacturing method therefor.

Next, as shown in FIG. 10A, a first plane 201a is formed with a first concave-convex structure 210a (ST102). The first concave-convex structure 210a is formed by photolithography, reactive ion etching (RIE), or others. In this process, the first concave-convex structure 210a may not be formed by using a mask or others (not shown) to cover a connection region 2011a at the center of the element region 1a, and a boundary region 610a between the element regions 1a. In the resulting structure, this may make flat both the connection region 2011a where the first electrode 710a is formed in the next process, and the boundary region 610a where the first end portion 41 and the separation groove section 60 are formed later.

As described above, the first concave-convex structure 210a of the light-emitting layer 20a is formed immediately after the crystal growth of the light-emitting layer 20a. This obtains the first concave-convex structure 210a in a desired shape with good accuracy, thereby being able to improve the emission intensity and control the directivity of light.

Figure 10B:
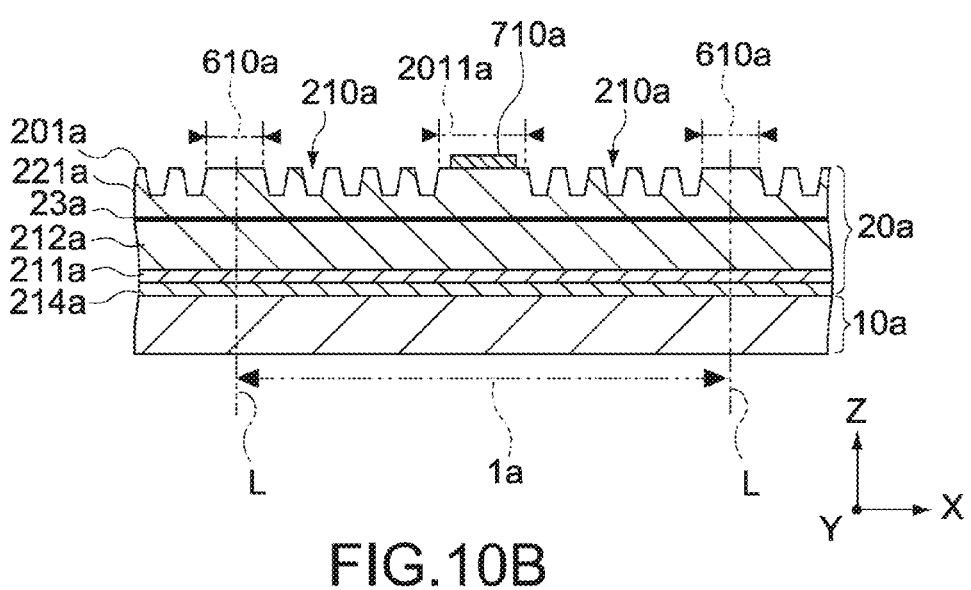

Next, as shown in FIG. 10B, the connection region 2011a of the first plane 201a is formed with the first electrode 710a

(ST103). The first electrode 710a is arbitrarily formed by sputtering, vapor deposition, ion plating, plating, or others, and is patterned in a predetermined shape such as oval, for example. This first electrode 710a is formed at least one to each of the element regions 1a.

Figure 10C:
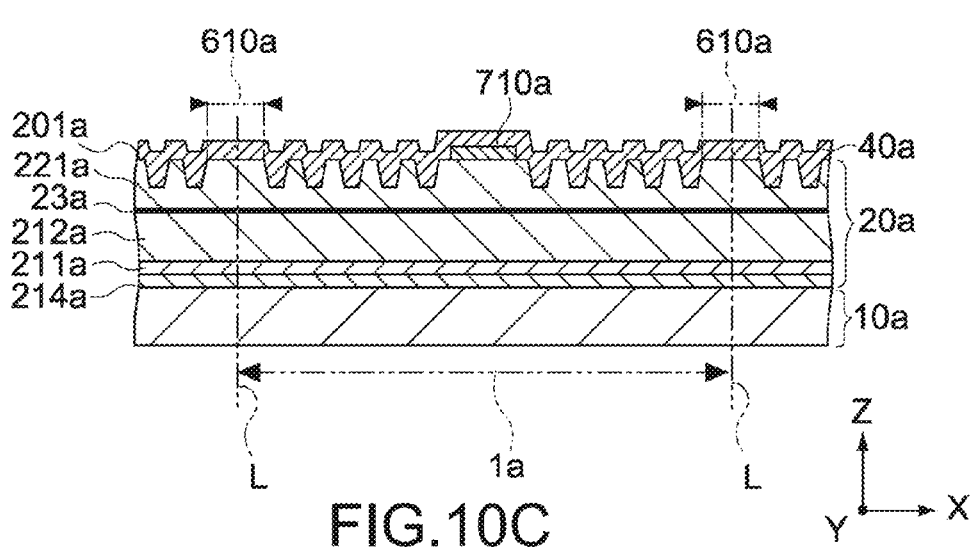

As shown in FIG. 10C, the first plane 201a including the first electrode 710a is formed thereon with an inorganic film 40a (ST104). The inorganic film 40a is made of SiN, $TiO_2$, $SiO_2$, SiON (silicon oxynitride), NiO (nickel oxide), or AlO (aluminum oxide), or a laminate film thereof.

The inorganic film 40a is substantially uniform in thickness to conform to the first plane 201a. That is, in this process, the second concave-convex structure 410a is formed by conforming to the first concave-convex structure 210a.

Figure 11A:
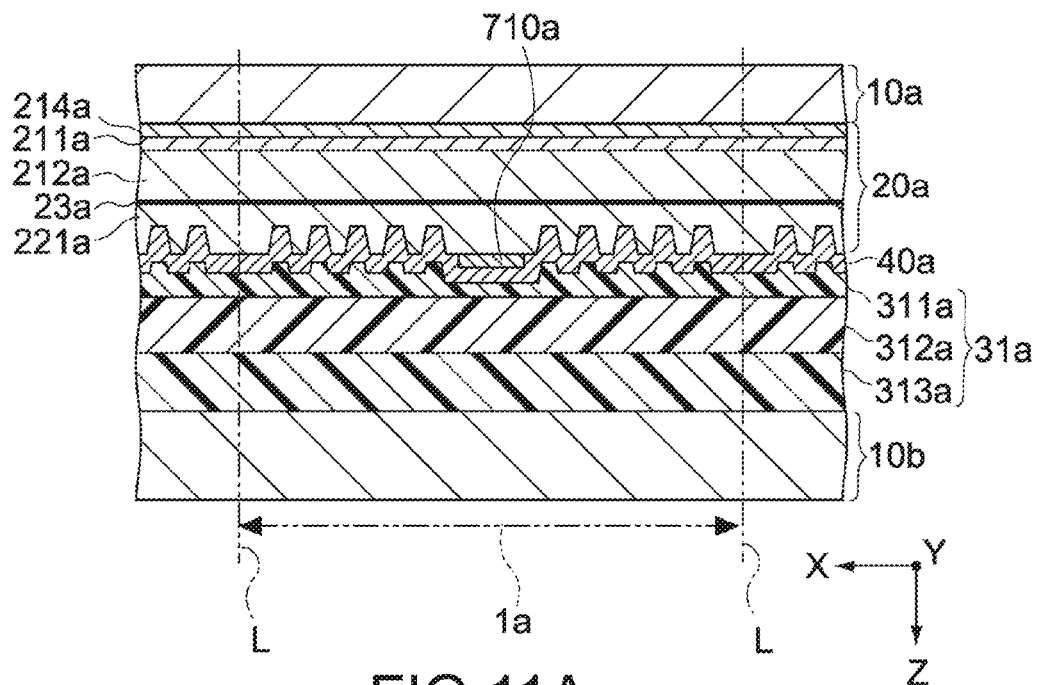
FIGS. 11A and 11B are each a schematic cross-sectional view of the light-emitting-element wafer, showing the manufacturing method therefor.

Next, a second substrate 10b is attached onto the inorganic film 40a to be freely separated therefrom via a temporary attachment layer 31a (ST105). In this embodiment, the temporary attachment layer 31a is in the layer structure including a first resin film 311a, a bonding layer 312a, and a second resin film 313a. FIG. 11A shows the inverted (upside-down) structure of FIG. 10C in which the first substrate 10a is in the upper portion of the drawing.

First of all, as shown in FIG. 11A, the first resin film 311a is formed by coating or others on the inorganic film 40a. Next, the bonding layer 312a is affixed on the first resin film 311a. The bonding layer 312a is a resin-made adhesive sheet or made of an adhesive material, for example. The second resin film 313a is formed on the bonding layer 312a by coating, for example.

The first and second resin films 311a and 313a are each made of a thermoplastic resin material or others that are adhesive such as polyimide. In a process of removing the second substrate 10b that will be described later, such materials may cause ablation when they are heated and evaporated by irradiation of laser light with a predetermined wavelength, and by the action of ablation, the first and second resin films 311a and 313a may easily lose their adhesion properties. Such a thermoplastic resin material is not the only option, and any material may be used as long as it absorbs laser light with a predetermined wavelength, and causes ablation.

On the second resin film 313a of the temporary attachment layer 31a, the second substrate 10b is affixed as shown in FIG. 11A. The second substrate 10b is a disk-shaped semiconductor wafer made of sapphire ($Al_2O_3$), for example.

The temporary attachment layer 31a is not restricted to the above structure, and may include only the first resin film 311a and the bonding layer 312a, for example. Alternatively in the above process, the temporary attachment layer 31a may be entirely or partially formed in advance on the second substrate 10b for attaching together the inorganic film 40a and the second substrate 10b.

Figure 11B:
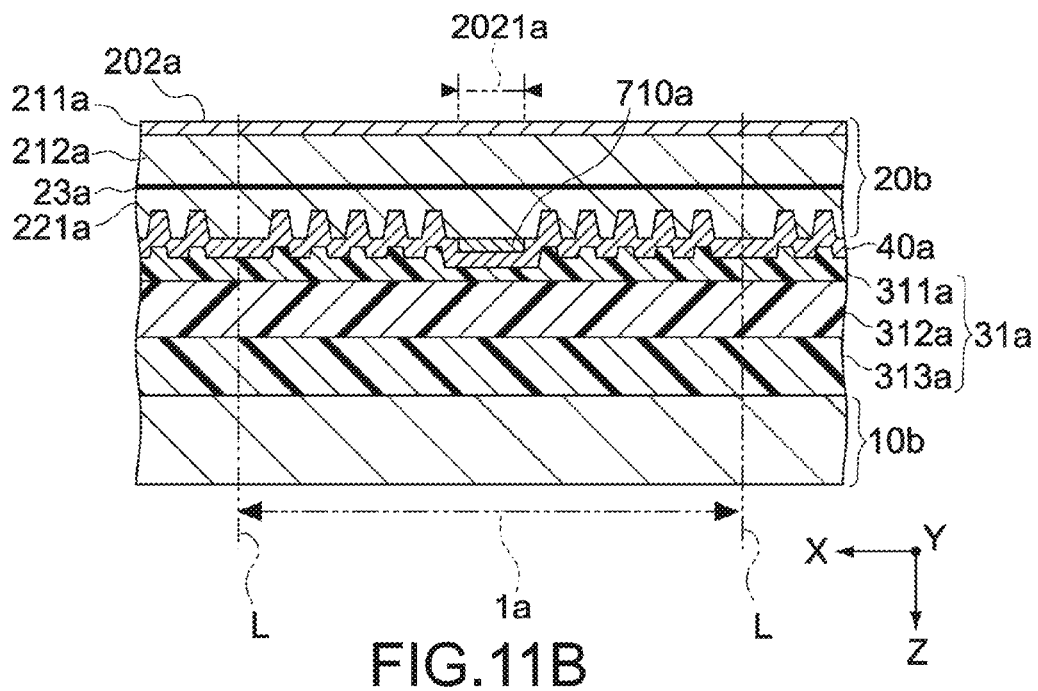

Next, as shown in FIG. 11B, the first substrate 10a is removed to expose a second plane 202a of the light-emitting layer 20a on the opposite side of the first plane 201a (ST106). In this process, the first substrate 10a is removed first by wet etching, for example. At this time, used is an etchant showing a high etching selection ratio between the stop layer 214a and the first substrate 10a. This thus controls the progress of the above-mentioned wet etching in the stop layer 214a so that the first substrate 10a is removed without fail. The stop layer 214a is then removed by dry etching, for example. As a result, the first contact layer 211a is exposed on the light-emitting layer 20a.

In this process, the second plane 202a is the surface of the first contact layer 211a. The layer structure from the first contact layer 211a to the second cladding layer 221a (the second contact layer) is referred to as light-emitting layer 20b.

Figure 12A:
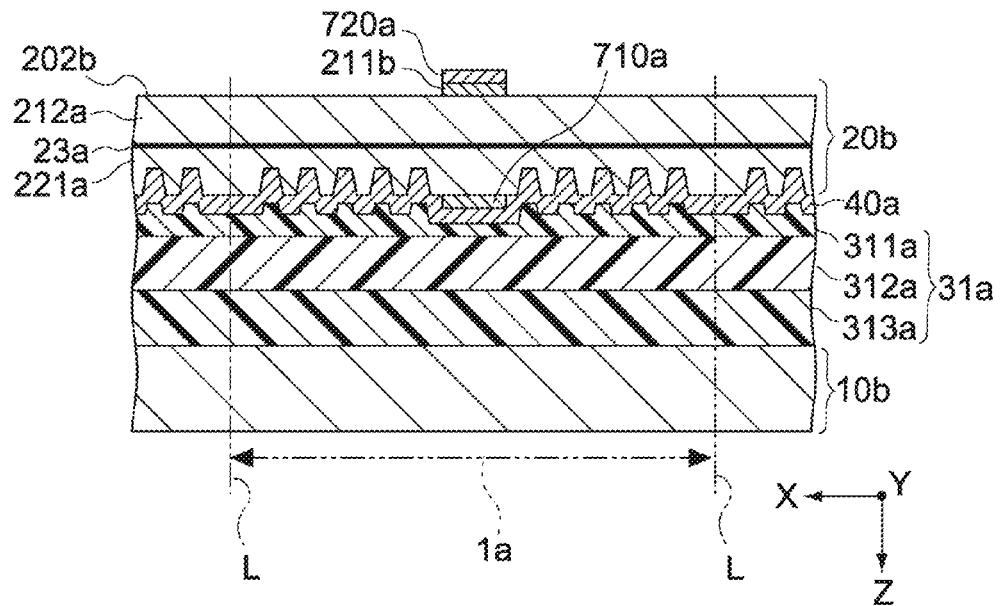
FIGS. 12A and 12B are each a schematic cross-sectional view of the light-emitting-element wafer, showing the manufacturing method therefor.

Next, as shown in FIG. 12A, the second plane 202a is formed thereon with a second electrode 720a (ST107). This second electrode 720a is patterned in the circular shape with the diameter of about 1 to 20 μm, for example. The second electrode 720a is formed at least one to each of the element regions 1a.

Also in this embodiment, the second electrode 720a is used as a mask to etch the first contact layer 211a. This removes the first contact layer 211a except for the region directly below the second electrode 720a as shown in FIG. 12A. The first contact layer after the patterning is denoted as first contact layer 211b. Moreover, after this process, the second plane is the surface of the second electrode 720a and that of the second cladding layer 212a, and is denoted as second plane 202b.

Figure 12B:
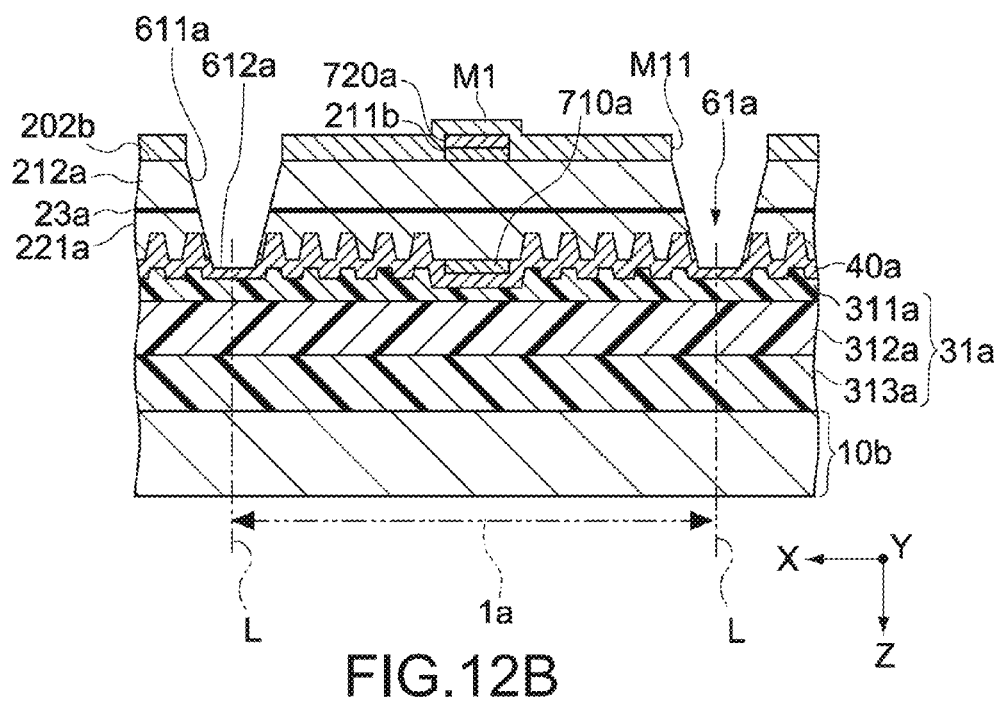

Next, as shown in FIG. 12B, the inorganic film 40a is used as an etching stop layer to etch the light-emitting layer 20a from the second plane 202b, thereby forming a first separation groove 61a (ST108). By this first separation groove 61a, the light-emitting layer 20a is separated for each of the elements (element regions) 1a. In this process, the light-emitting layer 20a is etched by dry etching, for example.

First of all, a mask layer M1 is formed to each of the element regions 1a on the second plane 202b. This mask layer M1 is patterned for each of the element regions 1a to conform to the shape of the second plane 202 after the formation of the elements 1. That is, the mask layer M1 includes an aperture M11, which is formed along the boundary between the element regions 1a. The mask layer M1 may be made of a material with a low etching rate in the etchant used in this process, and may be $SiO_2$, SiN, Ti, Ni, Cr (chromium), Al, or others.

Next, the first separation groove 61a is formed along the boundary between the element regions 1a by dry etching via the aperture M11 of the mask layer M1. At this time, used is an etching gas (etchant) showing a high etching selection ratio between a semiconductor material of AlGaInP, GaAs, or GaP used to form the light-emitting layer 20a, and a material of SiN, or $SiO_2$ used to form the inorganic film 40a, for example. Such an etchant is exemplified by $SiCl_4$ (silicon tetrahalide). With such an etchant, even if an etching rate is not uniform in the plane of the first substrate 10a, the first separation groove 61a may have a uniform depth in the plane by the inorganic film 40a serving as an etching stop layer. In the below, an etching gas for use with dry etching is also referred to as etchant.

Also in this process (ST108), the cross-sectional area of the light-emitting layer 20a for each of the element 1a may be gradually increased from the second plane 202b toward the first plane 201a. That is, in the first separation groove 61a, the cross-sectional area of a bottom plane 612a is smaller than that of the aperture portion on the side of the second plane 202b. Such a first separation groove 61a may be formed as appropriate under conditions for taper etching. The specific conditions for etching are dependent on the wafer size, the structure of an etching apparatus, or others, e.g., the antenna power of 100 to 1000 W, the bias power of 10 to 100 W, the processing pressure of 0.25 to 1 Pa, and the substrate temperature of 100 to 200° C. Herein, the expression of "cross-sectional area" denotes the area of a cross-section in the direction orthogonal to the Z-axis direction. After the first separation groove 61a is formed as above, the mask layer M1 is removed by etching, for example.

In this process (ST108), the first separation groove 61a is formed with a wall plane 611a being tapered, and the bottom plane 612a. From the wall plane 611a, the end planes of the layers in the light-emitting layer 20b are exposed except for the first contact layer 211b, and from the bottom plane 612a, the inorganic film 40a is exposed. The wall plane 611a corresponds to the circumferential plane 203 of the light-emitting element 1.

Figure 13A:
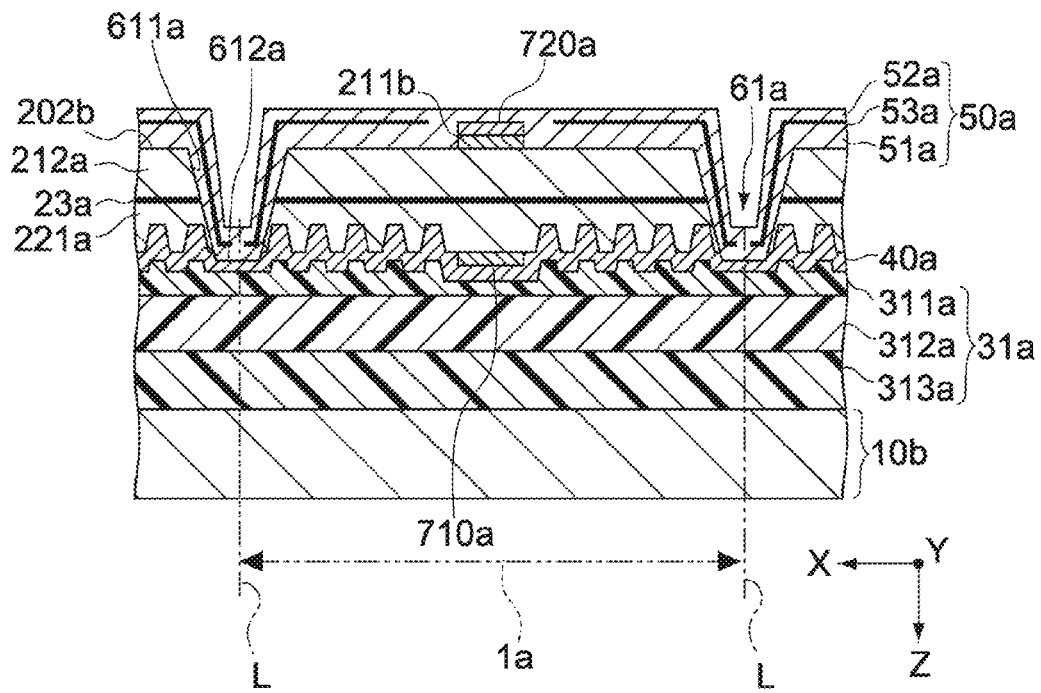
FIGS. 13A and 13B are each a schematic cross-sectional view of the light-emitting-element wafer, showing the manufacturing method therefor.

Next, as shown in FIG. 13A, an optical function film 50a is formed to cover the wall plane 611a and the bottom plane 612a of the first separation groove 61a, and the second plane 202b (ST109). As described above, the optical function film 50a is in the layer structure including a first insulation layer 51a, a reflection layer 53a, and a second insulation layer 52a. These layers are formed in order.

FIGS. 16A to 17B are each a schematic cross-sectional view for illustrating this process (ST109). FIGS. 16A to 17B do not show the first and second concave-convex structures 210a and 410a, the layers in the temporary attachment layer 31a, and the second substrate 10b.

Figure 16A:
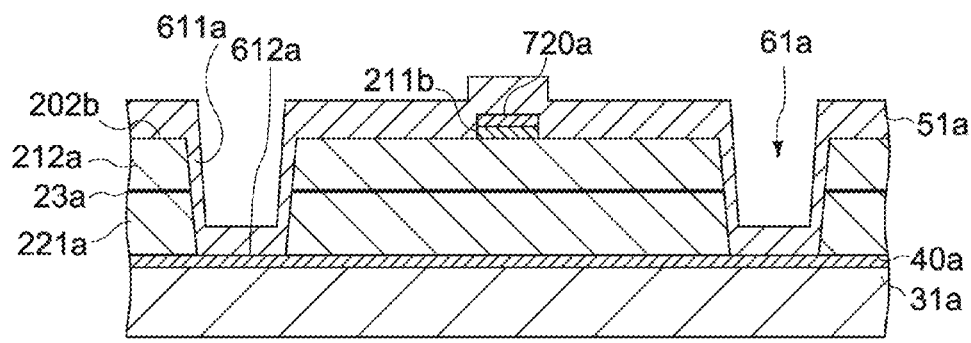
FIGS. 16A and 16B are each a schematic cross-sectional view of the light-emitting-element wafer, illustrating a process of forming an optical function film in the manufacturing method therefor.

First of all, as shown in FIG. 16A, the first insulation layer 51a is formed on the wall and bottom planes 611a and 612a in the first separation groove 61a, and on the second plane 202b (ST109-1). For forming the first insulation layer 51a, used in this process is CVD (Chemical Vapor Deposition) or sputtering, for example. The first insulation layer 51a may be also in the layer structure.

Figure 16B:
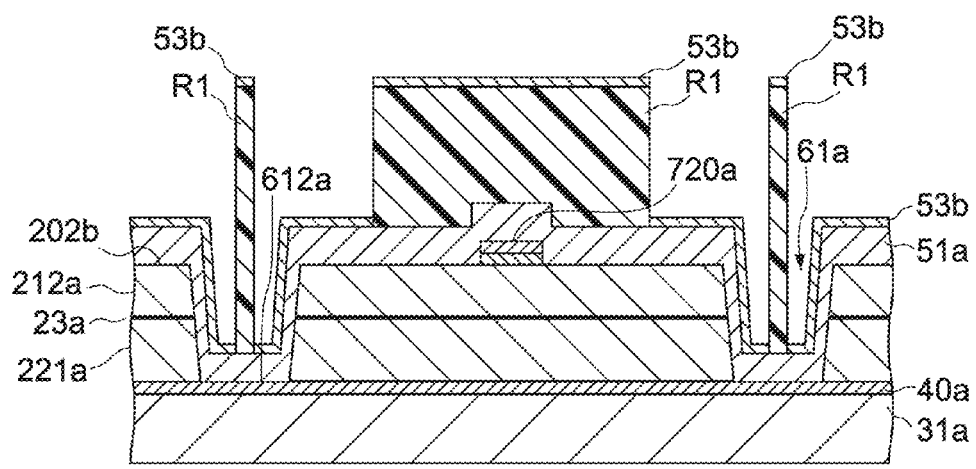

Next, the first insulation layer 51a is formed thereon with the reflection layer 53a (ST109-2). For pattering the reflection layer 53a in this process, lifting-off is applicable, for example. That is, as shown in FIG. 16B, a resist R1 is formed on a region where the reflection layer 53a is not expected to be formed. The resist R1 may be a positive resist, or a negative resist. Using a positive resist may prevent halation during exposure to light. The region where the resist R1 is formed includes, specifically, the region including the second electrode 720a when it is viewed from the Z-axis direction, and the region substantially at the center on the bottom plane 612a. These regions respectively correspond to the aperture portion 534 of the reflection layer 53 and the separation groove portion 60 when the element 1 is completed.

To be specific, a metallic layer 53b made of a metal or others is formed entirely over the first insulation layer 51a including the resist R1 as appropriate by sputtering, vapor deposition, ion plating, or plating, for example. As an example, this metallic layer 53b is as appropriate in the layer structure including Al and Au, for example. With such a metallic layer 53b, light with a wavelength of about 500 to 700 nm may be reflected with high reflectivity. Moreover, using sputtering may improve the adhesion between the metallic layer 53b and the first insulation layer 51a.

The resist R1 with the metallic layer 53b is then removed. As shown in FIG. 17A, this obtains the reflection layer 53a including first and second aperture portions 531a and 532a, which correspond to the aperture portion 534.

Thereafter, as shown in FIG. 17B, the reflection layer 53a is formed thereon with the second insulation layer 52a (ST109-3). In this process, the reflection layer 53a and the first insulation layer 51a are entirely covered thereon by the second insulation layer 52a. Similarly to the first insulation layer 51a, the second insulation layer 52a may be formed as appropriate by CVD, sputtering, or coating, for example.

In the above-mentioned manner, the optical function film 50a is formed entirely on the inner surface of the second plane 202b and that of the first separation groove 61a.

Figure 13B:
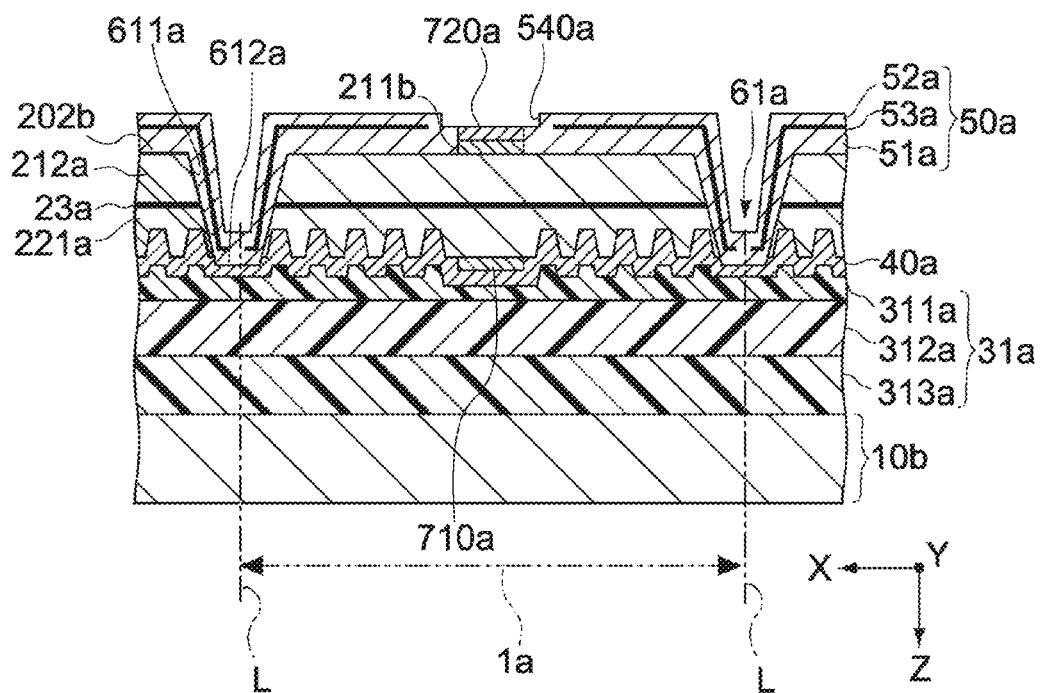

In the next process, as shown in FIG. 13B, the optical function film 50a is partially removed to expose the second electrode 720a (ST110). This forms a connection hole 540a to the first and second insulation layers 51a and 52a of the optical function film 50a. This process is first performed by etching or others via a resist (not shown), which is patterned in the shape conforming to the second electrode 720a.

Figure 14A:
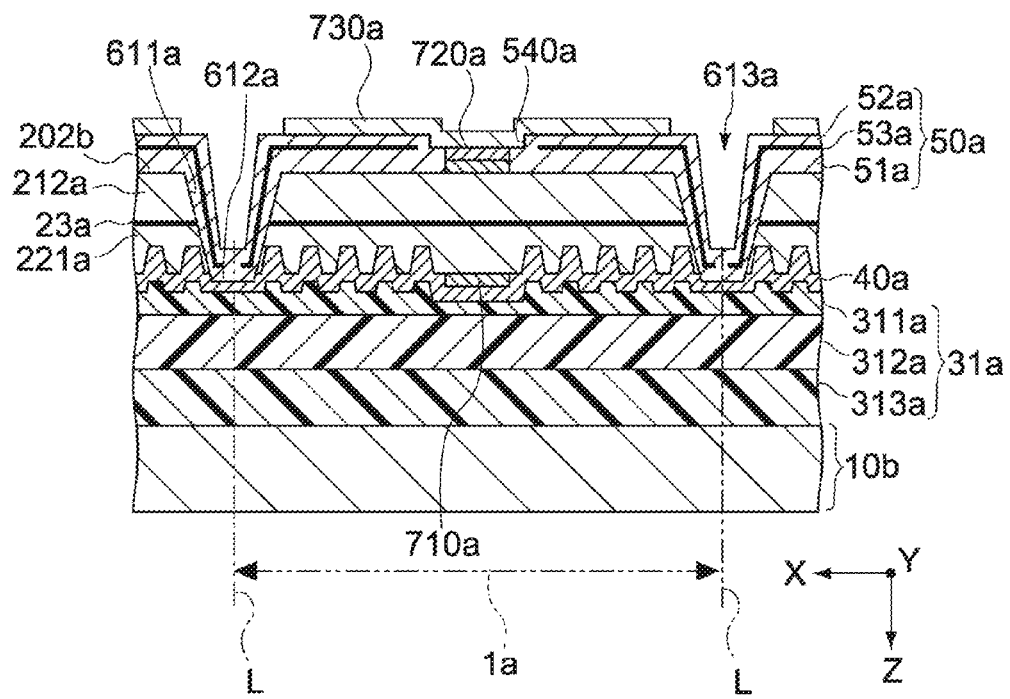
FIGS. 14A and 14B are each a schematic cross-sectional view of the light-emitting-element wafer, showing the manufacturing method therefor.

Thereafter, as shown in FIG. 14A, the second plane 202b is formed thereon with an external connection terminal 730a for electrical connection with each of the second electrodes 720a (ST111). Alternatively, to form this external connection terminal 730a in this process, a metallic film may be formed on the second plane 202b by sputtering, vapor deposition, ion plating, plating, or others as appropriate, and the metallic film may be patterned in a predetermined shape by wet etching, dry etching, or others. Still alternatively, to form the external connection terminal 730a, by lifting-off, a metallic film may be formed after a resist is formed in a predetermined pattern. As such, the external connection terminal 730a is formed on the second electrode 720a in the connection hole 540a, and on the optical function film 50a on the second plane 202b.

This also forms a space between the adjacent external connection terminals 730a on the first groove portion 61a. In the below, the first groove portion 61a including the space is referred to as groove portion 613a.

Next, on the external connection terminal 730a, a third substrate 10c is attached via the attachment layer 30a to be freely separated therefrom (ST112).

Figure 14B:
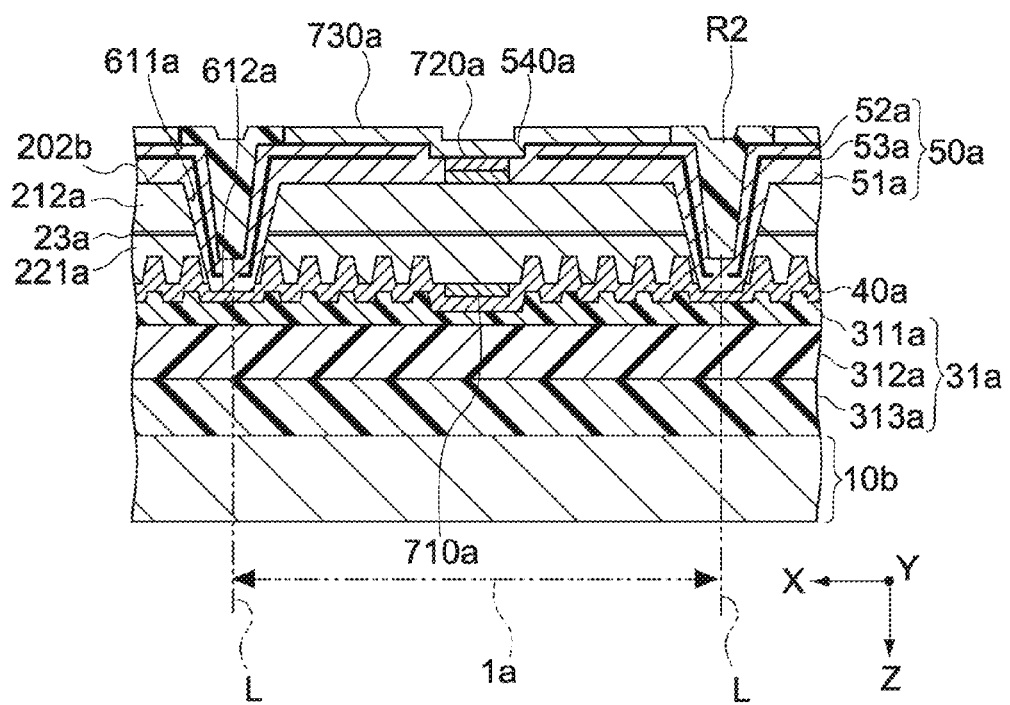

As shown in FIG. 14B, first of all in this process, the groove portion 613a is filled with a resin R2. This accordingly prevents formation of a void resulted from the groove portion 613a when the third substrate 10c is attached. The manner of filling the resin R2 is not particularly restrictive, and may be coating, spin coating, spraying, dipping, or others as appropriate. The resin R2 may be filled to be substantially level with the surface of the external connection terminal 730a by etching-back after coating. The material of the resin R2 is not particularly restrictive.

Figure 15A:
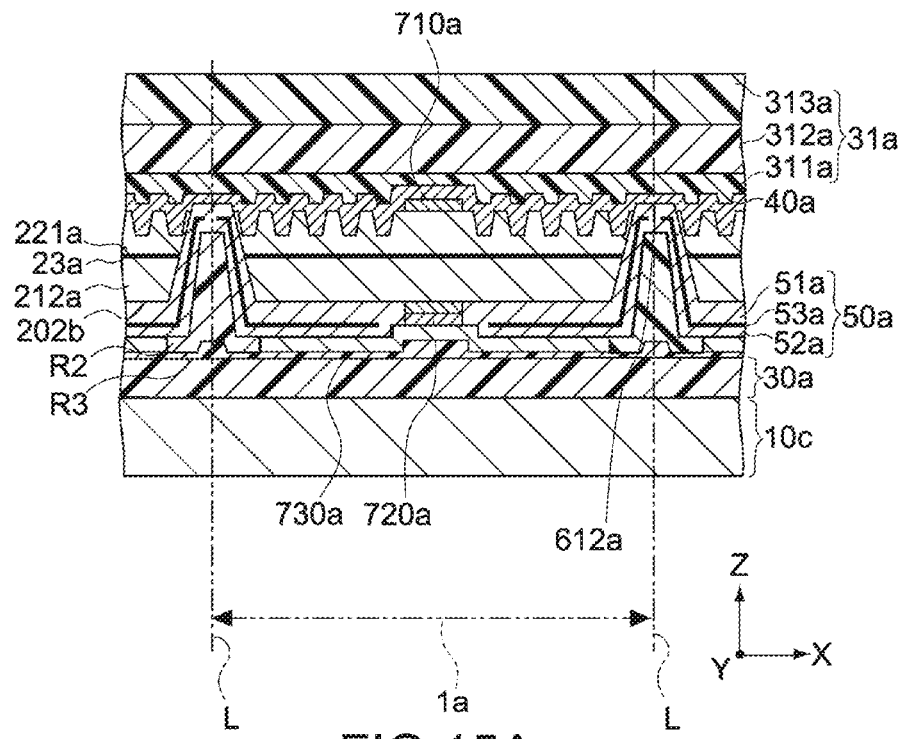
FIGS. 15A and 15B are each a schematic cross-sectional view of the light-emitting-element wafer, showing the manufacturing method therefor.

Next, as exemplarily shown in FIG. 15A, an adhesive resin R3 is formed on the resin R2 and the external connection terminal 730a. This accordingly improves the adhesion between the attachment layer 30a and the external connection terminal 730a. This resin R3 corresponds to the resin film 732 described above. The manner of forming the resin R3 is not particularly restrictive, and may be coating, spin coating, spraying, dipping, or others as appropriate. FIG. 15A shows the inverted (upside-down) structure of FIG. 14B.

Thereafter, on the external connection terminal 730a and the resin R3, the third substrate 10c including the attachment layer 30a is attached. The third substrate 10c corresponds to the above-mentioned support substrate 10, and is a disk-shaped semiconductor wafer made of sapphire, for example.

The attachment layer 30a may be formed on the third substrate 10c by coating, spin coating, spraying, dipping, or others as appropriate. The attachment layer 30a may be made of a thermoplastic resin material or others that are adhesive such as polyimide, i.e., a material absorbing laser light with a predetermined wavelength, and causing ablation similarly to the material used for the second resin film 313a.

The manner of attaching the third substrate 10c is not restricted to the above. Alternatively, at least either the resin R2 or R3 may not be formed. Still alternatively, the attachment layer 30a may not be always formed on the third substrate 10c, and may be formed on the external connection terminal 730a (resins R2 and R3).

Figure 15B:
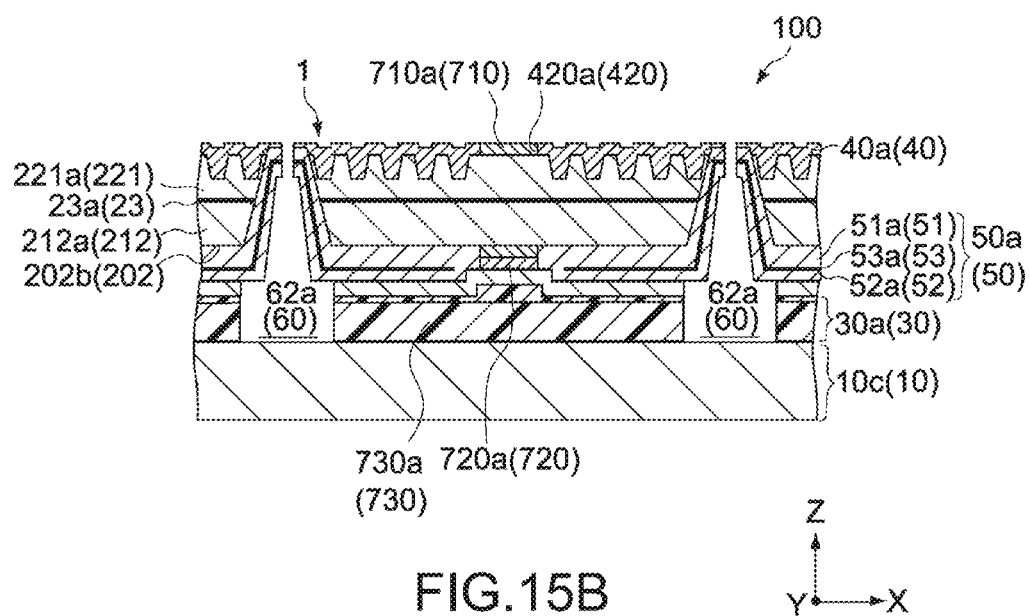

Next, by referring to FIGS. 15A and 15B, the second substrate 10b is removed to expose the inorganic film 40a (ST113). The second substrate 10b is removed by the action of ablation, which occurs when the second resin film 313a is heated and evaporated by irradiation of laser light with a predetermined wavelength onto the second substrate 10b, for example. The second substrate 10b is thus peeled off from the interface with the second resin film 313a as shown in FIG. 15A. With such a technique of laser ablation, the second substrate 10b is easily removed.

Thereafter, other films and layers are removed by wet etching, dry etching, or others, i.e., the second resin film 313a, the bonding layer 312a, and the first resin film 311a. As a result, the temporary attachment layer 31a is removed in its entirety so that the inorganic film 40a is exposed as shown in FIG. 15B.

After the inorganic film 40a is exposed as above, the inorganic film 40a on the first electrode 710a is removed, and a connection hole 420a is formed. To form the connection hole 420a, similarly to the connection hole 540a, this process is performed by dry etching or others via a resist (not shown), which is patterned in the shape conforming to the first electrode 710a.

Also in FIG. 15B, the inorganic film 40a remained on the bottom plane 612a of the first separation groove 61a is etched to form a second separation groove 62a (ST114). By this second separation groove 62a, the inorganic film 40a is separated for each of the elements 1a. In this process, the second separation groove 62a is formed by dry etching such as RIE (Reactive Ion Etching), wet etching, or others.

In this process, first of all, a mask (not shown in FIG. 15B) is formed on the inorganic film 40a for use to separate the elements 1. Using the mask formed as above, the inorganic film 40a is etched in the region opposing to the bottom plane 612a of the first separation groove 61a. Next, the region of the optical function film 50a formed to the bottom plane 612a is similarly etched. The resins R2 and R3 and the attachment layer 30 formed to the region opposing to the bottom surface 612a are also isotropically etched. This forms the second separation groove 62a with a depth reaching the third substrate 10c from the inorganic film 40a. This second separation groove 62a corresponds to the separation groove portion 60 in the light-emitting element 1. Note that such etching on the structure elements may be continuously performed under the same conditions or different conditions.

In this embodiment, the reflection layer 53a includes the second aperture portion 532a in the region opposite to the bottom plane 612a, i.e., the region of the optical function film 50a. Such a region includes only the first and second insulation layers 51a and 52a so that the above-mentioned region of the optical function film 50a is etched with ease. As to the resin R3 and the attachment layer 30a, by being etched using the external connection terminal 730a as a mask, only the resin R3 and the attachment layer 30a may be left untouched in the region opposite to the external connection terminal 730a.

By this process, the above-mentioned light-emitting-element wafer 100 is formed by the structure elements being separated for each of the elements 1, i.e., the attachment layer 30 on the third substrate 10c (the support substrate 10), the external connection terminal 730, the light-emitting layer 20 and the inorganic film 40 covered by the optical function film.

In the light-emitting element 1 in this embodiment, the first plane 201a of the light-emitting layer 20a is formed thereon with the inorganic film 40a, and the second plane 202b on the opposite side is provided thereon with the optical function film 50a, the external connection terminal 730a, and the attachment layer 30a. That is, with the layer structure in which the layers are stacked on the light-emitting layer 20a being the result of crystal growth to have the uniform in-plane thickness, the elements 1 in the plane of the wafer may be formed with the uniform thickness.

Further, in the process of forming the first separation groove 61a by dry etching or others, the first separation groove 61a is formed with the uniform depth in the plane because the inorganic film 40a serves as an etching stop layer. In other words, from the bottom plane 612a of the first separation groove 61a, the inorganic film 40a is exposed. This thus obtains the structure in which, after the element 1 is formed, the inorganic film 40 and the optical function film are connected together, and the second end portion 510 of the optical function film and the first end portion 41 of the inorganic film 40 are stacked one on the other. Such a structure thus leads to the light-emitting elements 1 being all uniform in shape, and among the elements 1 on the light-emitting-element wafer 100, their height difference from the surface 11 may remain 10% or less, for example.

Still further, because the light-emitting layer 20a is not expected to include the etching stop layer for forming the first separation groove 61a, the light-emitting layer 20a is formed with a wider choice of materials, and the manufacturing process is accordingly simplified.

Also by forming the first separation groove 61a by dry etching, even if the area of the wafer is increased, and even if the first separation groove 61a is small and narrow, the shape thereof is more uniform in the plane of the wafer.

In this embodiment, the reflection layer 53a is formed by lifting-off. This achieves easy micromachining even if the reflection layer 53a is made of a chemically-stable metal. This also controls the effect of side etching with a resist, and even if the size of the wafer is increased, the resulting reflection layer 53a remains uniform in shape in the plane of the wafer.

Figure 18A:
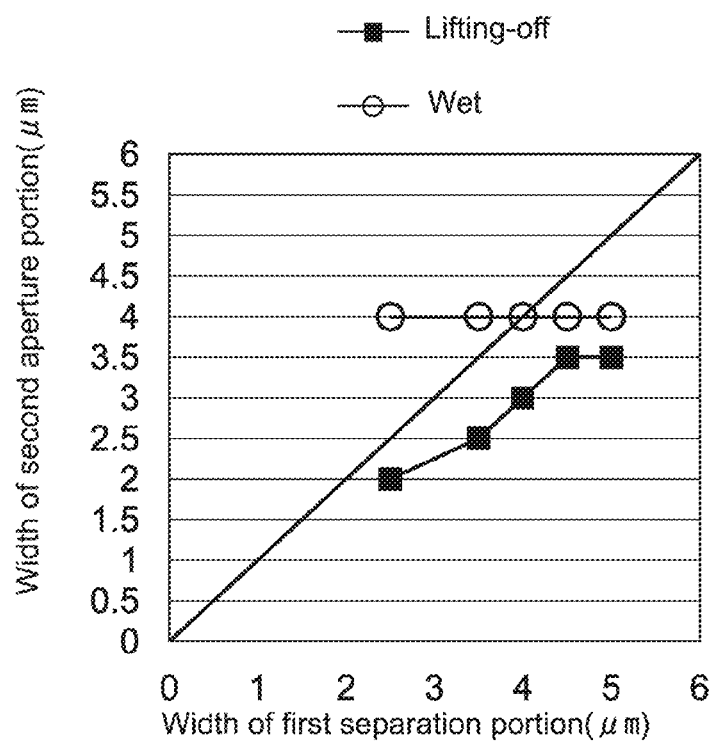
FIGS. 18A and 18B are graphs showing the results of a comparison between a reflection layer formed by lifting-off and a reflection layer formed by wet etching, and more specifically.

FIG. 18A is a graph showing the relationship between the width of the first separation groove 61a and the width of the second aperture portion 532a (refer to FIGS. 17A and 17B) formed to the reflection layer 53a between the elements 1a adjacent to each other. FIG. 18A shows a comparison between the cases of forming the reflection layer 53a by lifting-off and wet etching. Herein, the terms of "width" means the length of the first separation groove 61a or that of the second aperture portion 532a in the short-side direction.

Also in FIG. 18A, when the first separation groove 61a has a relatively large width, the width of the second aperture portion 532a does not differ largely depending on whether the reflection layer 53a is formed by lifting-off or wet etching. On the other hand, as the first separation groove 61a is reduced in width, the width of the second aperture portion 532a starts to differ largely depending on whether the reflection layer 53a is formed by lifting-off or wet etching. To be specific, with lifting-off, the width of the second aperture section 532a is reduced almost in proportion to the width of the first separation groove 61a.

With wet etching, the width of the second aperture portion 532a remains almost the same even if the width of the first separation groove 61a is reduced.

As such, forming the reflection layer 53a by lifting-off ensures the good accuracy for the width of the second aperture portion 532a even if the light-emitting-element wafer 100 is reduced in size in its entirety.

Also with lifting-off, the resulting reflection layer 53a may be uniform in shape in the plane of the light-emitting-element wafer 100 as will be described later.

Figure 18B:
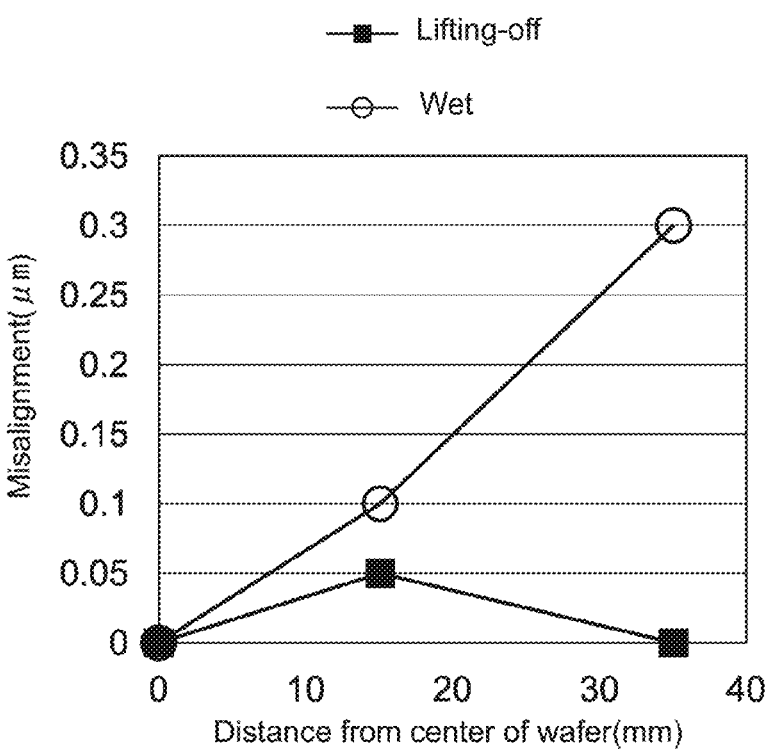

FIG. 18B is a graph showing a degree of misalignment of the reflection layer 53a with respect to the width of the first separation groove 61a in the plane of the light-emitting-element wafer 100. Similarly to FIG. 18A, FIG. 18B shows a comparison between the cases of forming the reflection layer 53a by lifting-off and wet etching. Herein, element separation masks for use in these cases are in the same shape.

As shown in FIG. 18B, with wet etching, the reflection layer 53a shows a high degree of misalignment with respect to the width of the first separation groove 61a as is away from the center of the light-emitting-element wafer 100. On the other hand, with lifting-off, the reflection layer 53a shows a low degree of misalignment with respect to the width of the first separation groove 61a irrespective of its position in the light-emitting-element wafer 100.

The result of FIG. 18B confirms that forming the reflection layer 53a by lifting-off leads to a low degree of misalignment thereof with respect to the width of the first separation groove 61a in the plane of the light-emitting-element wafer 100. Herein, the degree of misalignment means a degree of positional displacement of the reflection layer 53a because the width of the first separation groove 61a is formed in the same manner in these two cases by lifting-off and wet etching. That is, the reflection layer 53a formed by lifting-off is proved to be uniform in shape in the plane of the light-emitting-element wafer 100.

The light-emitting elements 1 on the light-emitting-element wafer 100 formed as above are mounted on a display apparatus (electronic apparatus) 80, for example.

FIG. 19 is a schematic plan view of the display apparatus 80. To be specific, the light-emitting element emitting red light (first semiconductor light-emitting element) 1 configures a light-emitting-element unit 81 together with a light-emitting element emitting blue light (second semiconductor light-emitting element) 2, and a light-emitting element emitting green light (third semiconductor light-emitting element) 3. Such a light-emitting-element unit 81 and others are mounted in an arrangement on a substrate 810 of the display apparatus 80 as a light-emitting-element module. Described next is a manufacturing method for the display apparatus 80 together with an exemplary structure thereof. Note that the elements 1, 2, and 3 of FIG. 19 do not show coating resins, wiring, and others.

[Manufacturing Method for Display Apparatus]

Figure 20:
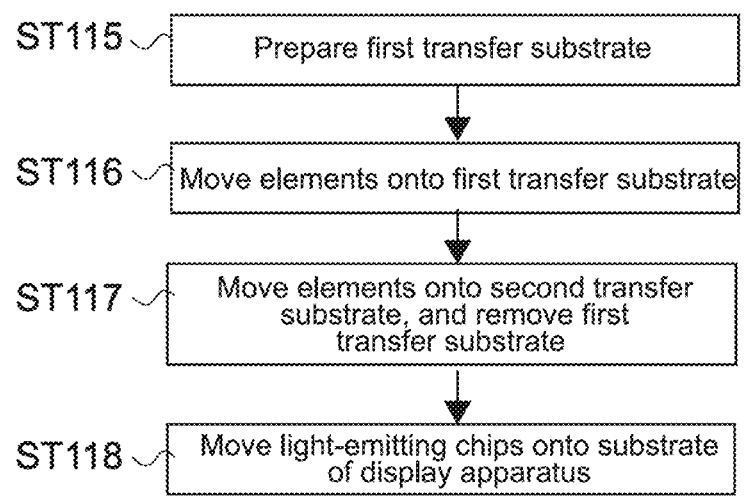
FIG. 20 is a flowchart of a manufacturing method for the display apparatus of FIG. 19.
Figure 21:
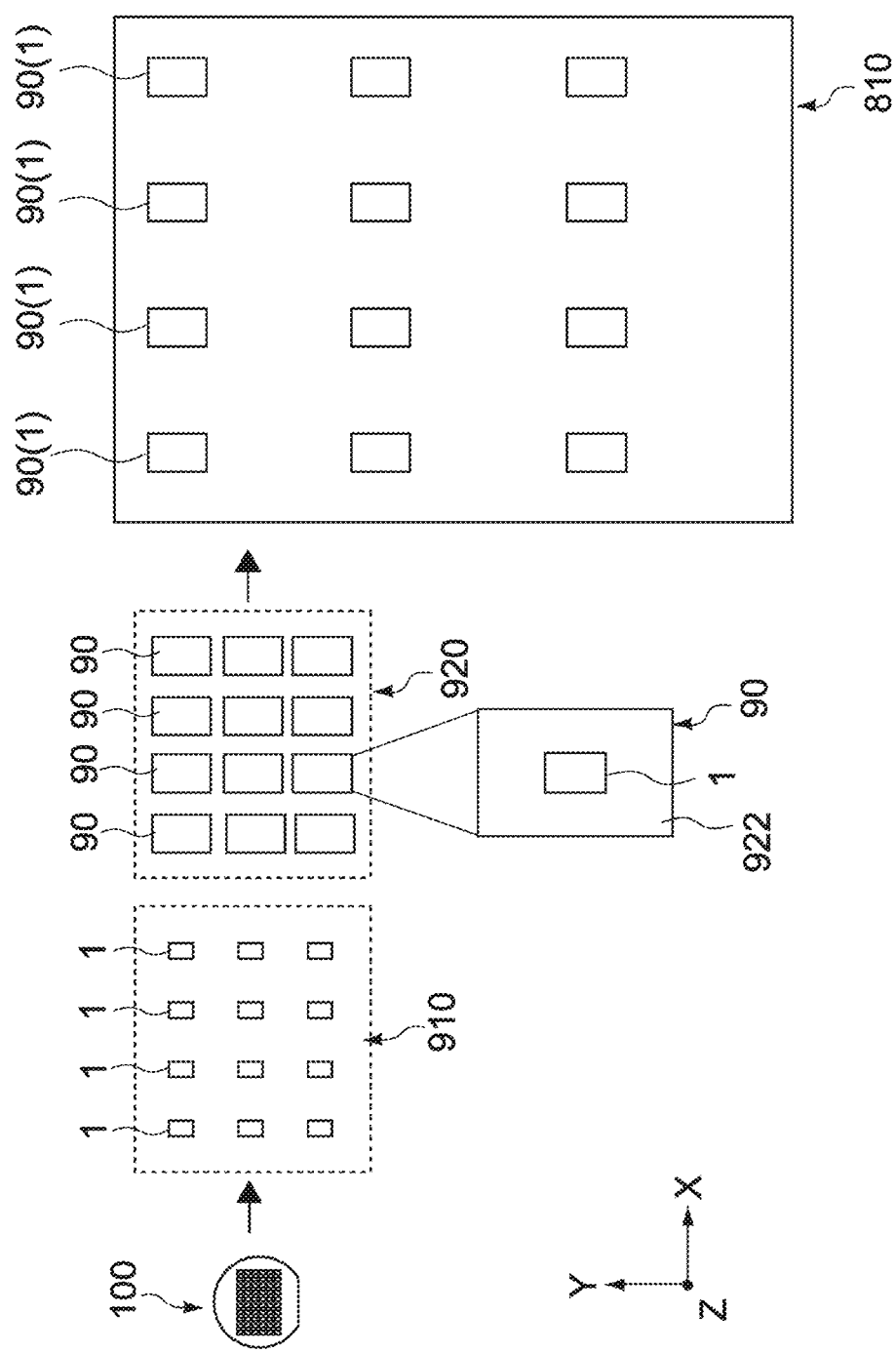
FIG. 21 is a schematic plan view of the display apparatus, showing the manufacturing method therefor.
Figure 22A:
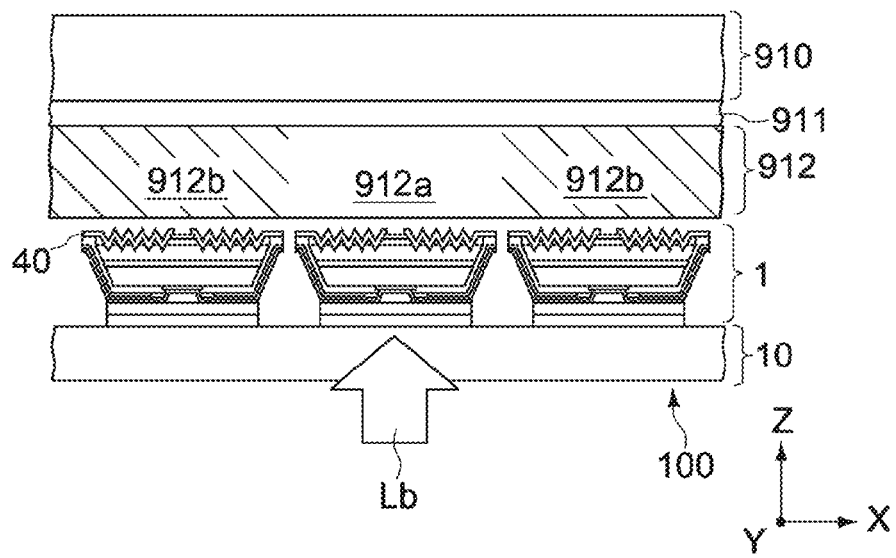
FIGS. 22A to 22C are each a schematic cross-sectional view of the display apparatus, showing the manufacturing method therefor.
Figure 22B:
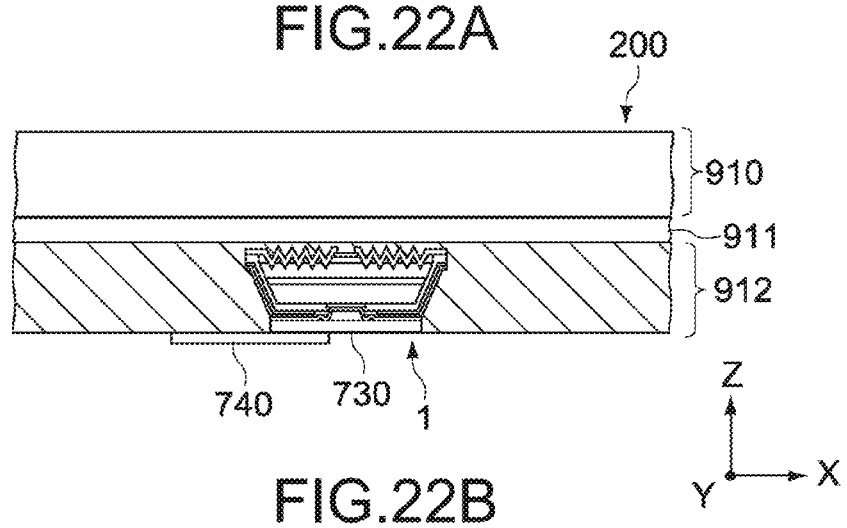
Figure 22C:
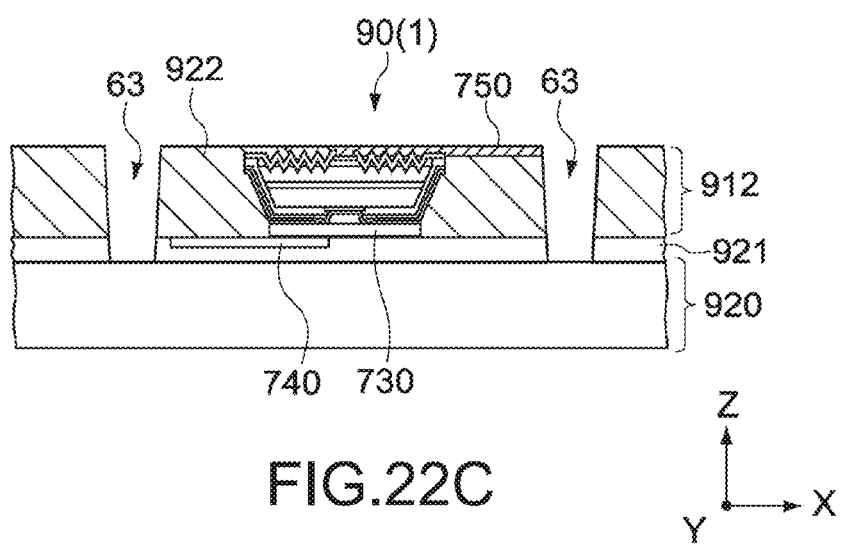

FIG. 20 is a flowchart of a manufacturing method for the display apparatus 80 in this embodiment, FIG. 21 is a schematic plan view for illustrating the manufacturing method, and FIGS. 22A to 22C are each a schematic cross-sectional diagram for illustrating the manufacturing method.

In FIG. 20, steps are numbered successively from step ST114 of FIG. 9. The number of elements 1 in FIG. 21 is only 12 for description.

By referring to FIG. 21, described is the outline of the manufacturing method for the display apparatus 80. First of all, the light-emitting elements 1 on the light-emitting-element wafer 100 are transferred onto a first transfer substrate (transfer substrate) 910, and are arranged at a predetermined spacing larger than the width of the separation groove section 60. The elements 1 are then transferred onto a second transfer substrate 920, and are each covered by a covering layer 922, thereby forming a wiring pattern or others (not shown). Thereafter, the elements 1 are transferred onto the substrate 810 of the electronic apparatus 80 as light-emitting-element chips covered by the covering layer 922.

First of all, as shown in FIG. 22A, the first transfer substrate 910 is made ready, which is disposed to oppose the inorganic film 40 of each of the elements 1 on the light-emitting-element wafer 100 (ST115). This first transfer substrate 910 is of a size that allows the elements 1 to be arranged at a predetermined spacing therebetween. The first transfer substrate 910 is a glass substrate or a plastic substrate, for example.

The transfer substrate 910 is formed thereon with a first temporary attachment layer 911, and a bonding layer 912. The first temporary attachment layer 911 is formed on the transfer substrate 910, and is made of a fluorine resin, a silicone resin, a water-soluble adhesive such as PVA (polyvinyl alcohol), polyimide, or others. The bonding layer 912 is formed on the first temporary attachment layer 911, and may be made of an ultraviolet (UV) curing resin, a thermosetting resin, a thermoplastic resin, or others.

The bonding layer 912 may include an uncured region 912a, and a cured region 912b. In this structure, if the transferring light-emitting elements 1 are positioned to face the uncured region 912a, the light-emitting elements 1 may be transferred to the bonding layer 912 without fail in the later transfer process. When the bonding layer 912 is made of an UV curing resin, for example, the cured region 912b may be formed by selective UV irradiation only on a corresponding region for curing. Alternatively, the uncured region 912a may be formed with a concave portion in the shape conforming to the light-emitting element 1.

Next, by referring to FIGS. 22A and 22B, the external connection terminal 730 and the support substrate 10 are separated from each other by laser ablation onto the attachment layer 30 from the side of the support substrate (third substrate) 10 of the light-emitting-element wafer 100, thereby moving the elements 1 onto the first transfer substrate (transfer substrate) 910 (ST116).

In this process, as shown in FIG. 22A, laser light Lb is directed toward the attachment layer 30 of the light-emitting element 1 to be moved from the side of the support substrate 10. The laser is exemplified by Excimer laser with a predetermined emission wavelength, or harmonic YAG (yttrium aluminum garnet) laser. With such laser irradiation, the attachment layer 30 loses its adhesion properties as is heated and cured, and the resin therein is partially vaporized, whereby the attachment layer 30 and the external connection terminal 730 are explosively peeled away from each other. That is, the element 1 is emitted in its entirety toward the Z-axis direction, and is bonded with the bonding layer 912. In this manner, as shown in FIG. 22B, the light-emitting element 1 is moved onto the bonding layer 912 on the opposite side.

The uncured region 912a onto which the light-emitting element 1 is moved is then exposed to UV irradiation or others to cure the uncured region 912a. This secures the attachment of the light-emitting element 1 to the bonding layer 912. Alternatively, the external connection terminal 730 may be formed thereon with a wiring layer 740 as appropriate.

This process also forms a light-emitting-element wafer 200 including the first transfer substrate (support substrate) 910, and a plurality of light-emitting elements 1. That is, by performing the above-mentioned processes on each desired element 1, obtained is the light-emitting-element wafer 200 with a plurality of elements 1 arranged on the first transfer substrate 910.

Next, in FIG. 22C, the light-emitting elements 1 are each moved onto the second transfer substrate 920, and removes the first transfer substrate 910 (ST117). This second transfer substrate 920 is typically substantially in the same size as the first transfer substrate 910, and is formed with a second temporary attachment layer 921 made of a fluorine resin, a silicone resin, a water-soluble adhesive such as PVA, polyimide, or others. First of all, the external connection terminal 730 and the wiring layer 740 of each of the elements 1 on the first transfer substrate 910 are attached onto the second temporary attachment layer 921. Next, laser light is directed from above the first transfer substrate 910 toward the first temporary attachment layer 911 thereof, and the first temporary attachment layer 911 and the bonding layer 912 are separated from each other. As a result, the bonding layer 912 including the element 1 therein is moved onto the second temporary attachment layer 921.

Alternatively, as shown in FIG. 22C, a third separation groove 63 may be formed to the bonding layer 912 between the adjacent elements 1 to separate the bonding layer 912 for each of the elements 1. If this is the case, formed is a covering layer 922 being the bonding layer 912 covering the element 1. Still alternatively, a wiring layer 750 may be formed for connection with the first electrode. In the below, the structure of including the element 1 and the covering layer 922 therefor is referred to as light-emitting-element chip 90 for description. This light-emitting-element chip 90 includes the element 1, the covering layer 922, and the wiring layers 740 and 750.

The light-emitting-element chip 90 and others are each moved onto the substrate 810 of the display apparatus 80 (ST118). For such transferring, adopting the above-mentioned laser ablation is a possibility, or an absorption retainer may be used for mechanical transferring. The substrate 810 is configured as a wiring board formed with a predetermined driving circuit that is not shown.

As shown in FIG. 21, the light-emitting-element chips are arranged on the substrate 810 at a predetermined pitch along the X- and Y-axis directions. The predetermined pitch is three times the length of the light-emitting-element chip 90 along the X- and Y-axis directions. With such an arrangement, a light-emitting-element module 81 is formed by placing two other light-emitting-element chips between the light-emitting-element chips 90 each including the light-emitting element that emits red light. One of the two other light-emitting-element chips includes the light-emitting element 2 that emits blue light, and the other includes the light-emitting element 3 that emits green light. With a spacing between the light-emitting-element chips as above, the spacing is utilized to form a wiring pattern or others.

In the above manner, the display apparatus 80 of FIG. 19 is manufactured. That is, the display apparatus 80 includes the substrate 810 formed with a driving circuit, the semiconductor light-emitting elements 1 that emit red light, the semiconductor light-emitting elements 2 that emit blue light, and the semiconductor light-emitting elements 3 that emits green light. These semiconductor light-emitting elements 1, 2, and 3 are arranged on the substrate 810.

In addition to the above-mentioned processes, another transfer substrate may be used for transferring. That is, after the process of moving the elements 1 onto the second transfer substrate 920, additional processes may be performed to move the elements 1 onto third and fourth transfer substrates, for example. This increases the spacing between the elements 1 for moving, and is advantageous to form a wiring layer or to manufacture a large-sized display apparatus, for example.

Assuming that an element separation mask is largely misaligned, and there is a displacement of center of gravity between the attachment layer and the light-emitting layer, the following problems are caused in the process of moving the elements 1 onto the first transfer substrate 910 by laser ablation (ST116).

Figure 23A:
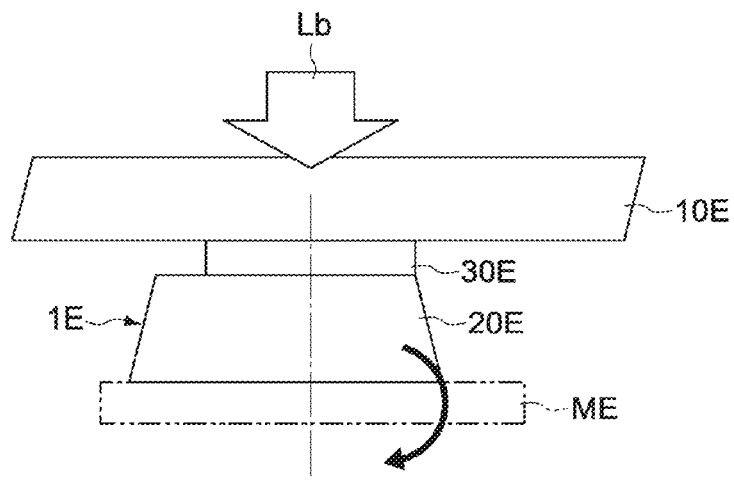
FIGS. 23A to 23C are each a schematic cross-sectional diagram showing a case with a displacement of center of gravity between an attachment layer and a light-emitting layer in a process of moving the light-emitting element from a support substrate onto a first transfer substrate.
Figure 23B:
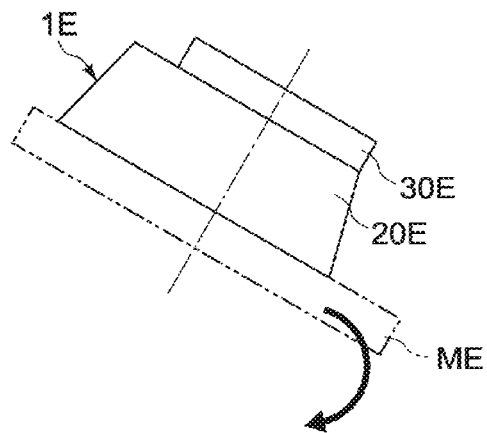
Figure 23C:
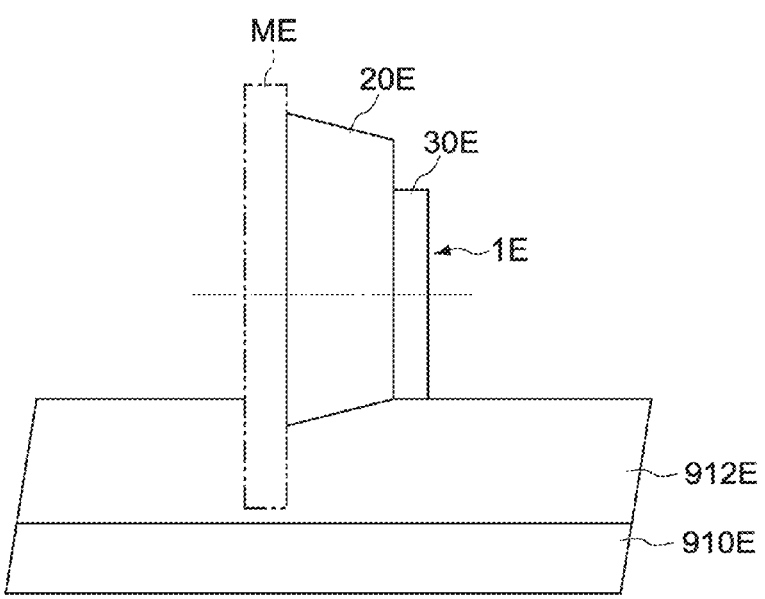

FIGS. 23A to 23C are each a schematic diagram showing how a transfer process onto a transfer substrate is performed when there is a displacement of center of gravity between an attachment layer and a light-emitting layer, and specifically, showing how a process is performed to move an element 1E onto a first transfer substrate 910E from a support substrate 10E (ST116). The expression of "displacement" denotes a displacement on the XY plane. In the drawings, alternate long and short dashed lines denote the center of gravity of the attachment layer 30E, and that of an element separation mask ME. The element separation mask ME is actually removed, but is indicated by chain double-dashed lines for description.

As exemplarily shown in FIG. 23A, when the element separation mask ME is misaligned to the right with the center of gravity of a light-emitting layer 20E, it means that the center of gravity of the attachment layer 30E is also displaced to the right from that of the light-emitting layer 20E as is etched via the element separation mask ME. If laser light Lb is directed toward the resulting attachment layer 30E of the light-emitting element 1E, a clockwise rotating moment is produced to the element 1E at the time of ablation (FIG. 23B). This causes the element 1E to be bonded on the right-side surface to a bonding layer 912E of the first transfer substrate 910E (FIG. 23C).

The inventor and others actually confirm that when there is a predetermined amount or more of the center-of-gravity displacement between the attachment layer 30E and the light-emitting layer 20E, the element 1 attaches on the side surface to the bonding layer 912E as shown in FIG. 23C.

Even if such a displacement is less than the predetermined amount, it is confirmed that the transfer position is also displaced by the element 1E being emitted obliquely in the Z-axis direction at the time of ablation, for example.

In this embodiment, as described by referring to FIG. 18B, the element separation mask is prevented from being misaligned in the plane of the light-emitting-element wafer.

This also prevents a displacement of center of gravity between the attachment layer and the light-emitting layer so that, as shown in FIG. 23C, the element is prevented from rotating at the time of transferring, or the transfer position is prevented from being displaced. Also as will be described later, in this embodiment, even if the element separation mask is misaligned, the transfer position may be prevented from being displaced.

Figure 24:
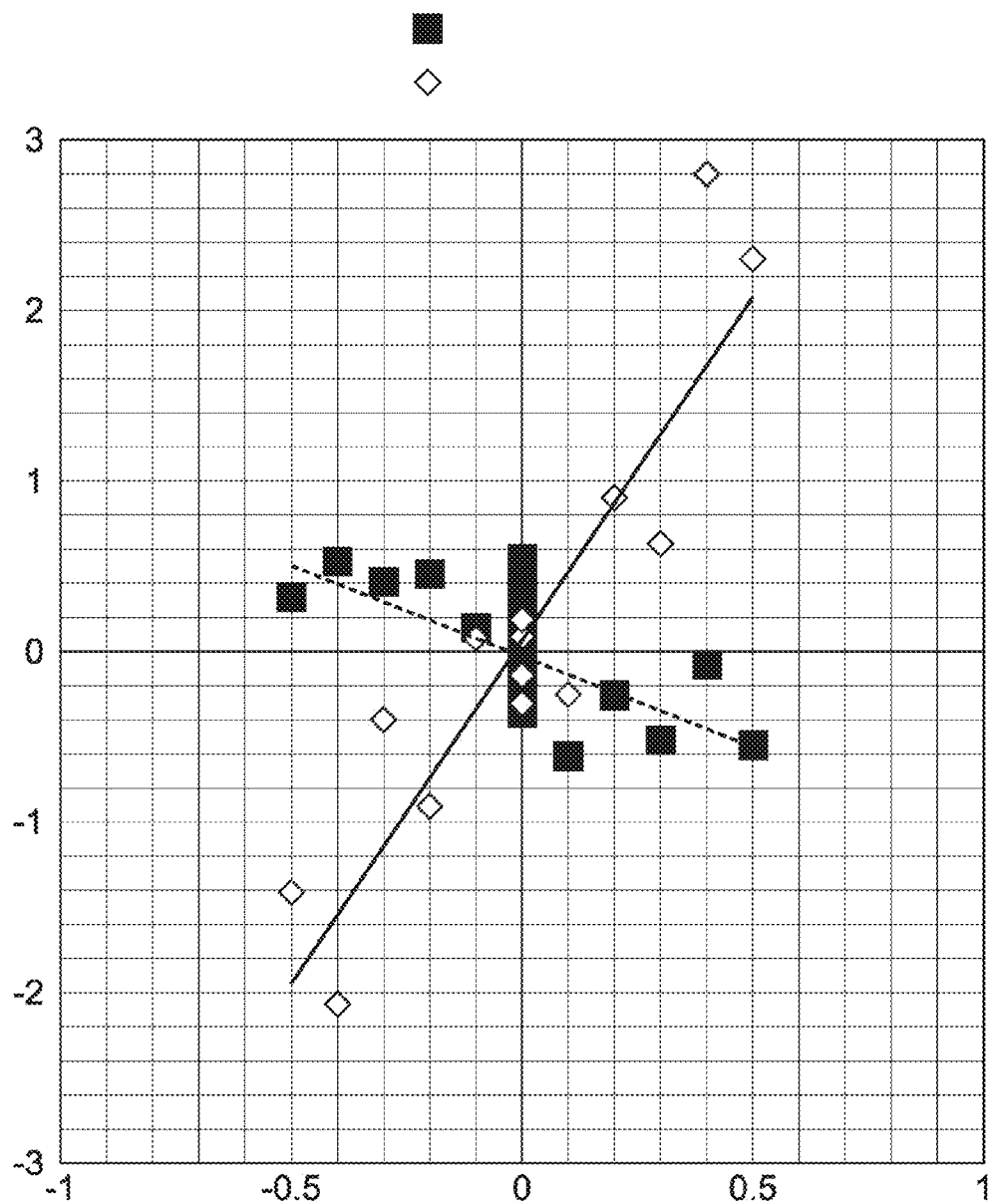
FIG. 24 is a graph showing the relationship between a degree of misalignment of an element separation mask and a degree of displacement of a transfer position, and more specifically, showing the results of a comparison between a reflection layer whose end plane is exposed (example of experiment 1) and a reflection layer whose end plane is not exposed (example of experiment 2)

FIG. 24 is a graph showing the relationship between a degree of misalignment of the element separation mask and a displacement degree of the transfer position, and more specifically, showing results of a comparison between the reflection layer 53 whose end surface 532s is exposed (example of experiment 1) and the reflection layer 53 whose end surface 532s is not exposed (example of experiment 2). Herein, the displacement of the transfer position denotes the degree of displacement from the intended transfer position along the short side of the first plane 201 (or the second plane 202).

FIG. 24 shows that, in the example of experiment 2, a degree of displacement of the transfer position is increased in proportion to a degree of misalignment of the element separation mask (indicated by a solid line). On the other hand, in the example of experiment 1, even if a degree of misalignment of the element separation mask is increased, the transfer position is not displaced to the extent as in the example of experiment 1 (indicated by a broken line).

The results in FIG. 24 confirm that, with the light-emitting element 1 in which the end surface 532s of the reflection layer 53 is exposed, even if the element separation mask is misaligned, the transfer position is not displaced thereby. This is because, in the process of forming the second separation groove 62a, a mask used therefor is the reflection layer 53 in the substantially uniform shape. That is, in this embodiment, because the reflection layer 53 is highly controlled in shape, even if misalignment occurs to the element separation mask, this may not result in a displacement of the transfer position or problems during transferring.

Also in this embodiment, the second region 532 of the reflection layer 53 protrudes in a direction parallel to the first plane 201, and is not exposed from the inorganic film 40. That is, when the wiring layer 750 is pulled from the first electrode 710 to be above the inorganic film 40, two insulation layers are sandwiched between the reflection layer 53 and the wiring layer 750, i.e., the inorganic film 40, and the first insulation layer 51. This accordingly controls a short circuit between the reflection layer 53 and the wiring layer 750, and prevents problems to be caused to the elements 1.

Second Embodiment

Figure 25:
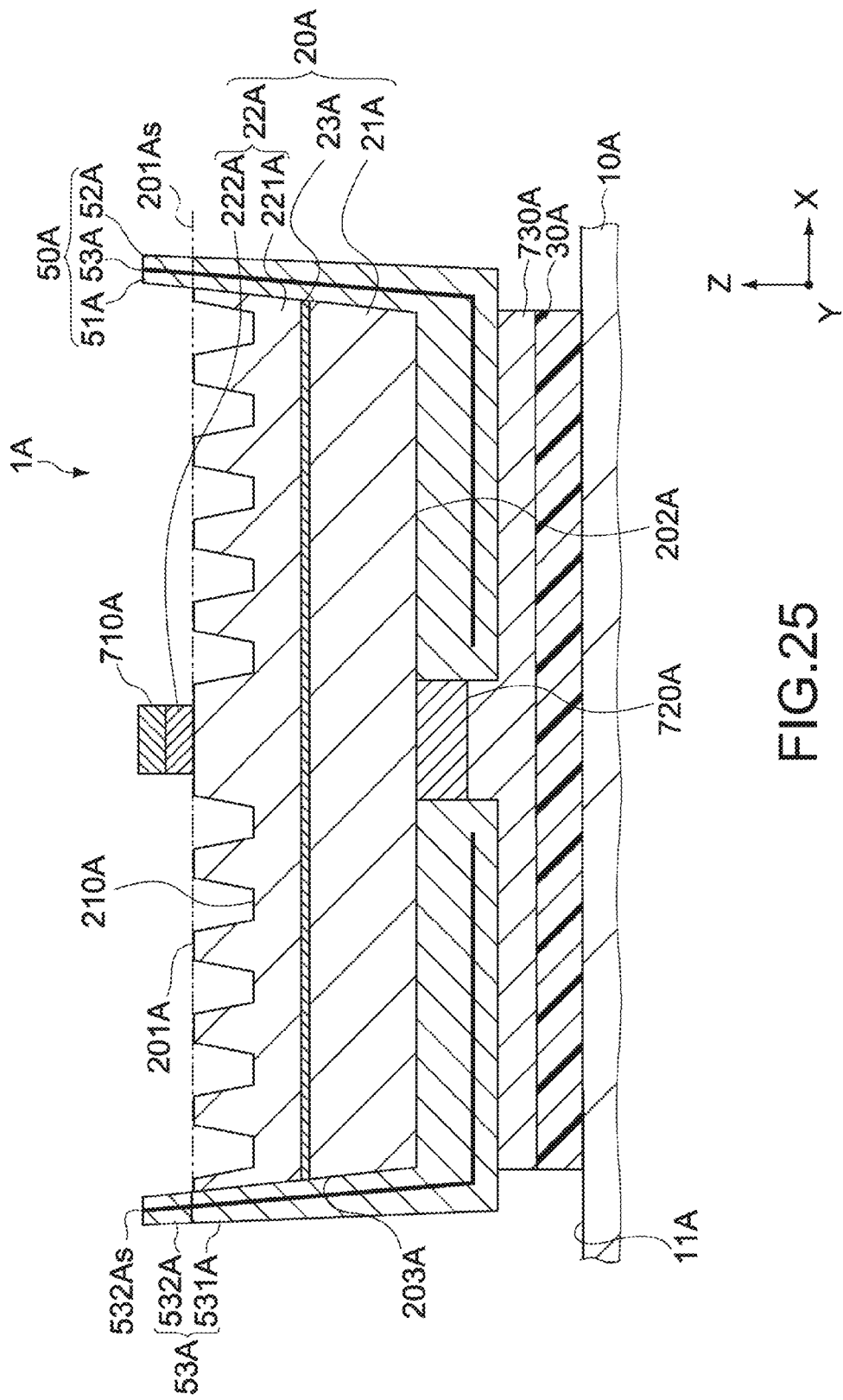
FIG. 25 is a schematic cross-sectional view of a light-emitting-element wafer according to a second embodiment of the present disclosure.

FIG. 25 is a cross-sectional view of a main part of a light-emitting-element wafer according to a second embodiment of the present disclosure, showing the structure thereof. In the drawing, any structure element corresponding to that in the first embodiment is provided with the same reference numeral, and is not described in detail again.

Compared with the first embodiment, in a light-emitting element 1A for a light-emitting-element wafer 100A in this embodiment, a second region 532A of a reflection layer 53A protrudes in a direction parallel to a circumferential plane 203A.

Similarly to the first embodiment, a light-emitting layer 20A is a semiconductor, including a first plane 201A that includes a first electrode 710A, a second plane 202A is opposing to the first plane 201A and includes a second electrode 720A, and a circumferential plane 203A that connects together the first and second planes 201A and 202A.

The light-emitting layer 20A emits red light and includes GaAs and AlGaInP semiconductor compounds, but this is not restrictive.

Also similarly to the first embodiment, the light-emitting layer 20A includes a first semiconductor layer 21A of a first conductivity type, an active layer 23A formed on the first semiconductor layer 21A, and a second semiconductor layer 22A of a second conductivity type formed on the active layer 23A. In this embodiment, the first conductivity type is assumed to be p, and the second conductivity type is assumed to be n, but this is not restrictive.

Also similarly to the first embodiment, in the light-emitting layer 20A, the first plane 201A may be formed to be larger than the second plane 202A like a square frustum.

Also similarly to the first embodiment, the first plane 201A may include a first concave-convex structure 210A that may be changed as appropriate so as to provide emitted light with desired optical characteristics.

In this embodiment, the light-emitting element 1A may or may not include an inorganic film as shown in FIG. 25.

An optical function film 50A protrudes as a whole upward in the Z-axis direction to be higher than a reference plane 201As of the first plane 201A along the circumferential plane 203A. In the second plane 202A, the optical function film 50A is formed to cover a reflection region (not shown in FIG. 25). The optical function film 50A also covers the circumferential plane 203A in its entirety, and protrudes upward in the Z-axis direction along the circumferential plane 203A.

Similarly to the first embodiment, the optical function film 50A includes a reflection layer 53A, a first insulation layer 51A, and a second insulation layer 52A. The reflection layer 53A is able to reflect light coming from the light-emitting layer 20A. The first insulation layer 51 is formed between the light-emitting layer 20A and the reflection layer 53A, and the second insulation layer 52A is formed on the reflection layer 53A.

The reflection layer 53A includes first and second regions 531A and 532A. The first region 531A covers the second plane 202A and the circumferential plane 203A, and the second region 532A protrudes from the first region 531A toward the outside of the light-emitting layer 20A. In this embodiment, the first region 531A of the reflection layer 53A is a region covering the second plane 202A and the circumferential plane 203A, and opposing to each of the second plane 202A and the circumferential planes 203A. The second region 532A of the reflection layer 53A is a region protruding upward in the Z-axis direction from the first region 531A toward the light-emitting layer 20A. To be more specific, the second region 532A is a region being higher than the reference plane 201As of the first plane 201A in the Z-axis direction.

That is, in this embodiment, an end plane 532As of the reflection layer 53A is formed to be higher than the height of the first plane 201A. The "height" herein denotes the height of the structure from a surface 11A of a support substrate 10A along the Z-axis direction, and the expression of "the height of the first plane 201A" denotes the height of the reference plane 201As of the first plane 201A.

With the reflection layer 53A having the second region 532A, light directed to the circumferential edge of the first plane 201A is reflected by the second region 532A, and then is directed toward the front of the light-emitting element 1A (upward in the Z-axis direction). This accordingly further enhances the emission intensity toward the front of the light-emitting element 1A.

Also similarly to the first embodiment, in the second region 532A, the end plane 532As is exposed so that the heat dissipation of the light-emitting element 1A may be improved.

FIGS. 26A to 30B are each a schematic cross-sectional view of the light-emitting-element wafer 100A, showing a manufacturing method therefor. Described mainly below are only differences from the manufacturing method for the light-emitting-element wafer 100 in the first embodiment (refer to FIGS. 10A to 15B).

Figure 26A:
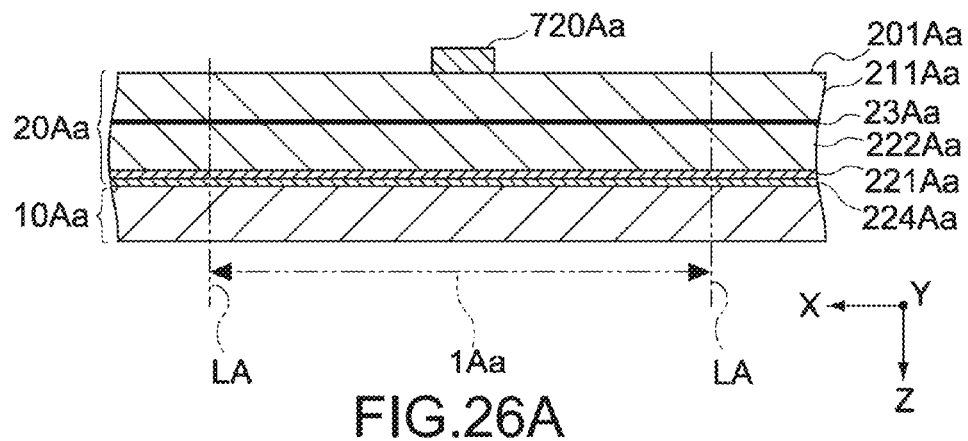
FIGS. 26A to 26C are each a schematic cross-sectional view of the light-emitting-element wafer of FIG. 25, showing a manufacturing method therefor.

First of all, as shown in FIG. 26A, a light-emitting layer 20Aa is formed on a first substrate 10Aa. Herein, on the first substrate 10Aa made of gallium arsenide (GaAs), layers are each formed as appropriate by Metal Organic Chemical Vapor Deposition (MOCVD), for example.

The layers are formed in order on the first substrate 10Aa by crystal growth, i.e., a second-conductive-type stop layer 224Aa, a second contact layer 221Aa, and a second cladding layer 222Aa. The stop layer 224Aa functions as an etching stop layer when the first substrate 10Aa is removed similarly to the stop layer 214a in the first embodiment. Among the above layers, because the stop layer 224Aa is removed in the later process together with the first substrate 10Aa, the second contact layer 221aA and the second cladding layer 222Aa are included in a second semiconductor layer 22A of the light-emitting element 1A.

Thereafter, formed is a multiquantum well layer 23Aa that serves as the active layer 23A of the light-emitting element 1A, and on the multiquantum well layer 23Aa, layers are formed in order by crystal growth, i.e., a first-conductive-type first cladding layer 211Aa, and a first contact layer. Note that the first contact layer is not shown in FIGS. 26A to 30B. The structure of the light-emitting layer 20Aa is not restricted to the above, and may be changed as appropriate.

Also as shown in FIG. 26A, a connection region (not shown) of the second plane 202Aa is formed with a second electrode 720Aa. This second electrode 720Aa is formed as appropriate by sputtering, vapor deposition, ion plating, plating, or others, and is patterned in a predetermined shape such as oval, for example. Such a second electrode 720Aa is formed at least one to each element region 1Aa. After this process, the second plane is the surface of the second electrode 720Aa and that of the second cladding layer 221Aa, and is referred to as second plane 202Ab.

Figure 26B:
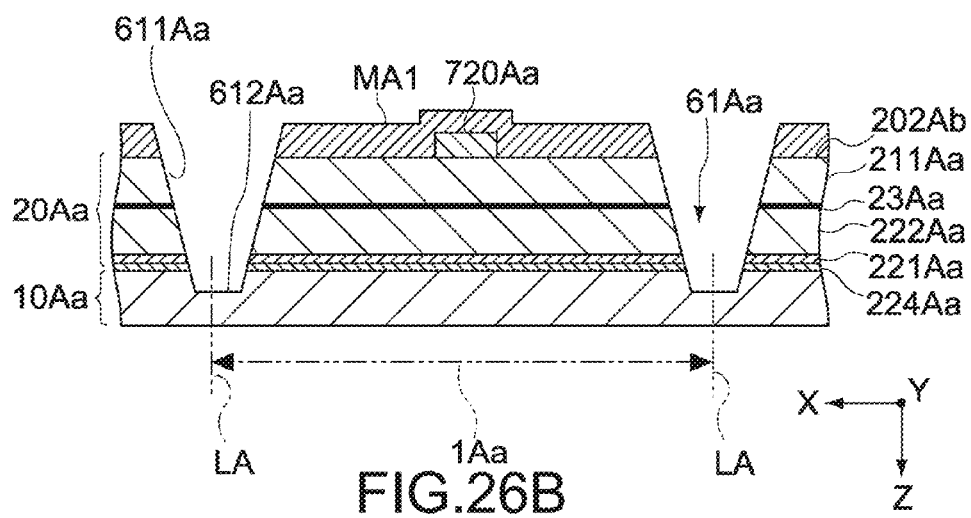

Next, as shown in FIG. 26B, the light-emitting layer 20Aa is etched from the second plane 202Ab to form a first separation groove 61Aa that separates the light-emitting layer 20Aa for each of the elements (element regions) 1Aa. In this process, as shown in FIG. 26B, a mask layer MA1 is first formed on the second plane 202Ab to conform to the shape of the second plane 202A after the formation of the elements 1Aa. The mask layer MA1 may be made of a material with a low etching rate in the etchant used in this process, and may be $SiO_2$, SiN, Ti, Ni, Cr, Al, or others.

Next, by using the mask layer MA1 as a mask, the light-emitting layer 20Aa is etched by wet etching or dry etching, for example. In this process, by using an etchant showing a high etching selection ratio between the first substrate 10Aa and the light-emitting layer 20Aa, the resulting first separation groove 61Aa has a depth reaching the first substrate 10Aa. Note that the depth of the first separation groove 61Aa is not particularly restrictive as long as the stop layer 224Aa is exposed therefrom.

Also in this process, the cross-sectional area of the light-emitting layer 20Aa for each of the elements 1Aa may be gradually increased from the second plane 202Ab toward a first plane 201Aa. That is, in the first separation groove 61Aa, the cross-sectional area of a bottom plane 612Aa is smaller than that of the aperture portion on the side of the second plane 202Ab. Such a first separation groove 61Aa may be formed as appropriate under conditions for taper etching similarly to the first embodiment.

This forms the first separation groove 61Aa with a wall plane 611Aa being tapered, and the bottom plane 612Aa.

The wall plane 611Aa corresponds to the circumferential plane 203A of the light-emitting element 1A, and from the bottom plane 612Aa, the first substrate 10Aa is exposed.

Next, by referring to FIGS. 26C to 27B, an optical function film 50Aa is formed to cover the wall plane 611Aa and the bottom plane 612Aa of the first separation groove 61Aa, and the second plane 202Ab.

Figure 26C:
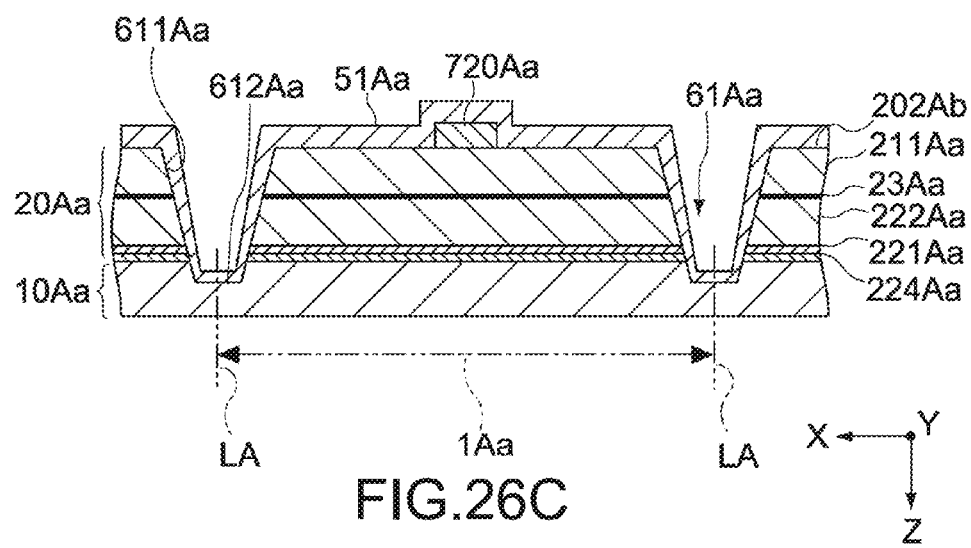

First of all, as shown in FIG. 26C, a first insulation layer 51Aa is formed by CVD, sputtering, or others on the wall and bottom planes 611Aa and 612Aa in the first separation groove 51Aa, and on the second plane 202Ab.

Figure 27A:
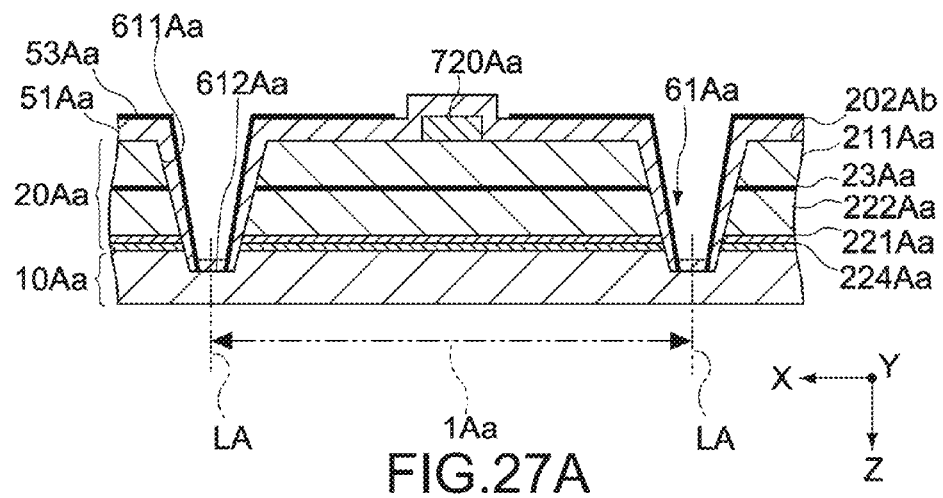
FIGS. 27A to 27C are each a schematic cross-sectional view of the light-emitting-element wafer, showing the manufacturing method therefor.

Next, as shown in FIG. 27A, the first insulation layer 51Aa is formed thereon with the reflection layer 53Aa. The reflection layer 53Aa in this embodiment is so formed as to reach the bottom plane 612Aa. For patterning the reflection layer 53Aa in this process, similarly to the first embodiment, lifting-off is applicable but is not restrictive.

Figure 27B:
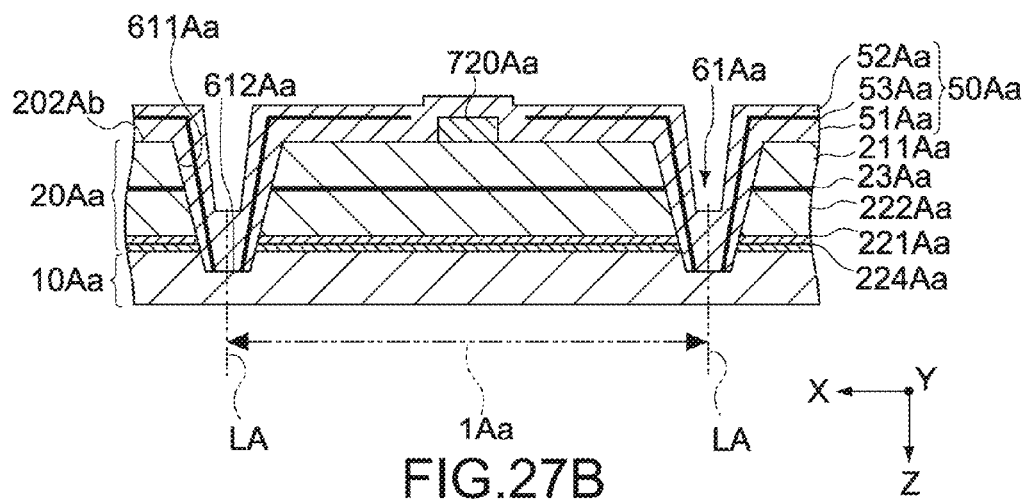

Thereafter, as shown in FIG. 27B, the reflection layer 53Aa is formed thereon with a second insulation layer 52Aa by CVD, sputtering, or others. This forms the optical function film 50Aa entirely on the inner surface of the second plane 202Ab and that of the first separation groove 61Aa.

Figure 27C:
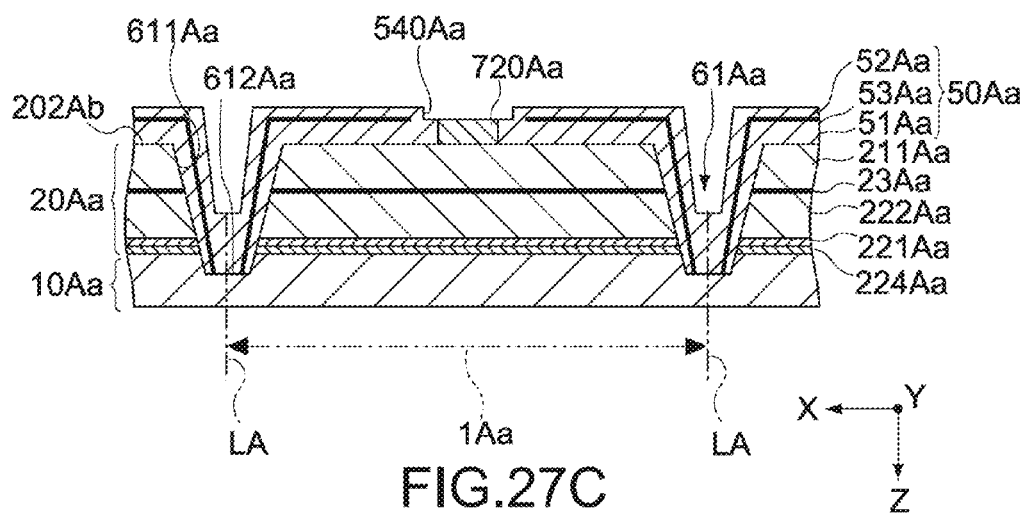

Next, as shown in FIG. 27C, the optical function film 50Aa is partially removed to expose the second electrode 720Aa. This forms a connection hole 540Aa to the first and second insulation layers 51Aa and 52Aa of the optical function film 50Aa.

Figure 28A:
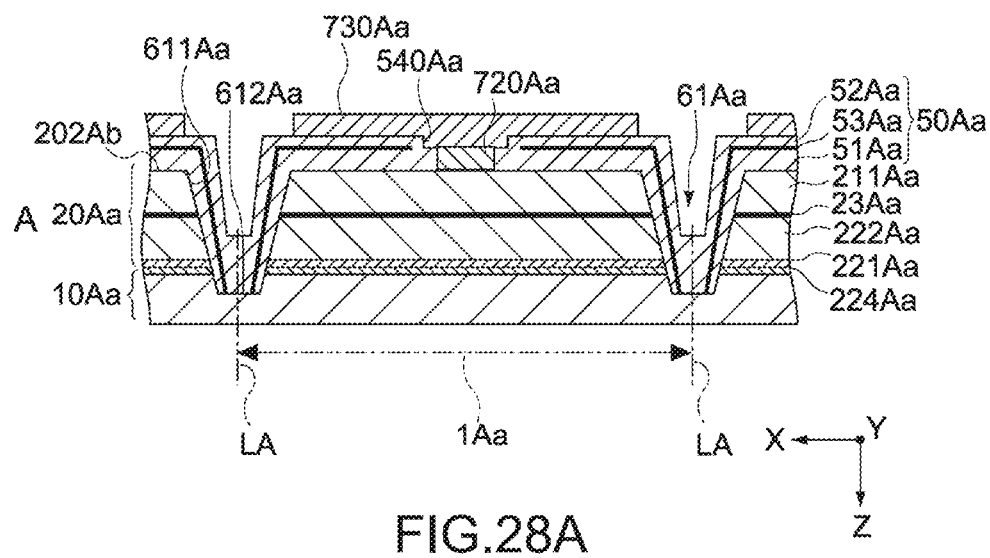
FIGS. 28A and 28B are each a schematic cross-sectional view of the light-emitting-element wafer, showing the manufacturing method therefor.

Next, as shown in FIG. 28A, the second plane 202Ab is formed thereon with an external connection terminal 730Aa for electrical connection with each of the second electrodes 720Aa. To be specific, the external connection terminal 730Aa is formed on the second electrode 720Aa in the connection hole 540Aa, and on the optical function film 50Aa on the second plane 202Ab.

This also forms a space between the adjacent external connection terminals 730Aa on the first groove portion 61Aa.

In the below, the first groove portion 61Aa including the space is referred to as groove portion (not shown).

Next, on the external connection terminal 730Aa, a second substrate 10Ab is attached via an attachment layer 30Aa to be freely separated therefrom.

Figure 28B:
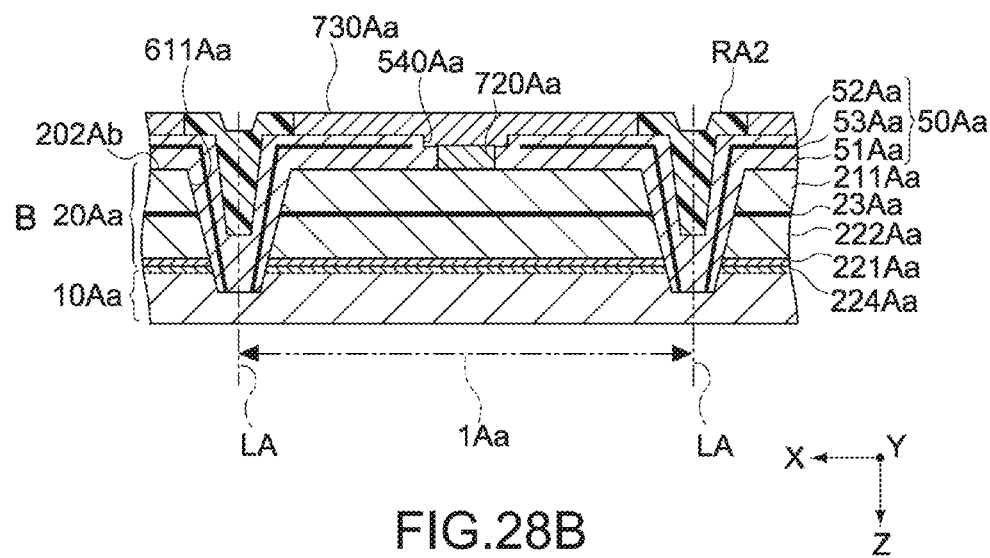

As shown in FIG. 28B, first of all in this process, a groove portion 613Aa is filled with a resin RA2. The resin RA2 may be filled to be substantially level with the surface of the external connection terminal 730Aa by etching-back after coating. The material of the resin RA2 is not particularly restrictive.

Figure 29A:
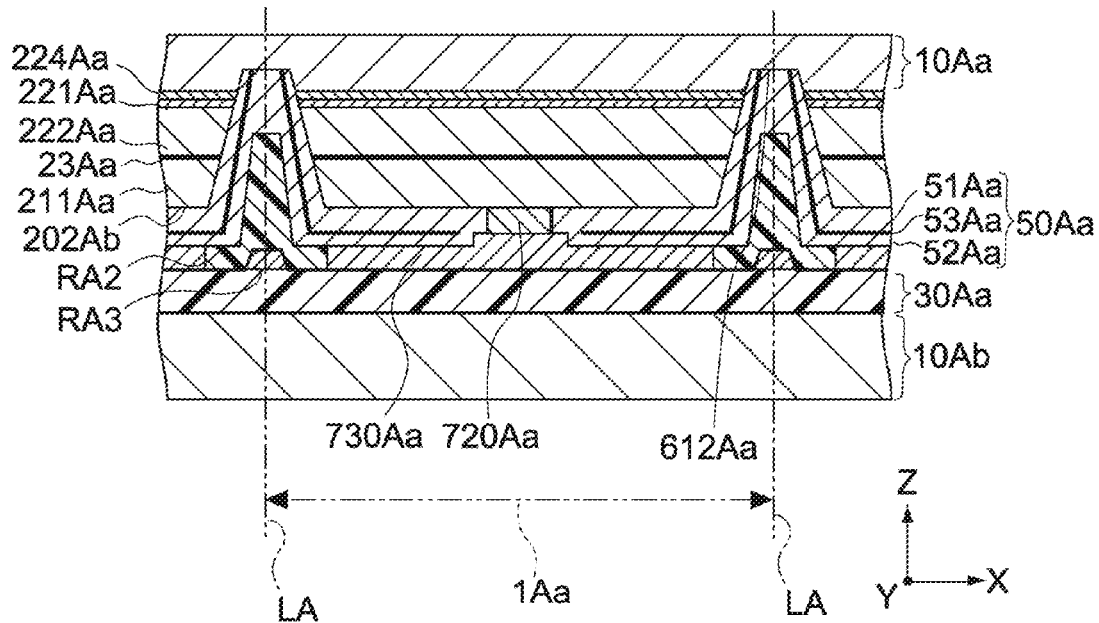
FIGS. 29A and 29B are each a schematic cross-sectional view of the light-emitting-element wafer, showing the manufacturing method therefor.

Next, as exemplarily shown in FIG. 29A, an adhesive resin RA3 is formed on the resin RA2 and the external connection terminal 730Aa. This accordingly improves the adhesion between the attachment layer 30Aa and the external connection terminal 730Aa. The adhesive resin RA3 may be formed up to the external connection terminal 730Aa (refer to FIGS. 15A and 15B), and is not shown in FIGS. 29A to 30B.

FIG. 29A shows the inverted (upside-down) structure of FIG. 28B.

Also as shown in FIG. 29A, on the external connection terminal 730Aa and the resin RA3, the second substrate 10Ab including the attachment layer 30Aa is attached. The second substrate 10Ab corresponds to the above-mentioned support substrate 10A, and is a disk-shaped semiconductor wafer made of sapphire, for example. The attachment layer 30Aa may be made of a thermoplastic resin material that is adhesive such as polyimide similarly to the first embodiment, i.e., a material absorbing laser light with a predetermined wavelength, and causing ablation.

The manner of attaching the second substrate 10Ac is not restricted to the above. Alternatively, at least either the resin RA2 or RA3 may not be formed.

Figure 29B:
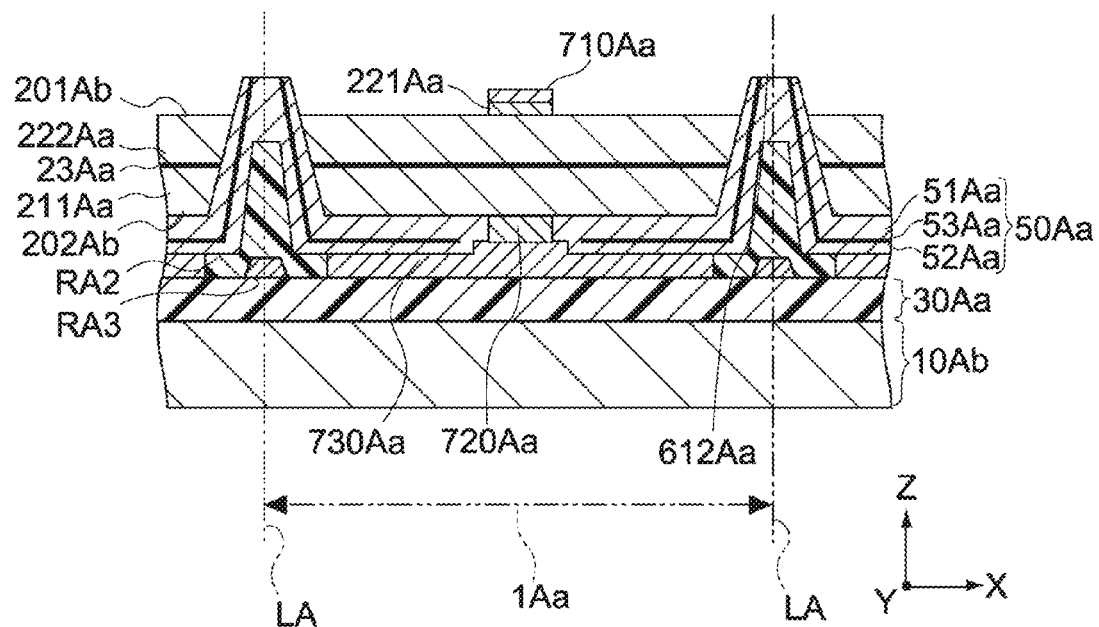

Next, in FIG. 29B, the first substrate 10Aa is removed to expose the first plane 201Aa. In this process, the first substrate 10Aa is removed first by wet etching, for example.

At this time, used is an etchant showing a high etching selection ratio between the stop layer 224Aa and the first substrate 10Aa. This thus controls the progress of the above-mentioned wet etching in the stop layer 224Aa so that the first substrate 10a is removed without fail. The stop layer 224Aa is then removed by dry etching, for example. As a result, the second contact layer 221Aa is exposed on the light-emitting layer 20Aa.

The first plane 201Aa is formed thereon with the first electrode 710Aa in a predetermined shape. In this embodiment, the first electrode 710Aa is used as a mask to etch the second contact layer 221Aa. This removes the second contact layer 221Aa except for the region directly below the first electrode 710Aa as shown in FIG. 29B. The second contact layer after the patterning is denoted as second contact layer 221Ab. Moreover, after this process, the first plane is the surface of the first electrode 710Aa and that of the second cladding layer 222Aa, and is denoted as first plane 201Ab.

Figure 30A:
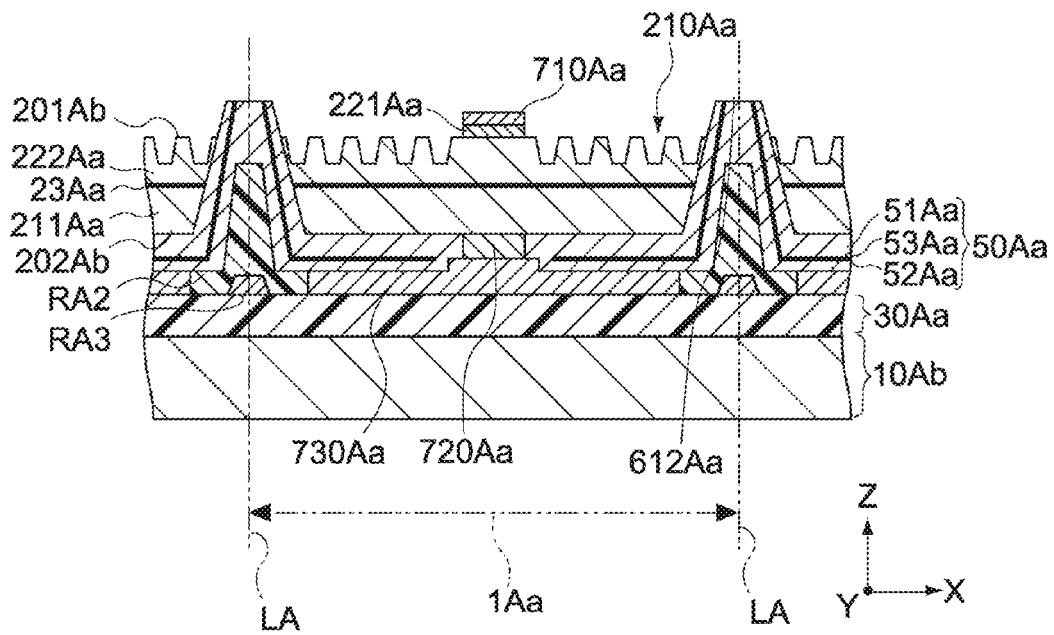
FIGS. 30A and 30B are each a schematic cross-sectional view of the light-emitting-element wafer, showing the manufacturing method therefor.

Next, as shown in FIG. 30A, the first plane 201Aa is formed in a first concave-convex structure 210Aa. The first concave-convex structure 210Aa is formed by photolithography, reactive ion etching (RIE), or others. Alternatively, the first plane 201Ab may be subjected to roughening by oxygen ion or blast processing, for example. For forming the first concave-convex structure 210Aa, a mask or others may or may not be formed.

Figure 30B:
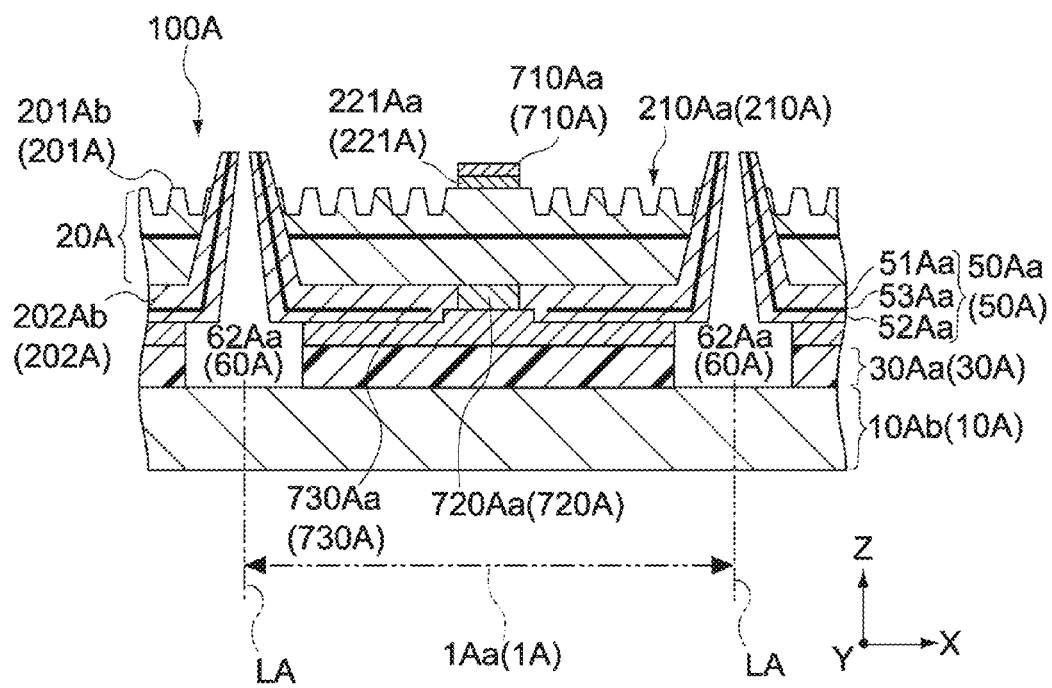

Next, as shown in FIG. 30B, a second separation groove 62Aa is formed to separate the optical function film 50Aa for each of the elements 1Aa. This process forms the second separation groove 62Aa by dry etching, wet etching, or others such as RIE. As to the attachment layer 30Aa, by being etched using the external connection terminal 730Aa as a mask, only the resin RA3 and the attachment layer 30Aa may be left untouched in the region opposing to the external connection terminal 730Aa.

By this process, the above-mentioned light-emitting-element wafer 100A is formed by the structure elements being separated for each of the elements 1A, i.e., the attachment layer 30A on the second substrate 10Ab (the support substrate 10A), the external connection terminal 730A, and the light-emitting layer 20A covered by the optical function film 50A.

As described in the first embodiment above, the elements 1A are each mounted onto an electronic apparatus such as display apparatus.

As above, by forming the reflection layer 53Aa to reach the bottom plane 612Aa, the optical function film 50A is formed with ease in which the end plane 532As of the reflection layer 53A is exposed, and the reflection layer 53A covers the light-emitting layer 20A without fail.

With the manufacturing method for the light-emitting-element wafer 100A in this embodiment, the light-emitting-element wafer 100A is manufactured using two substrates, i.e., the first substrate 10Aa, and the second substrate 10Ab serving as the support substrate 10A. Compared with the manufacturing method of the light-emitting-element wafer 100 in the first embodiment, the manufacturing method in this embodiment is with the reduced number of processes and the reduced manufacturing cost, thereby increasing the productivity to a further degree.

Third Embodiment

Figure 31:
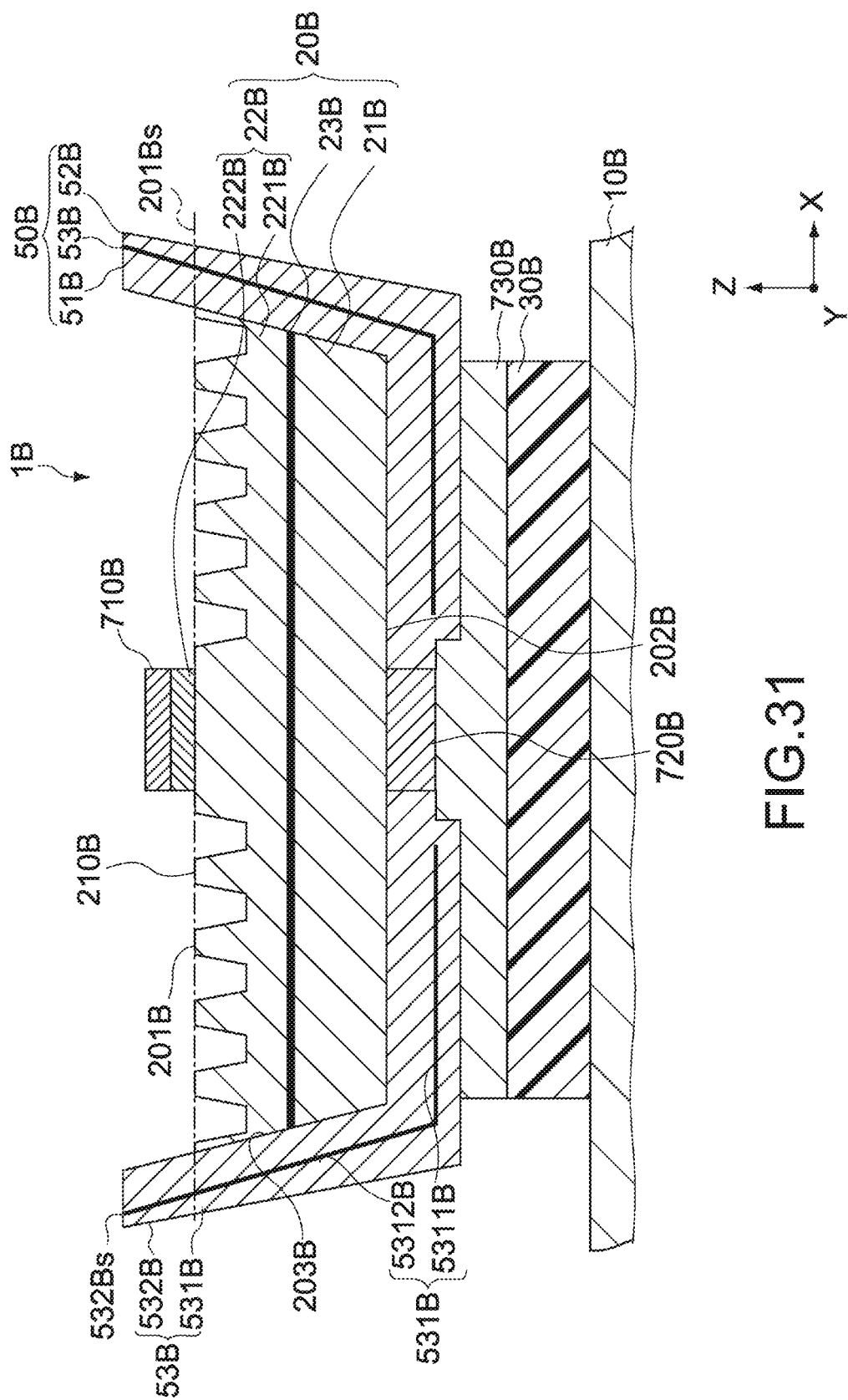
FIG. 31 is a schematic cross-sectional view of a light-emitting-element wafer according to a third embodiment of the present disclosure.

FIG. 31 is a cross-sectional view of a main part of a light-emitting-element wafer according to a third embodiment of the present disclosure, showing the structure thereof. In the drawing, any structure element corresponding to that in the first and second embodiments is provided with the same reference numeral, and is not described in detail again.

Compared with the second embodiment, in a light-emitting element 1B for a light-emitting-element wafer 100B in this embodiment, a tilt angle between a reflection layer 53B and a circumferential plane 203B is different.

Similarly to the first and second embodiments, a first region 531B of the reflection layer 53B includes a first reflection plane 5311B opposing to a second plane 202B, and a second reflection plane 5312B opposing to a circumferential plane 203B. In this embodiment, the second reflection plane 5312B is so formed that a first tilt angle of the second reflection plane 5312B with the first plane 201B is smaller than a second tilt angle of the circumferential plane 203B with the first plane 201B. Herein, the expression of "tilt angle with the first plane 201B" denotes an angle with a reference plane 201Bs of the first plane 201B.

Such a structure allows adjustment of an angle of emitted light to be reflected by the second reflection surface 5312B so that emitted light is with improved orientation.

Also similarly to the second embodiment, the reflection layer 53B of the light-emitting element 1B of FIG. 31 includes a second region 532B that protrudes in a direction parallel to the circumferential plane 203B. With this structure, light directed to the circumferential edge of the first plane 201B is reflected on the second region 532B, thereby enhancing the emission intensity toward the front of the light-emitting element 1B.

The light-emitting-element wafer 100B in this embodiment is manufactured as below.

FIGS. 32A to 33C are each a schematic cross-sectional view of the light-emitting-element wafer 100B, showing a manufacturing method therefor. In the manufacturing method in this embodiment, processes except for a process of forming an optical function film are similar to those in the manufacturing method in the second embodiment. Therefore, described mainly below are only differences from the second embodiment.

Figure 32A:
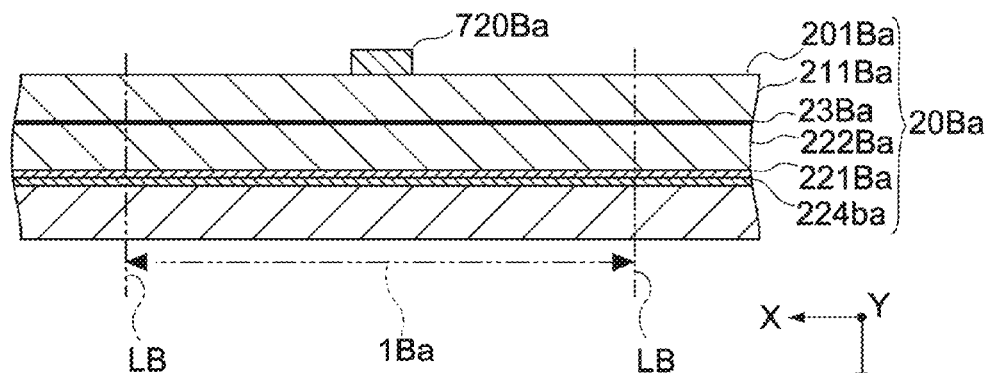
FIGS. 32A 32C are each a schematic cross-sectional view of the light-emitting-element wafer of FIG. 31, showing a manufacturing method therefor.
Figure 32B:
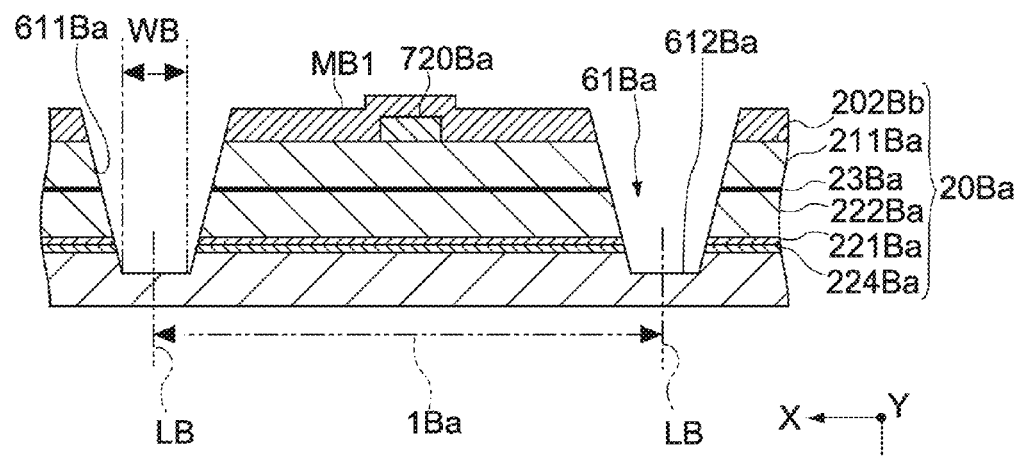

FIGS. 32A and 32B are diagrams showing processes similar to those in FIGS. 26A and 26B in the second embodiment. That is, as shown in FIG. 32A, a first substrate 101Ba is first formed thereon with a light-emitting layer 20Ba. Also as shown in FIG. 32A, a connection region (not shown) of the second plane 202Ba is formed with a second electrode 720Ba.

Next, as shown in FIG. 32B, a light-emitting layer 20Ba is etched from the second plane 202Bb including the second electrode 720Ba to form a first separation groove 61Ba that separates the light-emitting layer 20Ba for each element (element region) 1Ba. Similarly to the second embodiment, this process forms the first separation groove 61Ba with a wall plane 611Ba being tapered, and a bottom plane 612Ba. The wall plane 611Ba corresponds to the circumferential plane 203B of the light-emitting element 1B, and from the bottom plane 612Ba, a first substrate 10Ba is exposed.

In this process, the wall plane 611Ba is so formed that the angle with the bottom plane 612Ba is about 60°, for example. This angle corresponds to the above-mentioned second tilt angle.

In this process, the bottom plane 612Ba is formed with a width WB. By adjusting the width WB, as shown in FIG. 31, an end plane 532Bs is exposed from the second region 532B of the reflection layer 53B. Herein, the "width of the bottom plane" denotes the length of the bottom plane 612Ba along the short-side direction.

Next, by referring to FIGS. 32C to 33B, an optical function film 50Ba is formed to cover the wall plane 611Ba and the bottom plane 612Ba of the first separation groove 61Ba, and the second plane 202Bb.

Figure 32C:
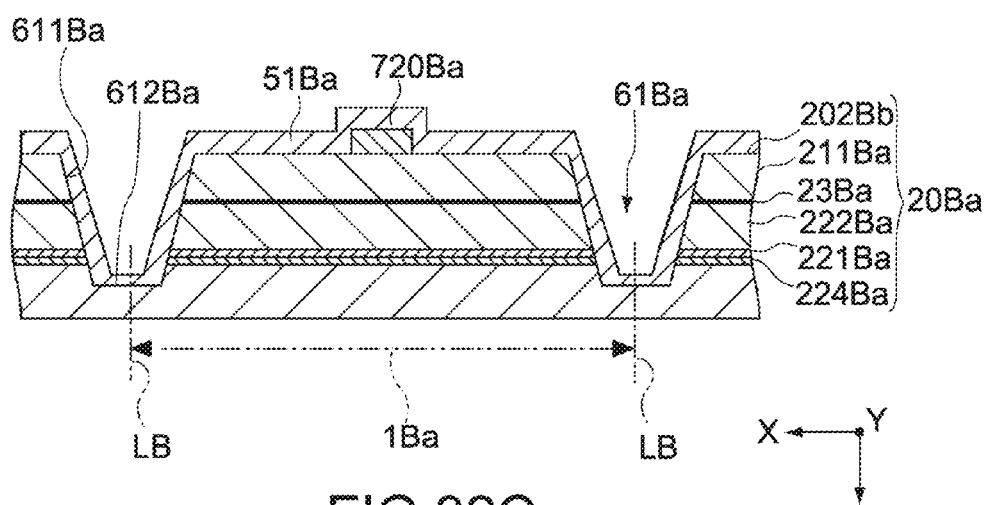

First of all, as shown in FIG. 32C, a first insulation layer 51Ba is formed on the wall plane 611Ba and the bottom plane 612Ba of the first separation groove 61Ba, and on the second plane 202Bb. The first insulation layer 51Ba is made of an inorganic material with flow properties such as SOG (Spin-On Glass; film-forming $SiO_2$ coating material), and a light-resistant resin material including polyimide resin, polyester resin, epoxy resin, or others. Such a first insulation layer 51Ba is formed by spin coating, coating, spraying, or others. Similarly to the first and second embodiments, the first insulation layer 51Ba may be a laminate film including first and second films, i.e., first film made of silicon oxide such as $SiO_2$, SiN, TiN, $TiO_2$, or any other inorganic insulation materials, and the second film made from any of the above-mentioned materials with flow properties.

As such, in this embodiment, the first insulation layer 51Ba is made of a material with flow properties. This allows reduction of an angle formed by the surface of the first insulation layer 51Ba with the bottom plane 612Ba to be smaller than the above-mentioned second tilt angle. This angle corresponds to the above-mentioned first tilt angle. With the wall plane 611Ba being tapered, even if a material in use is with a relatively low viscosity, the first insulation layer 51Ba is formed with ease.

Figure 33A:
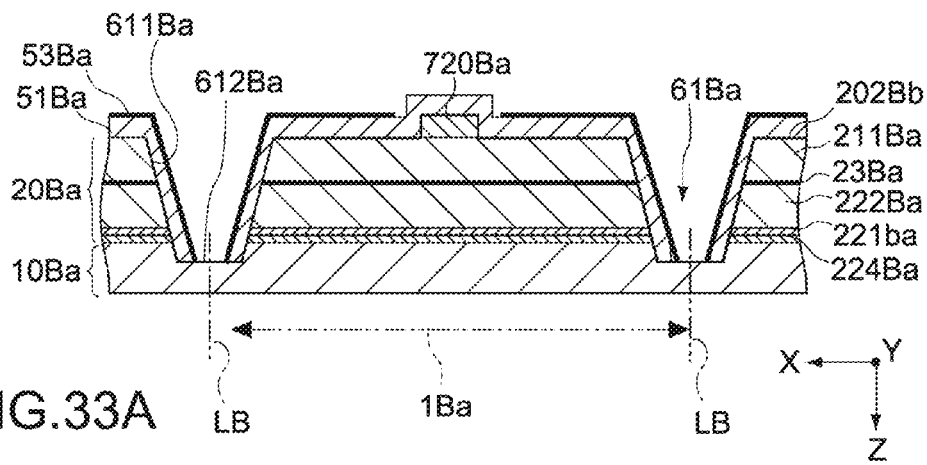
FIGS. 33A to 33C are each a schematic cross-sectional view of the light-emitting-element wafer, showing the manufacturing method therefor.

Next, as shown in FIG. 33A, the first insulation layer 51Ba is formed thereon with a reflection layer 53Ba. The reflection layer 53Ba in this embodiment is so formed as to reach the bottom plane 612Ba. For patterning the reflection layer 53Ba in this process, similarly to the first and second embodiments, lifting-off is applicable but is not restrictive.

This process forms the reflection layer 53Ba on the surface of the first insulation layer 51Ba whose angle in the Z-axis direction is smaller than the second tilt angle.

This accordingly reduces the angle between the reflection layer 53Ba and the second plane 202Bb to be smaller than the above-mentioned second tilt angle.

Figure 33B:
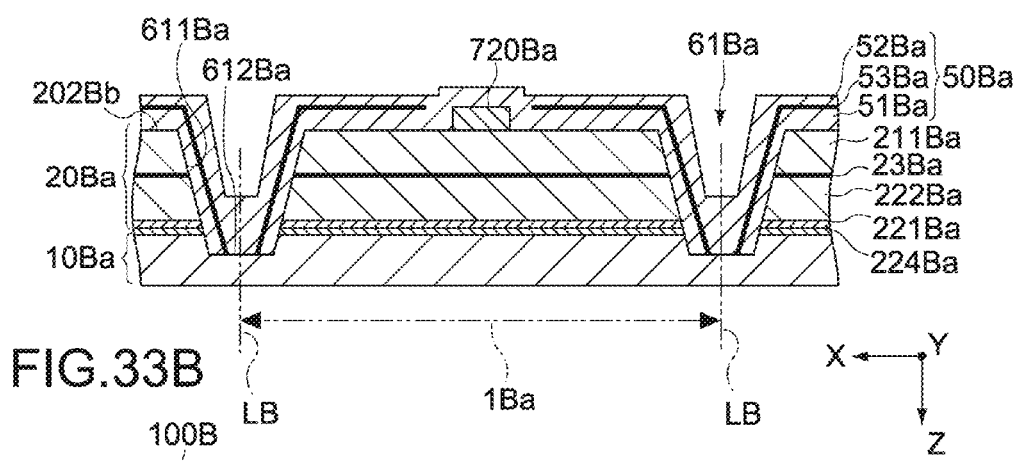
Figure 33C:
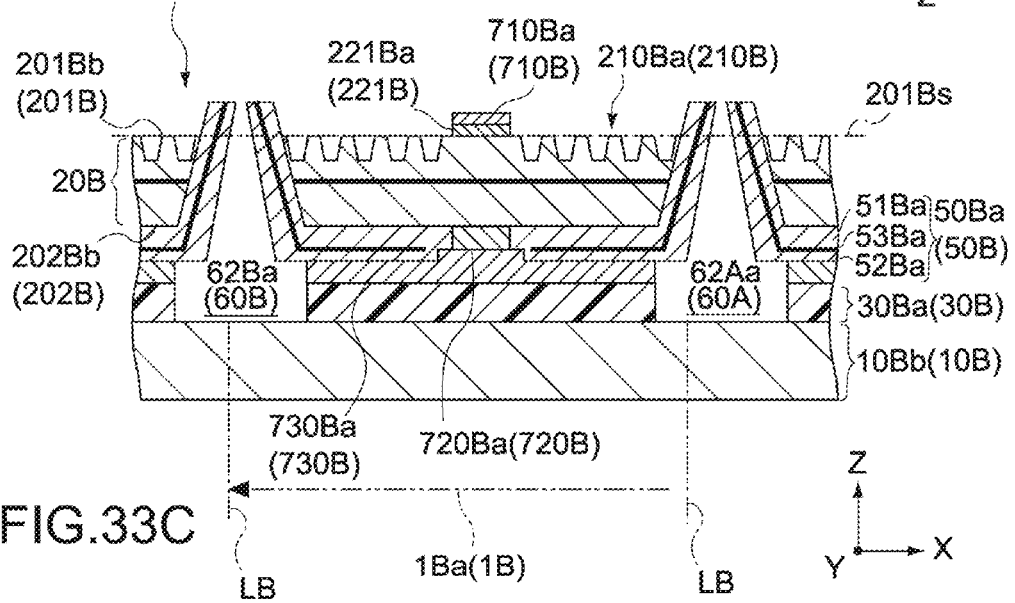

As shown in FIG. 33B, the reflection layer 53Ba is then formed thereon with a second insulation layer 52Ba. The material for the second insulation layer 52Ba is not particularly restrictive, and may be made of silicon oxide such as $SiO_2$, SiN, TiN, $TiO_2$, or any other inorganic insulation materials similarly to the first embodiment, for example. In this case, the second insulation layer 52Ba may be formed by CVD, sputtering, or others depending on the selected material. Alternatively, similarly to the first insulation layer 51Ba in this embodiment, a material with flow properties may be used to form the second insulation layer 52Ba. In this case, the second insulation layer 52Ba may be formed by spin coating, coating, spraying, or others.

The second insulation layer 52Ba may be a laminate film made from any of such materials.

This forms the optical function film 50Ba entirely on the inner surface of the second plane 202Bb and that of the first separation groove 61Ba.

Next, processes similar to those in the second embodiment are performed. That is, the optical function film 50Ba is partially removed to expose the second electrode 720Ba. The second plane 202Bb is formed thereon with an external connection terminal 730Ba for electrical connection with each of the second electrodes 720Ba. The external connection terminal 730Ba is attached thereon with a second substrate 10Bb via an attachment layer 30Ba to be freely separated therefrom. The first substrate 10Ba is removed to expose the first plane 201Ba to form the first electrode 710Ba, and a first concave-convex structure 210Ba is formed. A second separation groove 62Ba is then formed to separate a second inorganic film 50Ba for each of the elements 1Ba (FIGS. 27C to 30A). These processes form the light-emitting-element wafer 100B of FIG. 33C (FIG. 31).

As described above, according to this embodiment, because the wall plane 611Ba of the first separation groove 61Ba is tapered, the first and second insulation layers 51Ba and 52Ba may be made of a resin material with a low viscosity. This allows formation of the first and second insulation layers 51Ba and 52Ba with ease by spin coating, for example.

In the light-emitting element 1B in this embodiment, by adjusting the width WB of the bottom plane 612Ba to be in a predetermined size or wider in the first separation groove 61Ba, the reflection layer 53Ba tilted more than the wall plane 611Ba is formed to reach the bottom plane 612Ba.

This exposes the end plane 532Bs from the second region 532B similarly to the second embodiment. Herein, the expression of "width in a predetermined size" is assumed to be defined based on the size of the element 1B in its entirety, or the tilt angle of the second reflection plane 5312B.

Figure 34A:
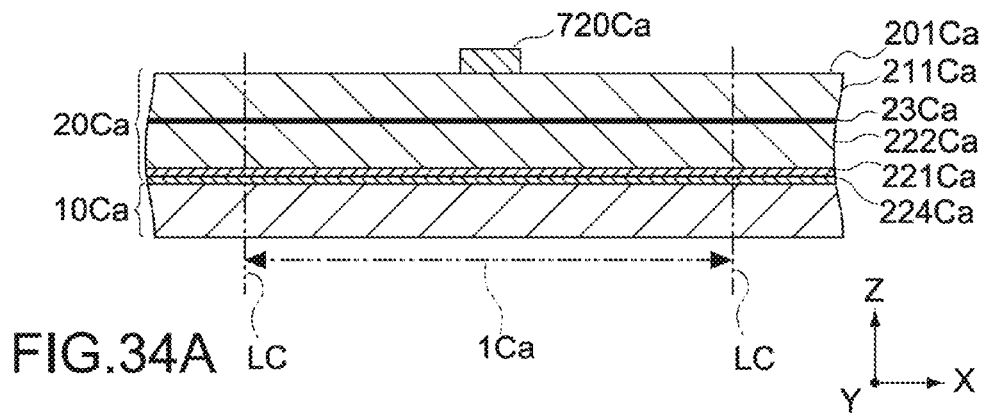
FIGS. 34A to 34C are each a schematic cross-sectional view of a light-emitting-element wafer in a reference example according to the third embodiment of the present disclosure, showing a manufacturing method therefor.
Figure 34B:
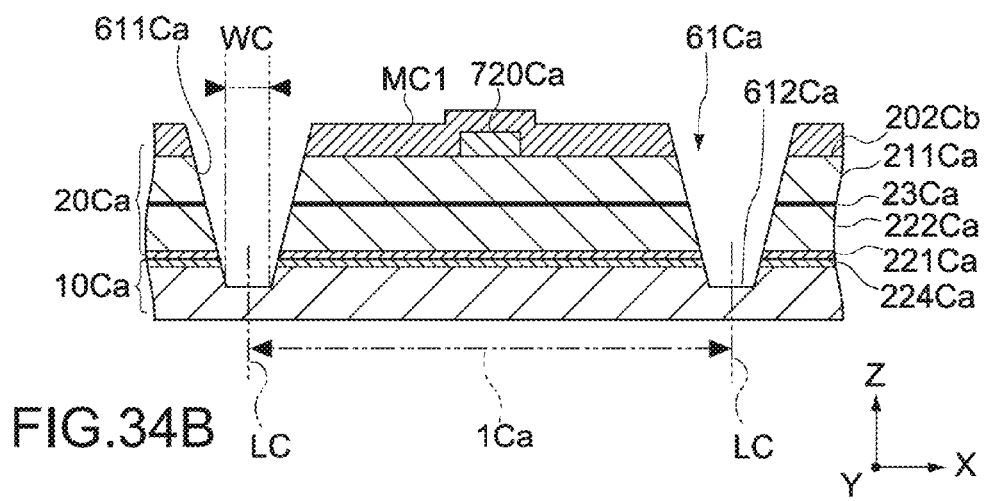
Figure 34C:
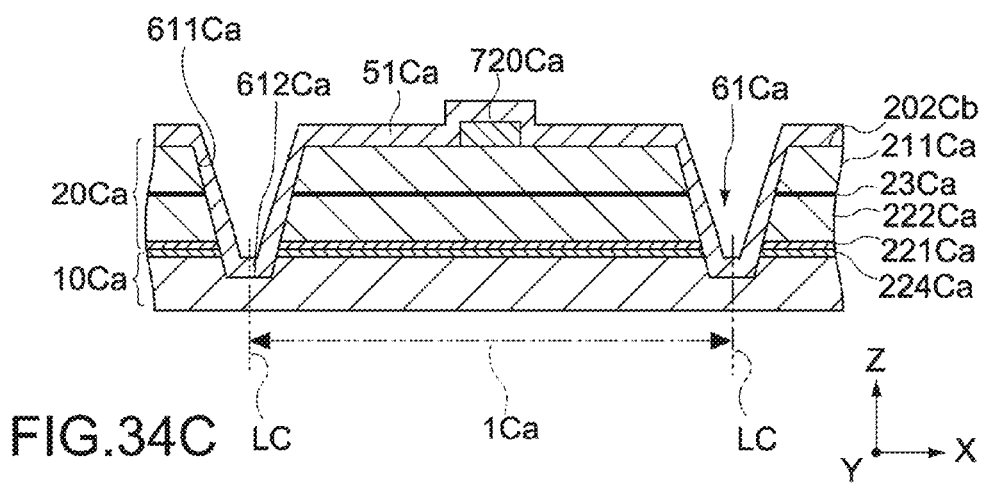

On the other hand, FIGS. 34A to 35C are each a schematic cross-sectional diagram for illustrating a manufacturing method in a reference example when a width WC of a bottom plane 612Ca is narrower than a predetermined size. FIGS. 34A, 34B, and 34C respectively correspond to FIGS. 32A, 32B, and 32C, and FIGS. 35A, 35B, and 35C respectively correspond to FIGS. 33A, 33B, and 33C. In the manufacturing method in this reference example, processes are similar to those in the manufacturing method in the above-mentioned embodiment, and thus are not described in detail again.

Figure 35A:
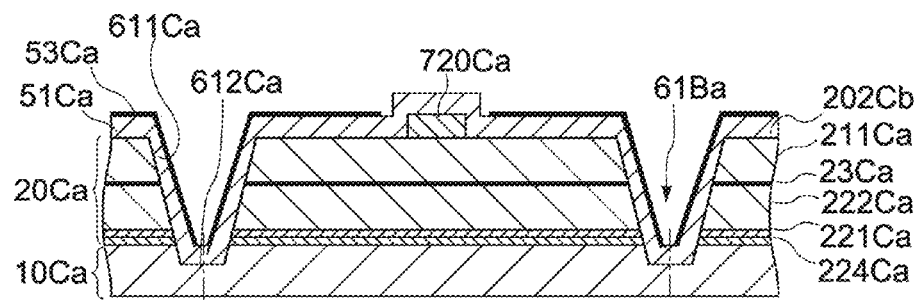
FIGS. 35A to 35C are each a schematic cross-sectional view of the light-emitting-element wafer of FIGS. 34A to 34C, showing the manufacturing method therefor.
Figure 35B:
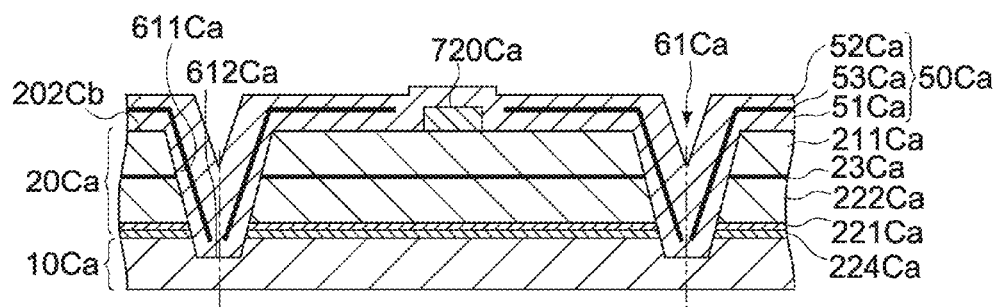

In this reference example, because the width WC of the bottom plane 612Ca is narrower than the predetermined size, a reflection layer 53Ca is not formed to reach the bottom plane 612Ca (refer to FIG. 35B). Therefore, in a light-emitting element 1C in this reference example, an end plane 53Cs of the reflection layer 53C is exposed from the side surface of an optical function film 50C (refer to FIG. 35C).

Figure 35C:
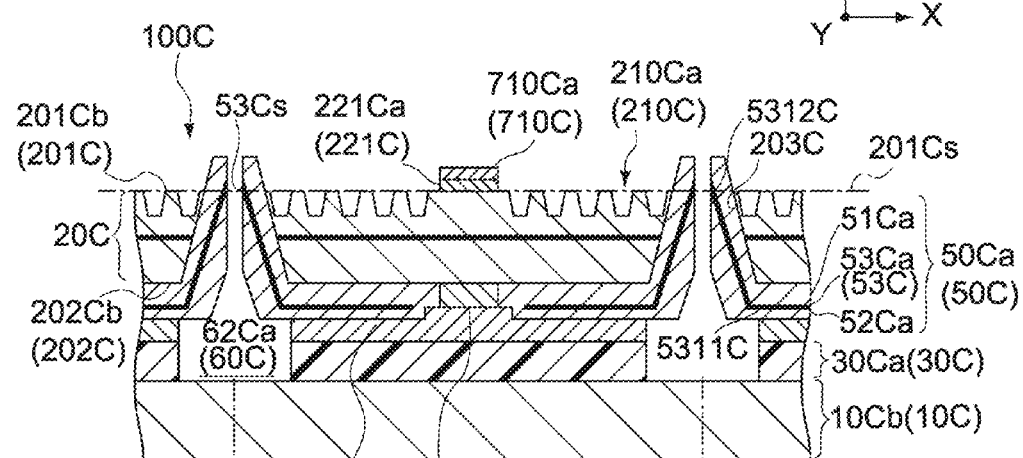

That is, as shown in FIG. 35C, a light-emitting-element wafer 100C in this reference example includes a light-emitting layer 20C, and the optical function film 50C.

The light-emitting layer 20C is a semiconductor, including a first plane 201C that includes a first electrode 710C, a second plane 202C is opposing to the first plane 201C and includes a second electrode 720C, and a circumferential plane 203C that connects together the first and second planes 201C and 202C. The optical function film 50C includes the reflection layer 53C that covers the second plane 202C and the circumferential plane 203C, and reflects light coming from the light-emitting layer 20C by including the end surface 53Cs opposing to the circumferential plane 203C. The reflection layer 53C includes a first reflection plane 5311C opposing to the second plane 202C, and a second reflection plane 5312C opposing to the circumferential plane 203C. A first tilt angle between the second reflection plane 5312C and a reference plane 201Cs of the first plane 201C is smaller than a second tilt angle between the circumferential plane 203C and the reference plane 201Cs.

Such a structure improves heat dissipation of the light-emitting element 1C, and allows reflection of light directed to the second plane 202C and the circumferential plane 203C, thereby enhancing the emission intensity toward the front of the light-emitting element 1C.

Modified Example

Figure 36:
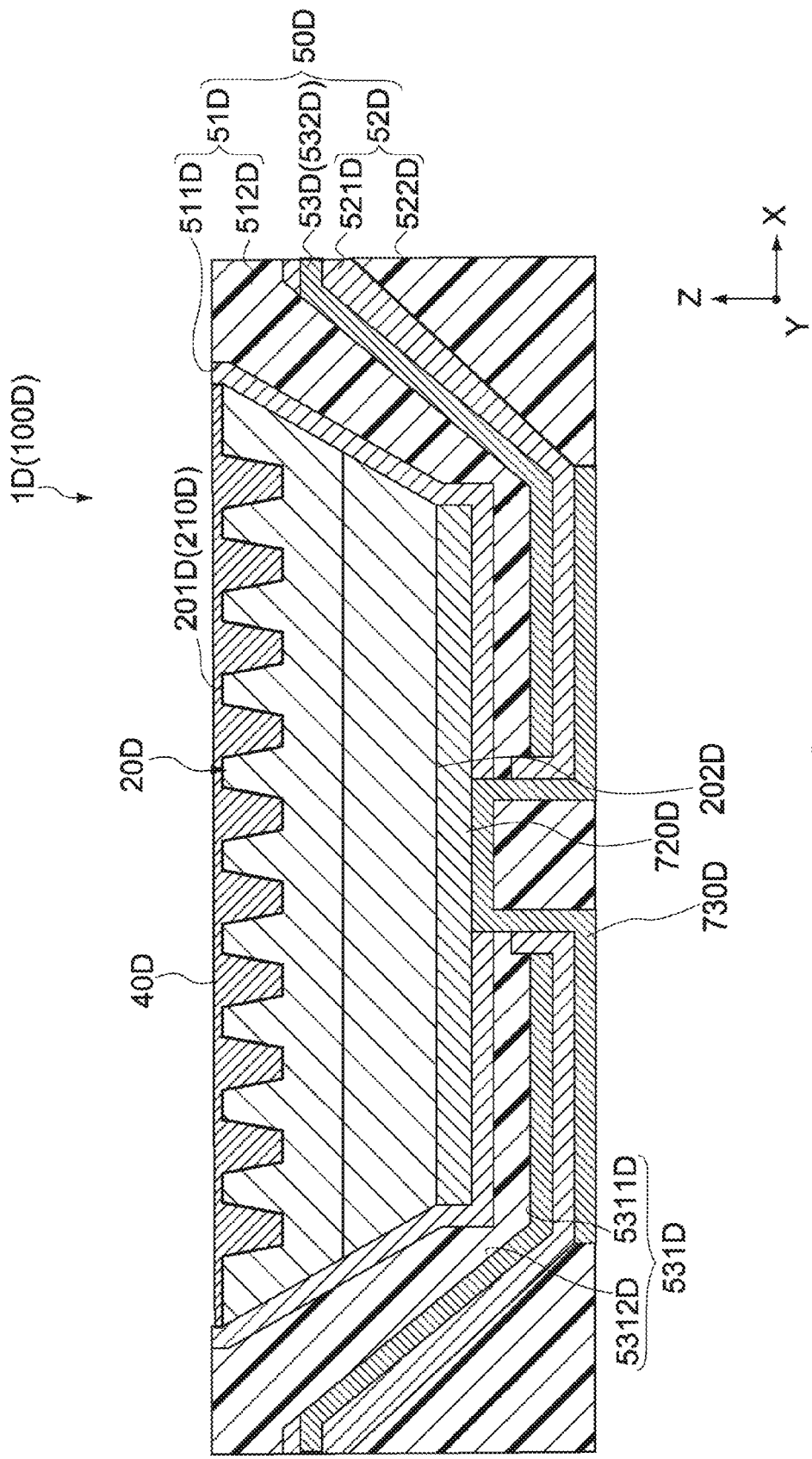
FIG. 36 is a schematic cross-sectional view of a light-emitting element (light-emitting-element wafer) in a modified example according to the third embodiment of the present disclosure.

FIG. 36 is a cross-sectional view of a main part of a light-emitting element 1D in a modified example of the third embodiment, showing the structure thereof. A second region 532D of a reflection layer 53D in this modified example is protruded in a direction parallel to a first plane 201D similarly to the first embodiment.

FIG. 37 is a cross-sectional view of a light-emitting-element wafer 100D in the modified example of the third embodiment, showing a manufacturing method therefor, and showing a process of forming an optical function film 50D (50Da). Compared with the manufacturing method for the light-emitting-element wafer 100 in the first embodiment, the manufacturing method in this modified example is different only in a process of forming the optical function film 50D. Therefore, this process is described by referring to FIG. 37, and the remaining processes are not described again.

First of all, a first insulation layer 51Da is formed on a wall plane 611Da and a bottom plane 612Da of a first separation groove 61Da, and on a second plane 202Db. The first insulation layer 51Da is in the layer structure including a first film 511Da with no flow properties, and a second film 512Da with flow properties, for example. The first film 511Da is made of silicon oxide such as $SiO_2$, SiN, TiN, $TiO_2$, or any other inorganic insulation materials, and is formed by CVD, sputtering, or others. The second film 512Da is made of an inorganic material with flow properties such as SOG (film-forming $SiO_2$ coating material), and a light-resistant resin material including polyimide resin, polyester resin, epoxy resin, or others. Such a second film 512Da is formed by spin coating, coating, spraying, or others.

Thereafter, the first insulation layer 51Da is formed thereon with a reflection layer 53Da. For patterning the reflection layer 53Da, similarly to the third embodiment, lifting-off is applicable but is not restrictive.

The reflection layer 53Da is then formed thereon with a second insulation layer 52Da. The second insulation layer 52Da is formed similarly to the first insulation layer 51Da.

That is, on a first film 521Da with no flow properties, a second film 522Da with flow properties may be formed, for example. The first film 521Da is made of silicon oxide such as $SiO_2$, SiN, TiN, $TiO_2$, or any other inorganic insulation materials, for example, and formed by CVD, sputtering, or others. The second film 522Da is made of an inorganic material with flow properties such as SOG (film-forming $SiO_2$ coating material), and a light-resistant resin material including polyimide resin, polyester resin, epoxy resin, or others. Such a second film 521Da is formed by spin coating, coating, spraying, or others. Note that the first film 521Da is not restrictively made of a material with no flow properties, but may be made of SOG (film-forming $SiO_2$ coating material) with flow properties, for example.

Thereafter, the processes similar to the first embodiment manufacture the light-emitting element 1D (light-emitting-element wafer 100D) of FIG. 36. In this modified example, an attachment layer may or may not be provided. When an attachment layer is provided, the attachment layer may be formed after the first film 521Da of the second insulation layer 52Da is formed, and then the second film 522Da is formed.

With the optical function layer 50D formed as above, a first tilt angle of the second reflection plane 5312D with the first plane 201D is formed smaller than a second tilt angle of the circumferential plane 203D with the first plane 201D. As a result, also in this modified example, the emitted light is improved in directivity. Moreover, similarly to the first embodiment, with the reflection layer 53D including the second region 532D that protrudes to be parallel to the first plane 201D, the emission intensity is enhanced.

Furthermore, the first and second insulation layers 51D and 52D serve better as the protection films for the light-emitting element as are in the layer structure with a reduced tilt angle of the second reflection plane 5312D.

While the present disclosure has been described in detail, the foregoing description is in all aspects illustrative and not restrictive. It is understood that numerous other modifications and variations can be devised without departing from the scope of the present disclosure.

In the above embodiments, the second region of the reflection layer is described to protrude in a direction parallel to the circumferential plane or the first plane. The direction of protrusion is not particularly restrictive as long as the direction is toward the outside of the light-emitting layer.

Also in the above embodiments, the optical function film is in the layer structure including the first insulation layer, the reflection layer, and the second insulation layer. This structure is not restrictive as long as the optical function film includes the reflection layer.

Also in the first embodiment, the inorganic film is described to be formed on the first plane. This is not restrictive, and the light-emitting layer may not include the inorganic film. As to the light-emitting elements in the second and third embodiments, on the other hand, the inorganic film may be formed on the first plane.

Also in the above embodiments, the first plane is described to be in the concave-convex structure. This is not restrictive, and the first plane may not be in the concave-convex structure. Moreover, in the first embodiment, the inorganic film is described to be in the concave-convex structure to conform to the first plane, but this is not restrictive. As in the modified example of the third embodiment, for example, even if the first plane is in the concave-convex structure, the inorganic film may not be in the concave-convex structure.

Also in the above embodiments, the first plane is described to be formed to be larger than the second plane, but this is not restrictive. As an example, the light-emitting layer may be substantially in the parallelepiped shape, and the first and second planes may be substantially in the same size. Alternatively, the second plane may be formed to be larger than the first plane. The first and second planes are not restricted to be in the rectangular shape, and may be in the oval or circular shape, for example.

Also in the above embodiments, the light-emitting layer is described to emit red light. This is not restrictive, and the light-emitting layer may emit blue or green light. If with the light-emitting layer emitting blue light, for example, a semiconductor material for use is exemplified by GaN (gallium nitride).

Also in the above embodiments, the light-emitting element is described to be an LED, but may be a semiconductor laser, for example. The electronic apparatus is not restricted to a display apparatus, and may be lighting fixtures such as tail lamps of vehicles, inspection apparatuses mounting LEDs or semiconductor lasers, or pickup devices available for writing or reading of optical disks, for example.

Also in the above embodiments, the light-emitting-element wafer is described to include the attachment layer. This is not restrictive, and the attachment layer may not be provided.

The present disclosure may be also in the following structures.

(1) A light-emitting element, including:
a light-emitting layer configured to include a first plane with a first electrode, a second plane with a second electrode, and a circumferential plane connecting the first and second planes, the second plane being opposing to the first plane, and the light-emitting layer being made of a semiconductor; and
an optical function film configured to include a reflection layer being able to reflect light coming from the light-emitting layer, the reflection layer being provided with first and second regions, the first region covering the second plane and the circumferential plane, the second region protruding from the first region to an outside of the light-emitting layer to expose an end plane thereof.

(2) The light-emitting element according to (1), in which
the optical function film further includes
a first insulation layer formed between the light-emitting layer and the reflection layer, and
a second insulation layer formed on the reflection layer.

(3) The light-emitting element according to (1) or (2), in which
the second region protrudes in a direction parallel to the first plane.

(4) The light-emitting element according to (1) or (2), in which
the second region protrudes in a direction parallel to the circumferential plane.

(5) The light-emitting element according to any one of (1) to (4), further including:
an inorganic insulation film configured to cover the first plane.

(6) The light-emitting element according to any one of (1) to (5), in which
the first plane is in a concave-convex structure.

(7) The light-emitting element according to any one of (1) to (6), in which
the first plane is formed to be larger than the second plane.

(8) The light-emitting element according to (7), in which
the first region includes first and second reflection planes, the first reflection plane being opposing to the second plane, the second reflection plane being opposing to the circumferential plane, and
the second reflection plane forms a first tilt angle with the first plane, and the circumferential plane forms a second tilt angle with the first plane, the first tilt angle being smaller than the second tilt angle.

(9) The light-emitting element according to any one of (1) to (8), in which
the light-emitting layer emits red light.

(10) The light-emitting element according to (9), in which
the semiconductor includes at least any one of an AsP compound semiconductor, an AlGaInP compound semiconductor, and a GaAs compound semiconductor.

(11) A light-emitting-element wafer, including:
a support substrate; and
a plurality of light-emitting elements each configured to include
a light-emitting layer configured to include a first plane with a first electrode, a second plane with a second electrode, and a circumferential plane connecting the first and second planes, the second plane being opposing to the first plane, and the light-emitting layer being made of a semiconductor, and
an optical function film configured to include a reflection layer being able to reflect light coming from the light-emitting layer, the reflection layer being provided with first and second regions, the first region covering the second plane and the circumferential plane, the second region protruding from the first region to an outside of the light-emitting layer to expose an end plane thereof, and
to be arranged on the support substrate, the support substrate being opposing to the second plane with the optical function film being sandwiched therebetween.

(12) The light-emitting-element wafer according to (11), further including:
an attachment layer configured to attach the support substrate and the plurality of light-emitting elements.

(13) An electronic apparatus, including:
a substrate formed with a driving circuit; and
at least one first semiconductor light-emitting element configured to include
a light-emitting layer configured to include a first plane with a first electrode connected to the driving circuit, a second plane with a second electrode connected to the driving circuit, and a circumferential plane connecting the first and second planes, the second plane being opposing to the first plane, and the light-emitting layer being made of a semiconductor, and
an optical function film configured to include a reflection layer being able to reflect light coming from the light-emitting layer, the reflection layer being provided with first and second regions, the first region covering the second plane and the circumferential plane, the second region protruding from the first region to an outside of the light-emitting layer to expose an end plane thereof, and
to be arranged on the substrate, the substrate being opposing to the second plane with the optical function film being sandwiched therebetween.

(14) The electronic apparatus according to (13), in which
the first semiconductor light-emitting element and other first semiconductor light-emitting elements emit red light,
the electronic apparatus further includes
a plurality of second semiconductor light-emitting elements that emit blue right, and
a plurality of third semiconductor light-emitting elements that emit green light, and
the first, second, and third semiconductor light-emitting elements are arranged on the substrate.

It should be understood by those skilled in the art that various modifications, combinations, sub-combinations and alterations may occur depending on design requirements and other factors insofar as they are within the scope of the appended claims or the equivalents thereof.

What is claimed is:
1. A light-emitting element, comprising:
a light-emitting layer configured to include a first plane with a first electrode, a second plane with a second electrode, and a circumferential plane connecting the first and second planes, the second plane being opposing to the first plane, and the light-emitting layer being made of a semiconductor; and
an optical function film configured to include a reflection layer being able to reflect light coming from the light-emitting layer, the reflection layer being provided with first and second regions, the first region covering the second plane and the circumferential plane, the second region protruding from the first region to an outside of the light-emitting layer to expose an end plane thereof, wherein the optical function film includes a first insulation layer formed between the light-emitting layer and the reflection layer, and a second insulation layer formed on the reflection layer.

2. The light-emitting element according to claim 1, wherein
the second region protrudes in a direction parallel to the first plane.

3. The light-emitting element according to claim 1, wherein
the second region protrudes in a direction parallel to the circumferential plane.

4. The light-emitting element according to claim 1, further comprising:
an inorganic insulation film configured to cover the first plane.

5. The light-emitting element according to claim 1, wherein
the first plane is in a concave-convex structure.

6. The light-emitting element according to claim 1, wherein
the first plane is formed to be larger than the second plane.

7. The light-emitting element according to claim 6, wherein
the first region includes first and second reflection planes, the first reflection plane being opposing to the second plane, the second reflection plane being opposing to the circumferential plane, and
the second reflection plane forms a first tilt angle with the first plane, and the circumferential plane forms a second tilt angle with the first plane, the first tilt angle being smaller than the second tilt angle.

8. The light-emitting element according to claim 1, wherein
the light-emitting layer emits red light.

9. The light-emitting element according to claim 8, wherein
the semiconductor includes at least any one of an AsP compound semiconductor, an AlGaInP compound semiconductor, and a GaAs compound semiconductor.

10. The light-emitting element according to claim 1, wherein the reflection layer includes a metallic material.

* * * * *